US008071872B2

(12) United States Patent  
Atanackovic

(10) Patent No.: US 8,071,872 B2
(45) Date of Patent: Dec. 6, 2011

(54) THIN FILM SEMI-CONDUCTOR-ON-GLASS SOLAR CELL DEVICES

(75) Inventor: Petar Atanackovic, Henley Beach (AU)

(73) Assignee: Translucent Inc., Palo Alto, CA (US)

( * ) Notice: Subject to any disclaimer, the term of this patent is extended or adjusted under 35 U.S.C. 154(b) by 656 days.

(21) Appl. No.: 12/119,387

(22) Filed: May 12, 2008

(65) Prior Publication Data

US 2008/0308143 A1  Dec. 18, 2008

Related U.S. Application Data

(60) Provisional application No. 60/944,369, filed on Jun. 15, 2007.

(51) Int. Cl.
H02N 6/00 (2006.01)
H01L 31/042 (2006.01)
H01L 31/00 (2006.01)

(52) U.S. Cl. ......... 136/252; 136/255; 136/256; 136/261
(58) Field of Classification Search ................ 136/256, 136/255, 261, 252
See application file for complete search history.

(56) References Cited

U.S. PATENT DOCUMENTS

| 3,533,850 | A * | 10/1970 | Tarneja et al. ............... 136/256 |
| 4,128,733 | A | 12/1978 | Fraas |
| 4,834,501 | A | 5/1989 | Honda |
| 5,548,128 | A | 8/1996 | Soref |
| 6,730,538 | B1 * | 5/2004 | Meek et al. .................. 438/104 |
| 6,734,453 | B2 | 5/2004 | Atanackovic |
| 6,743,974 | B2 | 6/2004 | Wada |
| 6,858,864 | B2 | 2/2005 | Atanackovic |
| 6,943,385 | B2 | 9/2005 | Usuda |
| 7,030,313 | B2 | 4/2006 | Inamasu |
| 7,184,203 | B2 | 2/2007 | Burgener |
| 7,199,451 | B2 | 4/2007 | Kelman |
| 7,351,993 | B2 | 4/2008 | Atanackovic |
| 7,384,481 | B2 | 6/2008 | Atanackovic |
| 7,416,959 | B2 | 8/2008 | Atanakovic |
| 7,579,623 | B2 | 8/2009 | Atanackovic |
| 7,589,003 | B2 | 9/2009 | Kouvetakis |
| 7,598,513 | B2 | 10/2009 | Kouvetakis |
| 7,643,526 | B1 | 1/2010 | Lebby |

(Continued)

OTHER PUBLICATIONS

Masetti et al. "Sputter deposited cerium-vanadium oxide: optical characterization and electrochromic behavior," Electrochimica Acta, 46, p. 2085-2090, 2001.*

(Continued)

*Primary Examiner* — Basia Ridley
*Assistant Examiner* — Allison Bourke
(74) *Attorney, Agent, or Firm* — Fernandez & Associates, LLP

(57) ABSTRACT

The present invention relates to semiconductor devices suitable for electronic, optoelectronic and energy conversion applications. In a particular form, the present invention relates to the fabrication of a thin film solar cells and thin film transistors through the advantageous combination of semiconductors, insulators, rare-earth based compounds and amorphous and/or ceramic and/or glass substrates. Crystalline or polycrystalline thin film semiconductor-on-glass formation using alkali ion impurity barrier layer(s) are disclosed. Example embodiment of crystalline or polycrystalline thin film semiconductor-on-glass formation using rare-earth based material as impurity barrier layer(s) is disclosed. In particular, thin film silicon-on-glass substrate is disclosed as the alternate embodiment, with impurity barrier designed to inhibit transport of deleterious alkali species from the glass into the semiconductor thin film.

11 Claims, 39 Drawing Sheets

U.S. PATENT DOCUMENTS

| | | |
|---|---|---|
| 7,645,517 B2 | 1/2010 | Atanackovic |
| 7,655,327 B2 | 2/2010 | Atanackovic |
| 2002/0040727 A1 | 4/2002 | Stan |
| 2005/0000566 A1 | 1/2005 | Posthuma |
| 2005/0016578 A1* | 1/2005 | Enomoto et al. .............. 136/243 |
| 2006/0037529 A1 | 2/2006 | D'Evelyn |
| 2007/0020891 A1 | 1/2007 | Kouvetakis |
| 2008/0078444 A1 | 4/2008 | Atanackovic |
| 2008/0187768 A1 | 8/2008 | Kouvetakis |
| 2008/0223438 A1 | 9/2008 | Xiang |
| 2008/0241519 A1 | 10/2008 | Shroeder |
| 2008/0277647 A1 | 11/2008 | Kouvetakis |
| 2008/0295879 A1 | 12/2008 | Atanackovic |
| 2009/0038669 A1 | 2/2009 | Atanackovic |
| 2009/0183774 A1 | 7/2009 | Atanackovic |
| 2009/0227440 A1 | 9/2009 | Weber |
| 2009/0229661 A1 | 9/2009 | Mortenson |
| 2009/0236595 A1 | 9/2009 | Atanackovic |
| 2009/0242019 A1 | 10/2009 | Ramamoorthy |
| 2010/0032687 A1 | 2/2010 | Calder |

OTHER PUBLICATIONS

Shekar, et al. "Dielectric properties of vacuum deposited cerium oxide films," Journal of Materials Science Letters, 3, 600-604, 1984.*

* cited by examiner

H+ implant into single crystal Si(001)

SRIM 2003 Simulation of Hydrogen depth profile versus incident H+ energy.

SRIM 2003 Simulation of Hydrogen depth profile versus incident H+ energy.

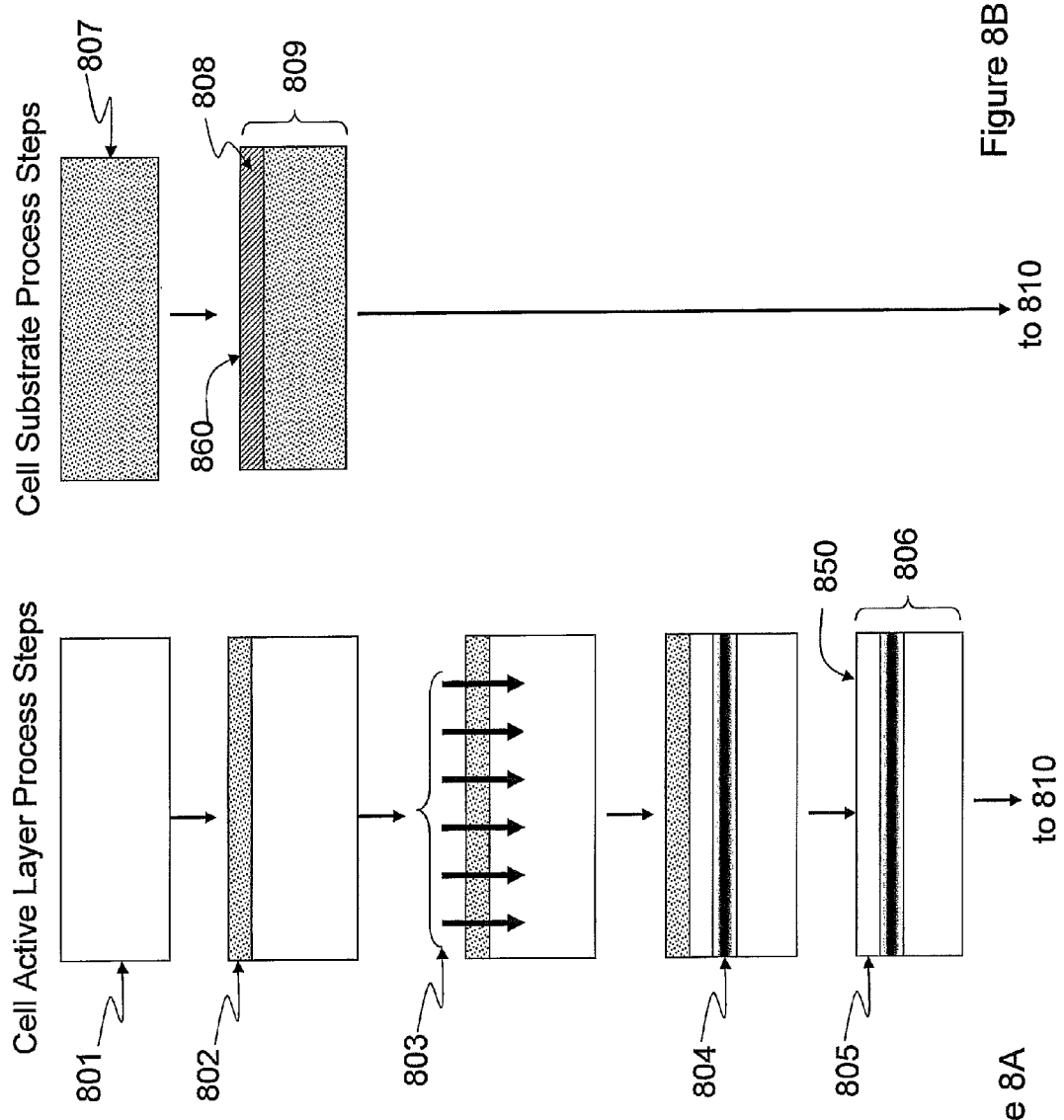

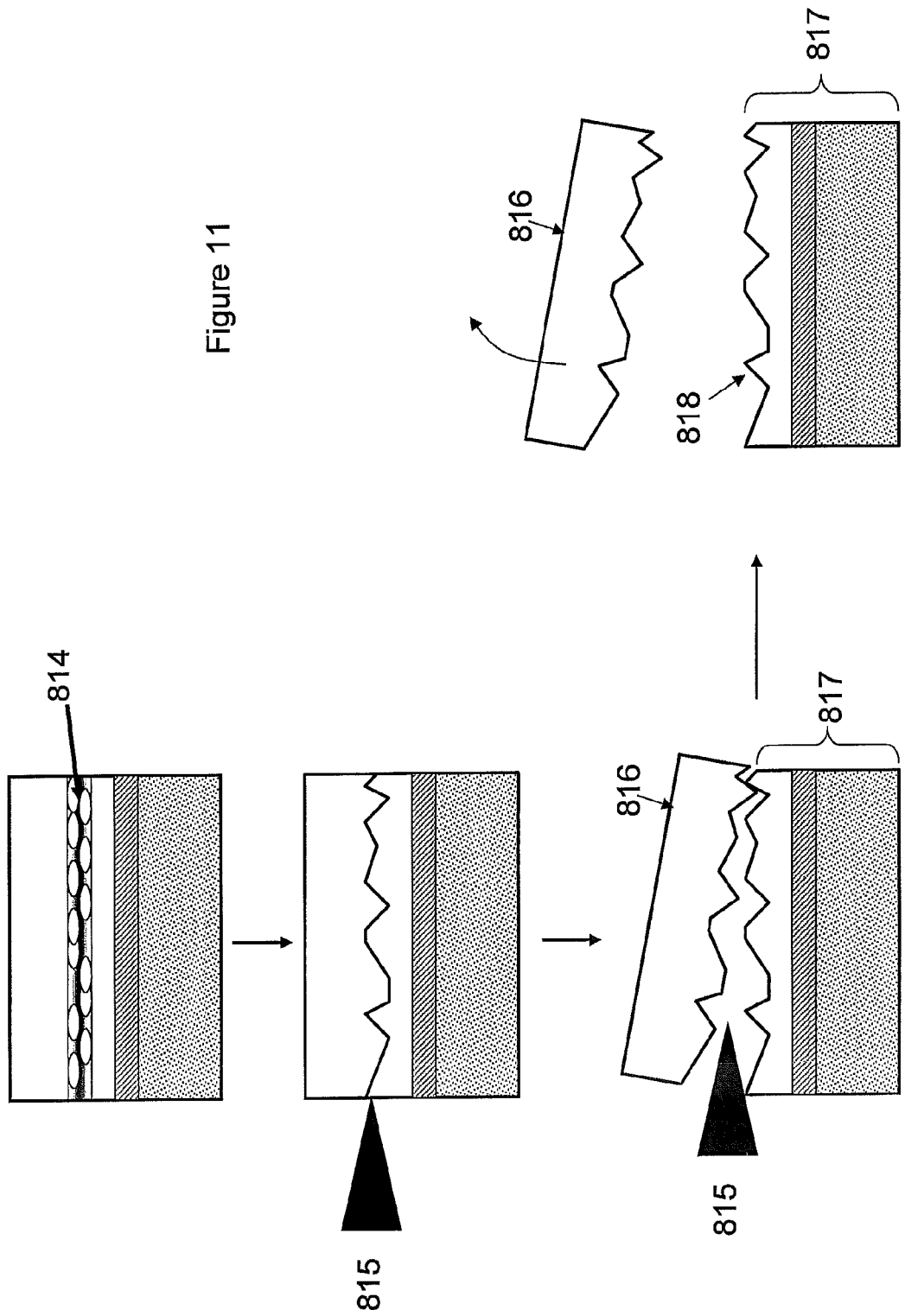

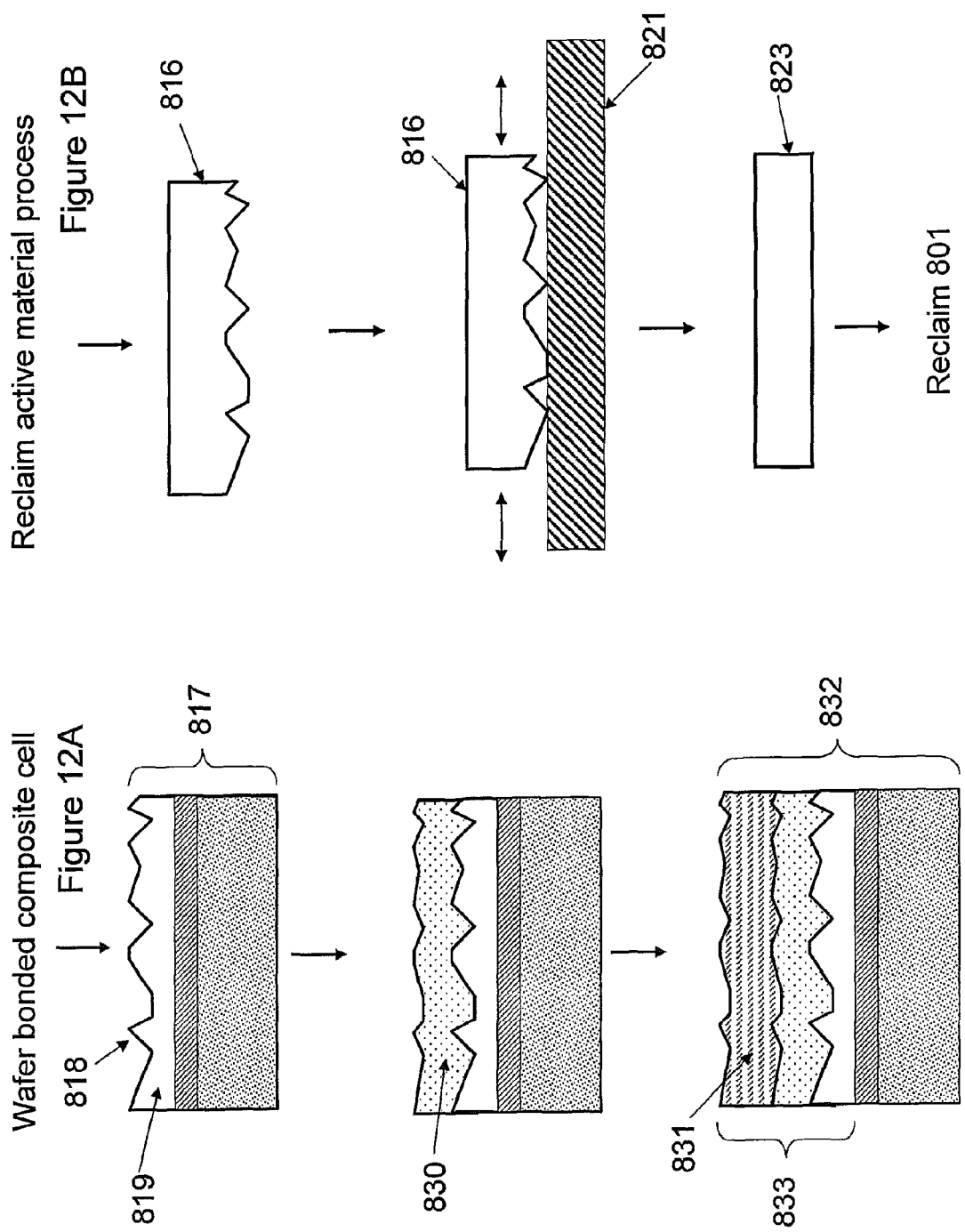

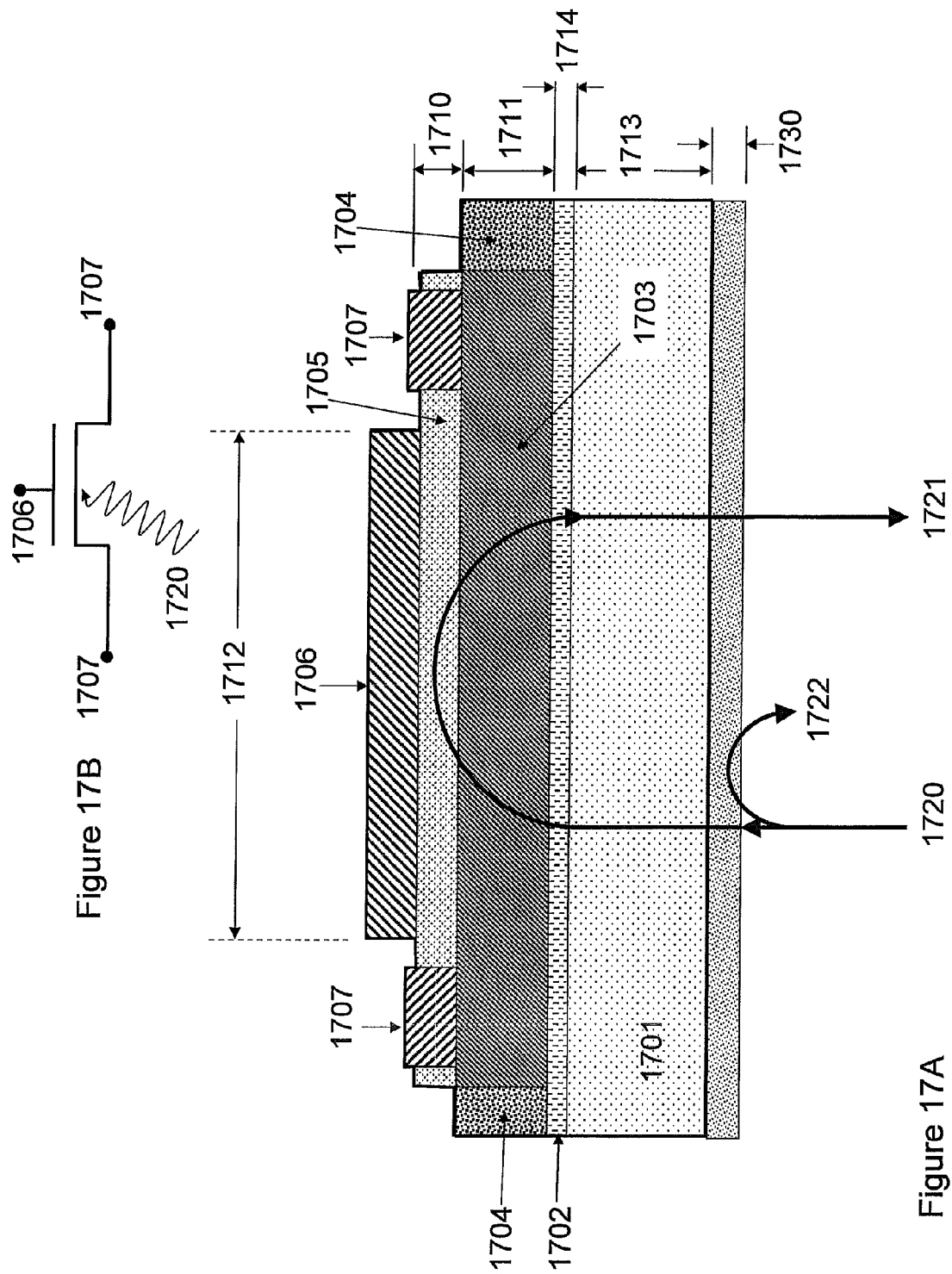

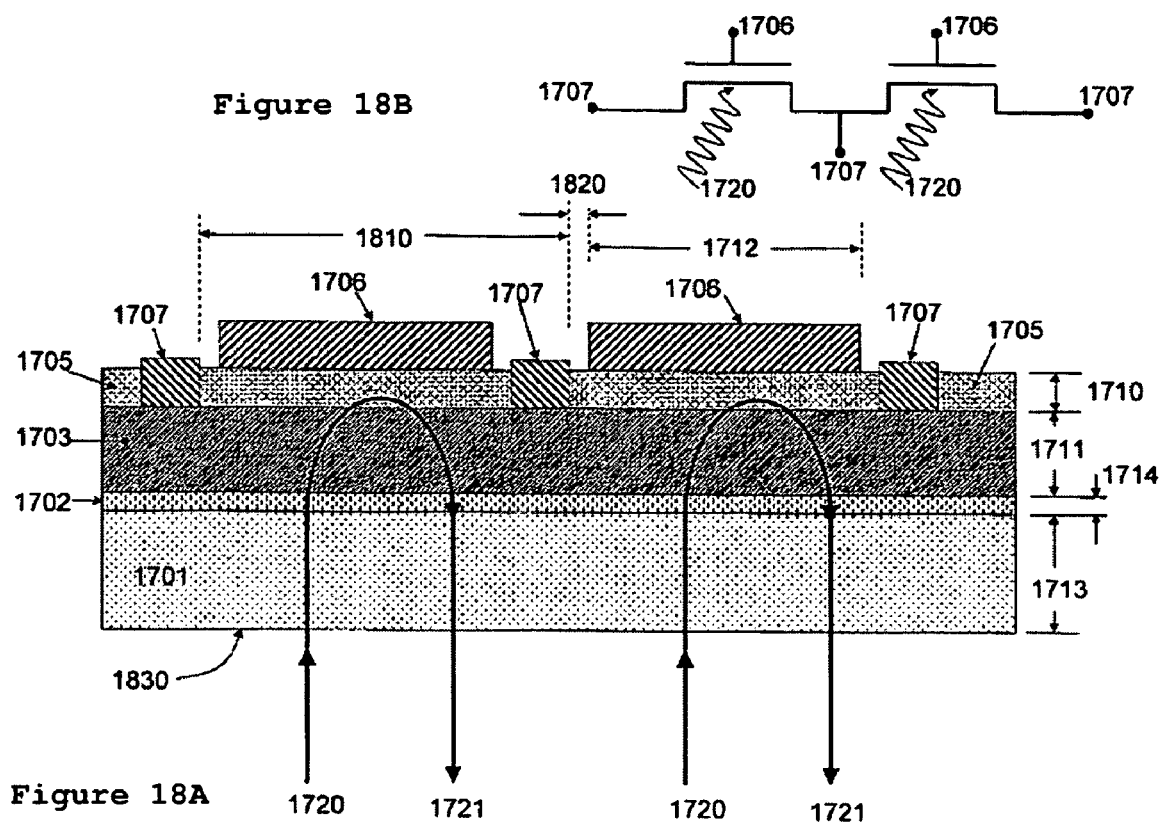

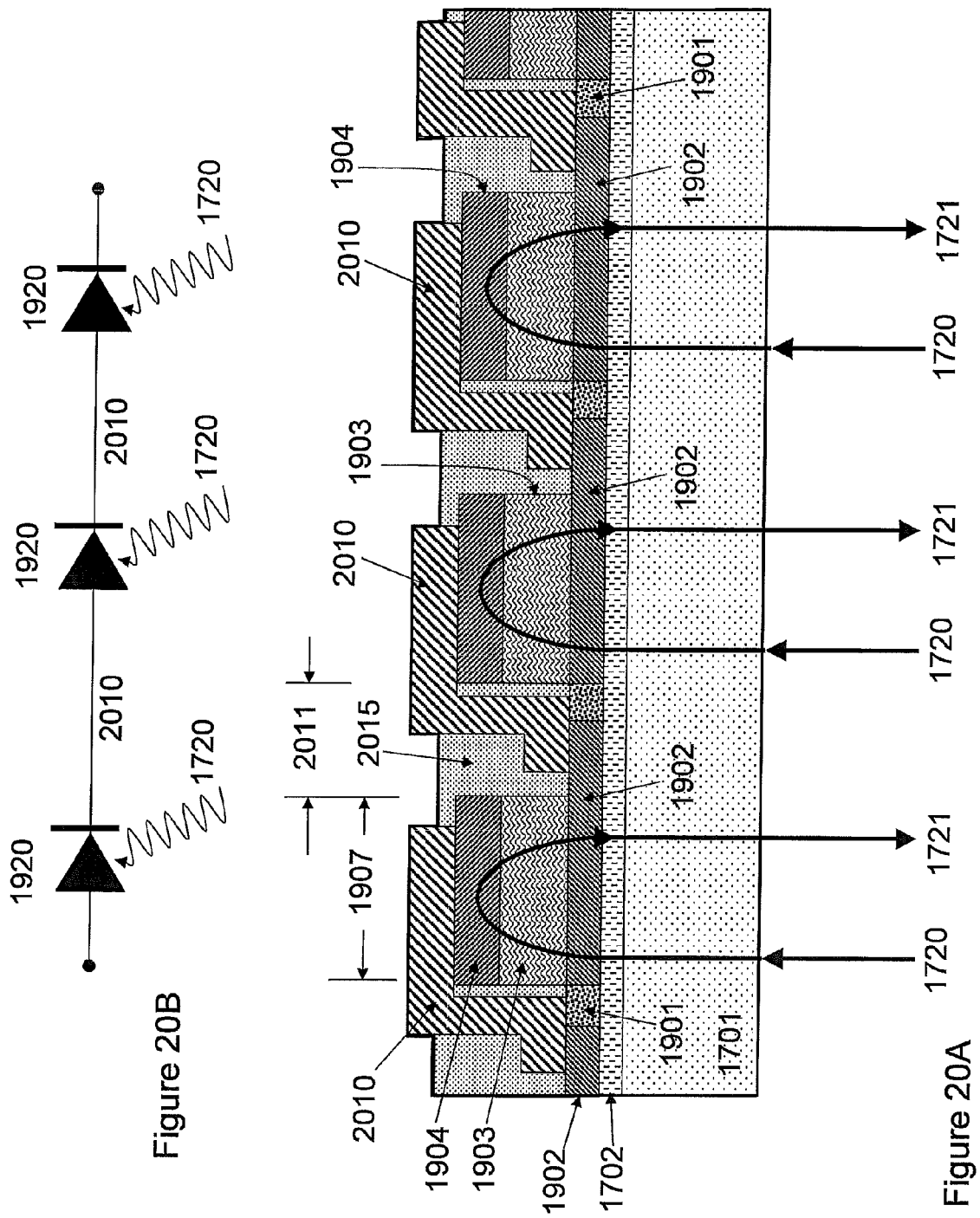

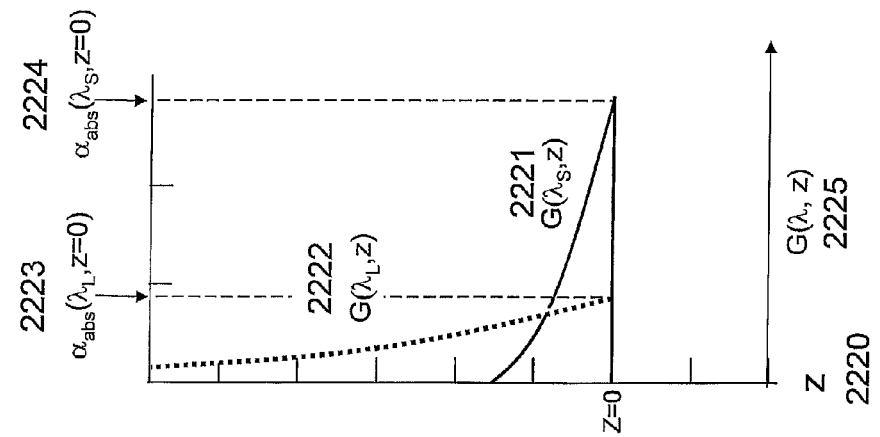
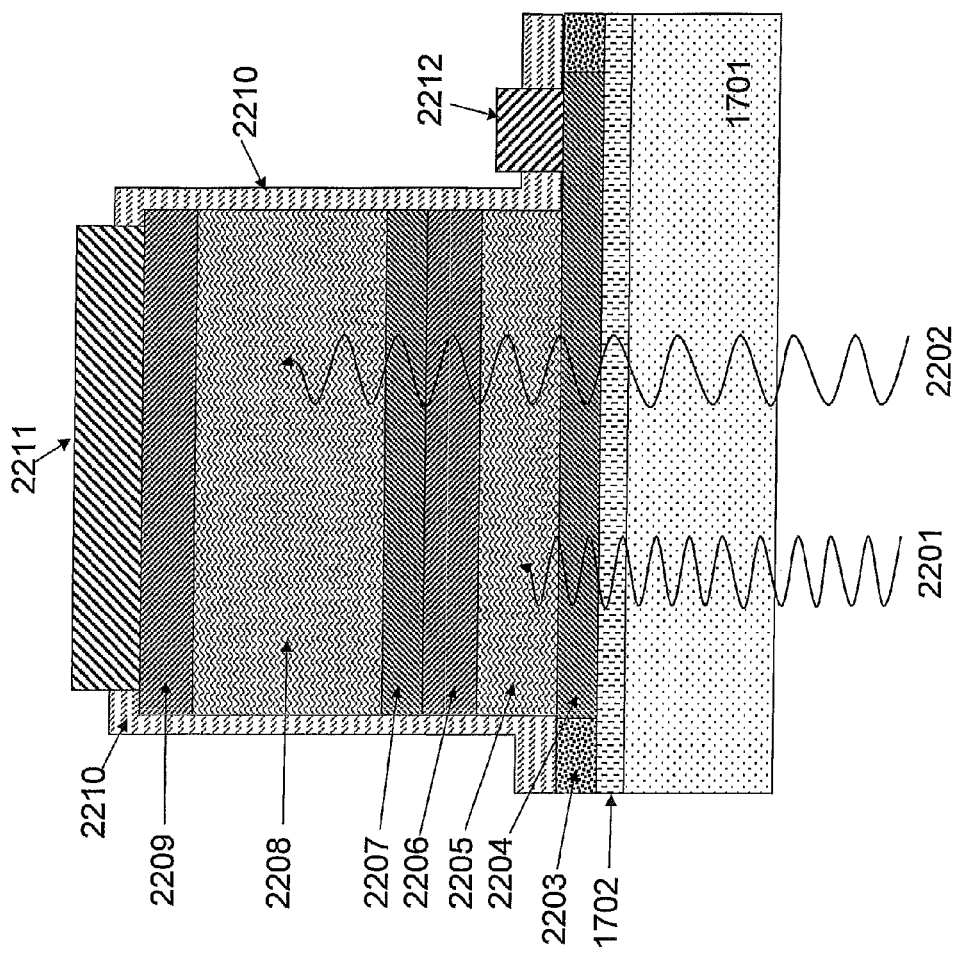

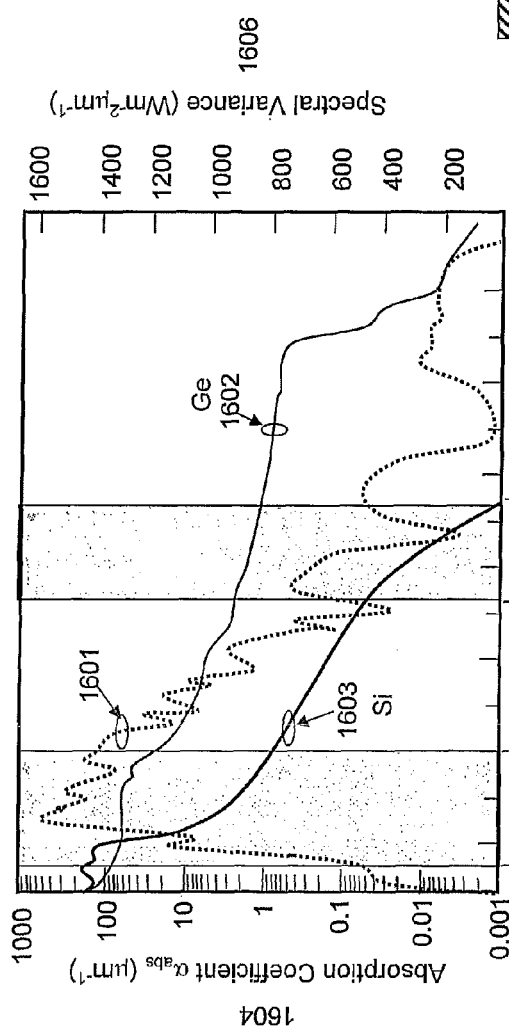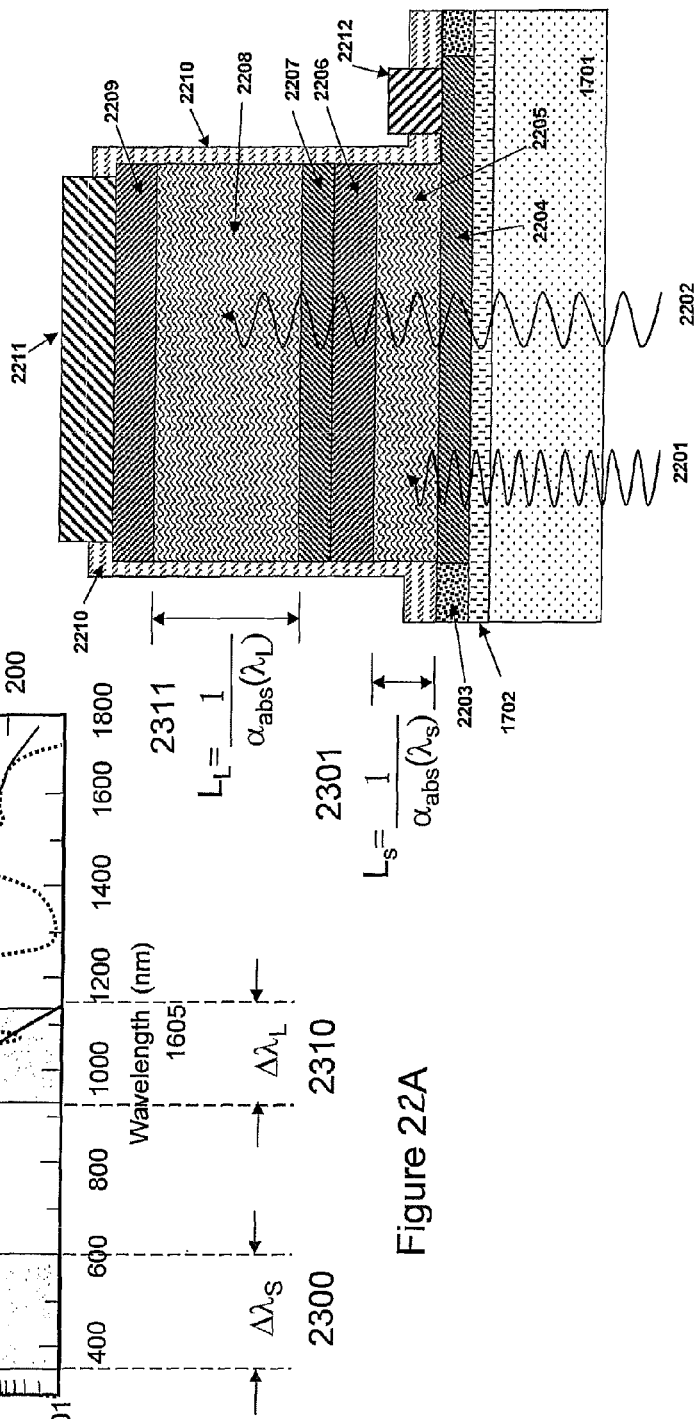
Figure 22A
Figure 22B

THIN FILM SEMI-CONDUCTOR-ON-GLASS SOLAR CELL DEVICES

PRIORITY

This application claims priority from Provisional application 60/944,369 filed on Jun. 15, 2007.

CROSS REFERENCE TO RELATED APPLICATIONS

Applications and patent Ser. Nos. 09/924,392, 10/666,897, 10/825,912, 10/825,974, 11/025,363, 11/025,681, 11/025,692, 11/025,693, 11/084,486, 11/121,737, 11/187,213, 11/053,775, 11/053,785, 11/054,579, 11/068,222, 11/188,081, 11/253,525, 11/254,031, 11/393,629, 11/398,910, 11/472,087, 11/788,153, 11/960,418, 60/820,438, 60/811,311, 60/847,767, 60/905,419, 60/905,945, 60/944,369, 60/949,753, U.S. Pat. No. 7,018,484, U.S. Pat. No. 7,037,806, U.S. Pat. No. 7,135,699, U.S. Pat. No. 7,199,015, all held by the same assignee, contain information relevant to the instant invention and are incorporated herein in their entirety by reference. References, noted at the end, are incorporated herein in their entirety by reference.

BACKGROUND OF THE INVENTION

Prior art concerning solar cells and thin film transistors, TFTs, are known to one knowledgeable in the art. References contained in U.S. Pat. No. 4,128,733, U.S. Pat. No. 6,743,974, U.S. Pat. No. 7,030,313, U.S. 2002/0040727, U.S. 2005/0000566 are cited as prior art and incorporated herein in their entirety by reference.

The present invention addresses the need to increase solar cell efficiency and to further reduce cost over prior art techniques. Typically, present high performance and cost effective solar cell devices are based on bulk silicon materials. Single crystal silicon (sc-Si) cells exhibit single junction (SJ) efficiency approaching $\eta_{eff}(SJ) \sim 21\%$. Unfortunately, prior art techniques for producing sc-Si cells are: (i) costly to manufacture; and (ii) suffer inefficient utilization of the available solar spectrum.

A widely accepted method to reduce the cost of solar cells, by workers in the field, has been to substantially reduce the amount of active material required to form the solar cell via the use of thin film semiconductors. Furthermore, the said thin films are disposed upon low cost substrates such as amorphous glass, polymer and/or metal surfaces.

The simplest and most cost effective method of producing thin films is via use of various deposition methods upon relatively lower cost substrates such as inexpensive glass, polymer and/or metal surfaces or other materials adapted for receiving a layer of silicon.

Typically, the use of low cost substrates places limitation upon thin film semiconductor crystal quality and/or thermal budget required for thin film deposition method of a thin film(s). Low thermal budget deposition of thin films typically results in poor crystal quality semiconductors realized upon amorphous glass substrates. Single semiconductor crystals may nucleate in localized areas upon an initial glass substrate surface, but formation of homogeneous and long range crystal order within the thin film across substantially the entire large area glass substrate is practically impossible without complex post growth recrystallization. Even so, the film quality attained using prior art complex recrystallization techniques is still inferior to bulk single crystal growth techniques, such as, the Czochralski crystal growth (CZ) method.

Single crystal thin film epitaxy is typically done on substrates with intrinsic properties of high single crystal quality, atomically flat surface, and low crystal structure mismatch between the film and substrate. Furthermore, the growing film must adequately wet the substrate surface for layer-by-layer epitaxy, otherwise clustered nucleation growth occurs and thus structurally defective. Glass substrates, by definition, lack all the aforementioned properties except for being able to exhibit extremely flat surfaces via polishing, e.g.; chemical mechanical polishing (CMP) or other techniques such as "float glass". Uniform and flat thin film semiconductors are typically best deposited onto glass substrate surfaces in amorphous form. Typically, flat and uniform amorphous semiconductors can be deposited onto glass substrates at room temperature or modest substrate temperatures. Subsequent thermal processing of an amorphous Semiconductor-on-Glass (a-SoG) article is then required to transform the amorphous thin film semiconductor into the desired polycrystalline form. For example, Nickel induced crystallization allows amorphous Si to be recrystallized via catalytic action into poly-Si. More desirable of the polycrystalline forms are thin film semiconductors exhibiting large domains (grain size~0.1-10 microns) in lateral and/or vertical dimensions relative to the film growth direction. Thin films exhibiting larger lateral grain dimension than film thickness enable advantageous transport of electronic carriers parallel to the film/substrate surface. Direct deposition of thin film semiconductors onto glass substrates without complex post processing results in polycrystalline (pc), microcrystalline (mc), nanocrystalline (nc) and/or amorphous (a) semiconductor thin films.

It is well known that large area single crystal thin film semiconductors cannot be directly deposited epitaxially upon glass and/or amorphous substrates. High quality single crystal thin film semiconductors on large area glass substrates are commercially feasible at present using only thin film layer transfer techniques, such as wafer bonding and etch back technique. That is a thin film layer transfer technique comprises the steps of thinning and/or separation of a single crystal thin film from a single crystal bulk semiconductor to the film thickness required and subsequent transfer of said film onto a surface of an acceptable substrate. The single crystal thin film is then bonded to the substrate forming a thin film semiconductor-on-substrate article; in some embodiments an acceptable substrate is glass; alternatively other types of substrates are acceptable.

Layer-transfer methods provide a practical means of cost effective manufacture of single crystal thin film semiconductor disposed upon inexpensive substrates. The design compromise for the structural quality of the thin film is therefore between cost and whether single-crystal or polycrystal thin films are required for a specific application.

Prior art techniques to date fail to address the implication of the intrinsic chemical property of cheap substrate composition; for instance, glass is typically alkali-silicate-based and quite severely impacts the electronic and/or optoelectronic performance of a thin film semiconductor.

It is therefore not well known by researchers in the field of thin film semiconductor manufacture, the fact that it is not a simple matter of replacing the substrate with a cheap alternative, such $SiO_2$-based glass, because of the typically chemically disruptive influence on at least one of the thin film electronic and/or optical and/or chemical and/or mechanical properties. For an example case of using cheap $SiO_2$-based glass substrate to form SoG article, regardless of the thin film semiconductor manufacture technique (i.e.; via layer-transfer or direct deposition), the chemical composition of cheap glass poses severe contamination concerns for electronic and optoelectronic performance of thin film devices.

BRIEF SUMMARY OF THE INVENTION

The present invention relates to semiconductor devices combined with an inexpensive substrate for electronic and optoelectronic applications. In a particular form the present invention relates to fabrication of a solar cell and/or thin film transistor (TFT) through the combination of rare-earth metal, rare-earth metal-oxides -nitrides, -phosphides and -carbides and Group IV, III-V, and II-VI semiconductors and alloys disposed upon inexpensive substrates, such as glass. In an embodiment, thin film semiconductor materials composed of silicon (Si) and/or germanium (Ge) are disposed upon cost effective silicon dioxide ($SiO_2$) based glass substrate. Such semiconductor-on-glass (SoG) articles are applicable to thin film transistor and solar cell manufacture. The present invention discloses the use of a functional barrier layer disposed between a thin film semiconductor layer and an inexpensive substrate so as to inhibit transport and deleterious action of impurity species migrating from the substrate into a thin film semiconductor, thereby degrading the electronic and/or optical performance of the said device. Optionally, a functional barrier layer may serve as an alternative barrier between an inexpensive substrate and a functional device disposed thereon; examples of types of barriers are thermal, mechanical, chemical, optical, and/or other radiation deleterious to a functional device and/or from a device to its substrate.

The present invention solves limitations and shortcomings of prior art so that thin film semiconductors on cost effective substrates, (e.g.; glass, glass-ceramic, ceramic, etc.) can be used for manufacture of high performance thin film transistors and solar energy conversion devices.

Thin film semiconductor-on-glass application to solar cell and TFT devices benefit from the insulating nature of the glass substrate and can be designed as ideal thin film semiconductor-on-insulator (SOI) structures. For mass manufacture of SoG the utility of a glass substrate is primarily due to the potential low cost of alkali-silicate glasses. However, it has long been known by workers in the field of glass manufacture that most compositions of alkali-silicate glasses exhibit some electrical conductivity. The electrical activity of the alkaline-silicate glasses is directly attributable to mobile positive alkaline ions through the silicate network; in addition inexpensive glasses may contain high levels of boron, lead and other elements injurious to a semiconductor. Optional inexpensive substrates contain alternative elements not acceptable to a solid-state device; in general some type of barrier must isolate a semiconductor device from some property of an inexpensive substrate.

It is an object of one embodiment of the present invention to fully utilize the low cost of alkaline-silicate glasses for use in SoG and increase the performance of devices formed by use of alkaline barrier layers. An example embodiment, but not limited to, is the use of rare-earth compound(s), such as a rare-earth oxide ($REO_x$), comprising charged oxygen vacancies ($O_v^{\prime\prime}$) capable of neutralizing the migration of deleterious positive alkaline ions, such as $Na^+$ and/or $K^+$, into a semiconductor active region; charged oxygen vacancies ($O_v^{\prime\prime}$) functionally impede migration of positive ions to the extent that an active region above a barrier layer functions within specification.

For certain applications, poly-Si thin film transistors and/or optoelectronic devices provide an acceptable trade-off between performance and cost. For large volume applications such as flat panel displays and solar cells, it is also desirable to further reduce the cost of manufacture of thin films on glass and increase crystalline structure perfection to that approaching high quality single crystal. Furthermore, it is advantageous to develop a process of SoG manufacture requiring low thermal budget.

The present invention seeks to advance thin film semiconductor-on-glass (SoG) technology by introducing a new method of layer transfer for thin film SoG article manufacture.

BRIEF DESCRIPTION OF THE SEVERAL VIEWS OF THE DRAWINGS

FIGS. 8A and B show individual parallel process paths for fabrication of thin film single crystal solar cell on glass article.

FIG. 11 shows how, with application of external mechanical stimulus to at least one region of the edge of the compound article, the fracture propagates throughout the defect plane.

FIG. 12 shows how a wafer bonded thin film CZ Si forms a buried barrier layer on a glass substrate and are then processed to form a vertical type MIS.

FIG. 17A shows a metal-insulator-semiconductor (MIS) device fabricated upon a glass substrate; FIG. 17B shows an equivalent circuit.

FIG. 18A shows multiple lateral devices connected via a common active layer contact; FIG. 18B shows an equivalent circuit.

FIG. 20A shows multiple lateral p-i-n devices fabricated across the SoG substrate; FIG. 20B shows p-i-n devices series connected.

FIG. 21A is a stacked layer structure consisting of two p-i-n diodes comprising different intrinsic absorber thicknesses. FIG. 21B shows the generation rate G (λ, z) of electron-hole pairs as a function of vertical distance, z, through a layered structure.

FIGS. 22A and 22B show wavelength bands 2300 & 2310 used for an example tandem Si: p-i-n-p-i-n solar cells.

FIG. 31: Process steps for selective area single crystal thin film semiconductor and sacrificial layer epitaxy on parent substrate.

DETAILED DESCRIPTION OF THE INVENTION

Figures 1A, 1B:
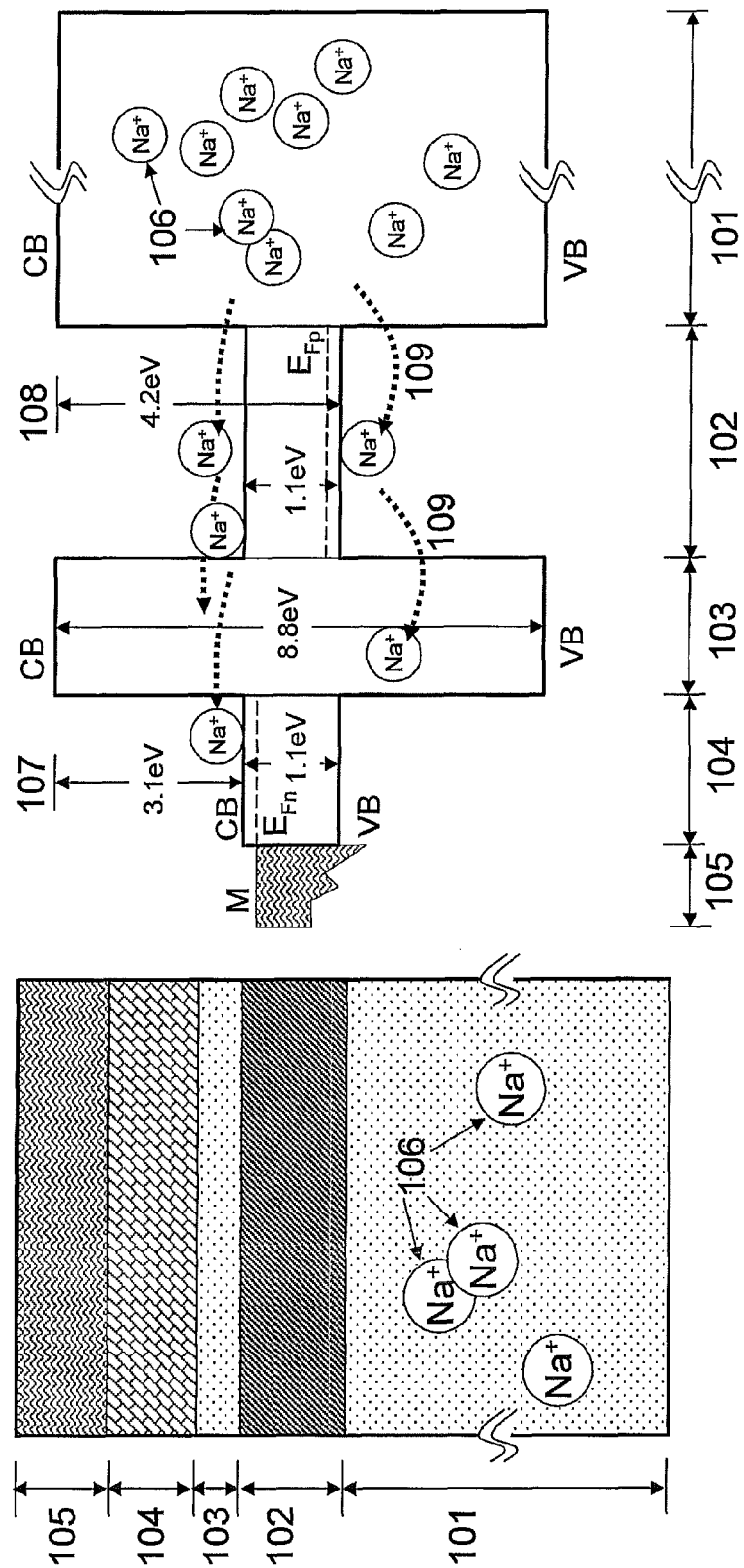
FIG. 1A depicts schematically the physical MOS layer structure formed on a SoG substrate and FIG. 1B depicts the energy band structure of the MOS SoG device as a function of cross-sectional distance vertically through the layers.

An embodiment of the present invention is the manufacture of thin film semiconductor-on-glass suitable for high performance thin film transistors and solar energy conversion devices. It is understood the present invention is applicable to other substrate compositions other than glass, such as polymers, metals, ceramics, and biologically active substrates and the like.

Furthermore, the present invention discloses alternate embodiments of thin film semiconductors chosen from at least one of silicon (Si), germanium (Ge), silicon-carbide ($SiC_x$), germanium carbide ($GeC_x$), germanium nitride ($GeN_x$), silicon nitride ($SiN_x$) tin germanium ($SnGe_x$), tin oxide ($SnO_x$), gallium phosphide (GaP), gallium nitride (GaNx), indium nitride (InNx), aluminium nitride (AlNx), zinc oxide ($ZnO_x$), magnesium oxide ($MgO_x$) or combinations and non-stoichiometric combinations thereof wherein x varies from >0 to ≦20 in some embodiments.

For example, GaN-based and ZnO-based compositions are advantageous for light emitting diode applications disposed upon glass substrates. Compositions such as (i) $Si_xSn_yGe_zC_w$; $In_xGa_yAl_xN_w$; and (iii) $Zn_xMg_yO_zN_w$ are also disclosed by the present SoG invention wherein w, x, y, z vary from 0 to <1 in some embodiments.

Alternative embodiments use Si, Ge and SiGe thin film semiconductor compositions for SoG article manufacture of TFT and solar cell devices disposed upon cheap glass and/or ceramic substrates.

A general formula for oxide glass, but not limiting, may be written for convenience as $A_nB_mO_z$, where B represent the network forming cation(s), A the modifying cation(s), O is oxygen, and the real positive numbers m, n, z represent relative chemical ratios varying from 0 to ≦1; it is understood that additional impurities are present. If the A ions are introduced into silica where B=Si, in the form of an oxide for example $A_kO_y$; then $A_nSiO_z \equiv (A_kO_y)_x (SiO_2)_{1-x}$. For example, the structure modifying A cations may act so as to plug holes in the network formed by the $B_mO_z$. For example, alkali silicate glass ($A_nSi_mO_z$), use relatively large cations of low charge e.g., A chosen from at least one of the set {$Na^+$, $K^+$, $Li^+$, $Ca^{2+}$, $Ba^{2+}$, $Pb^{2+}$, and the like}.

The silicate glasses are the most technologically and commercially applicable material for the present invention, namely, low cost and high volume manufacture thin film semiconductor-on-glass for use in solar energy conversion and display devices. The soda-lime-silica glass (SLSG), boro-silicate glass (BSG) and boro-phosphate-silicate glass (BPSG) are exemplary compositions for application to the present invention. It is also understood, other compositions are equally covered by the present invention, for example, alumino-silicate glass (ASG), alkaline-earth silicate (AESG) glass and fluorine and/or chloride containing silicate glasses.

High purity quartz substrates are composed of pure $SiO_2$, but are expensive compared to silicate glass substrates which are typically composed of only a majority of silica, $SiO_2$, 30-75%. Herein defined as $SiO_2$-based glass. Therefore, SoG devices fabricated on pure quartz substrates will not typically suffer thin film contamination due to the substrate; however a barrier layer as used herein may serve as a buffer layer on quartz as a means to transition to a single crystal active structure. Cost effective technical glasses useful for manufacture of flat panel displays, TFTs, solar cells, light emitting devices and the like, typically contain additional compounds, such as, calcium oxide (CaO), sodium oxide ($Na_2O$), potassium oxide ($K_2O$), aluminum oxide ($Al_2O_3$), boron oxide ($B_2O_3$), zirconium oxide ($ZrO_2$), zircon ($ZrSiO_4$), fluorine, lithium, lead oxide (PbO), alkaline earth metal oxides (AEOx), transition-metal oxides (e.g., $TiO_2$) and others to a lesser extent.

Alkali ionic conduction in glass, and in particular silicate glasses is a well studied process. Multi-component alkali silicate glasses have historically been developed primarily for improving glass formation properties suitable for various manufacturing tolerances, increasing mechanical and/or optical performance. For example, the addition of CaO into silicate glass introduces $Ca^{2+}$ ions forming relatively stronger Ca—O bonds compared to Na—O bonds. The $Ca^{2+}$ ions are held more firmly in the structure and believed to improve chemical durability of a glass. Addition of larger cations, via introducing CaO and MgO into the $Na_2O.SiO_2$ glass increases stability of glass and allows it to be made with a lower $SiO_2$ content and improve glass forming temperature and region and devitrification properties. Regardless of the multi-alkali glass, it is generally found that the dominant species responsible for ionic conduction is due to sodium ions. The consequence of ionic conduction in silicate glasses is becoming particularly problematic in SoG device manufacture, where the finite conductivity and variation of properties of thin films occurs when in contact with a silicate glass.

In microelectronic and/or silicon integrated circuit manufacture it is well established the presence of mobile contaminants in group IV semiconductor (e.g.; Si) and dielectric processing (e.g.; $SiO_2$), particularly the presence of sodium ions ($Na^+$) and potassium ions ($K^+$) ions are extremely detrimental to device performance and yield. Borosilicate glasses are not used in Si semiconductor processing due to not-intentional boron doping effects. Sodium is extremely mobile in silica and thermally grown $SiO_2$ on Si and within low dielectric interconnect layers. The presence of alkali ions, such as $Na^+$, in gate oxide and near $SiO_2$/Si interfaces of Si-based metal-oxide-semiconductor field effect transistors (MOSFETs) cause electronic defects, traps, flat band voltage shifts, and reliability and instability issues at high operating temperatures and/or processing temperatures. Positive ions (e.g.; alkali ions such as $Na^+$, $K^+$ and $Li^+$ or alkaline earth ions, such as $Mg^{2+}$, $Ca^{2+}$, $Ba^{2+}$, $Sr^{2+}$) can move relatively freely within glass and/or $SiO_2$ dielectric in response to an applied electric field and/or thermal gradient, thereby forming a source of mobile ionic charge. Significant effort is made to remove sources of sodium and/or alkali contamination judiciously from Si semiconductor processing. The remaining and persistent alkali contamination within upper level interconnect layers is mitigated in part via the use of phosphate glass (e.g.; $P_2O_5$), phosphorous silicate glass (e.g.; $P_2O_5.SiO_2$) and silicon nitride compositions.

The presence of alkali ions disadvantageously affects performance of metal-insulator-semiconductor (MIS) devices, such as solar MIS solar cells and TFTs based on semiconductor-dielectric MOSFETs. It is one object of the present invention to use alkali barrier layer(s) in MIS solar cells fabricated from a SoG article.

It has also been well established in metal halide arc discharge lamps filled with sodium that the lamp operating lifetime is limited by sodium ion ($Na^+$) diffusion through the fused quartz or silica chamber envelope. The permeability of sodium ions through silica is high, acting as a porous medium. Therefore, metal halide arc discharge lamps degrade in output light intensity via the loss of sodium and mechanically degrade and/or soften the silica chamber integrity via $Na^+$ diffusion. A solution to sodium permeability in glass compositions, in particular, quartz and silica, has been disclosed in U.S. Pat. No. 5,631,522. The intentional doping of the low sodium containing glass with aluminum (Al), yttrium (Y), cesium (Cs) and mixtures thereof, has been shown to dramatically reduce sodium diffusion through the doped glass used in sodium containing metal halide lamps. It is disclosed herein that triply ionized rare-earth metal ions, such as lanthanum (La) and erbium (Er), typically in the form of rare-earth sesquioxides oxides, can be added to a Si lattice of Cs or Y doped $SiO_2$ glass to further minimize the sodium diffusivity. The instant invention discloses the permeability of sodium in glass can be lowered by advantageous doping of the $SiO_2$ glass by the addition of at least one of Al, Cs, La, Dy, and/or Er and/or other rare earth metals, oxides, nitrides, phosphides and/or combinations thereof.

High performance bulk Si complementary metal oxide semiconductor (CMOS) field effect transistor (FET) manufacture utilises relatively high cost manufacturing processes and materials compared to low cost TFT and solar cell SoG manufacture. SoG substrates used in flat panel displays and solar cells are necessarily required to be lower in cost per unit area, necessarily requiring cost effective glass and thin film manufacture technique. Clearly, applications for SoG devices are inherently based on low cost glass substrates, and more particularly on silicate glasses. Economical alkali-silicate glasses are composed of the very impurities that are detrimental to TFT and solar cell performance. Therefore, it is desirable for a simple and cost effective method to be implemented in order to contain the impurities within the glass substrate, such as mobile alkali ions, so as not to degrade the performance of electronic devices based on thin film semiconductors disposed upon the said glass substrate.

The present invention discloses and claims the use of at least one alkali impurity barrier layer for SoG article manufacture wherein the barrier layer is disposed between semiconductor thin film(s) and a glass substrate.

The present invention claims the use of barrier layers, as described above, for all SoG manufacturing techniques used to form single crystal, polycrystal and/or amorphous thin film semiconductors. For example, SoG article manufactures using: (i) single crystal semiconductor thin film transferred via wafer bonding; or (ii) direct epitaxy of amorphous semiconductor; or (iii) direct epitaxy of amorphous-semiconductor and subsequent recrystallisation; or (iv) direct epitaxy of polycrystalline semiconductor; (v) direct epitaxy of single crystalline semiconductor on a rare-earth based buffer layer (s).

The present invention discloses and claims the preferential use of barrier materials for SoG manufacture using rare-earth sesquioxide ($RE_2O_3$), rare-earth dioxide ($REO_2$), rare-earth monoxide (REO), rare-earth nitride (REN), rare-earth oxynitride ($REO_xN_y$), rare-earth phosphide (REP), rare-earth oxyphosphide ($REO_xP_y$), rare-earth carbide ($REC_y$), rare-earth oxycarbide ($REO_xC_y$), aluminum rare-earth oxide ($RE_xAl_yO_w$), and rare-earth aluminosilicate ($RE_xAl_ySi_zO_w$), aluminum oxide ($Al_2O_3$), silicon nitride ($SiN_x$), ($Si_xAl_yN_z$) and combinations and non-stoichiometric combinations thereof. A barrier material may comprise one or more layers; wherein at least one layer comprises at least one compound chosen from a group comprising a rare-earth sesquioxide ($RE_2O_3$), rare-earth dioxide ($REO_2$), rare-earth monoxide (REO), rare-earth nitride (REN), rare-earth oxynitride ($REO_xN_y$), rare-earth phosphide (REP), rare-earth oxyphosphide ($REO_xP_y$), rare-earth carbide ($REC_y$), rare-earth oxycarbide ($REO_xC_y$), aluminum rare-earth oxide ($RE_xAl_yO_w$), and rare-earth aluminosilicate ($RE_xAl_ySi_zO_w$), aluminum oxide ($Al_2O_3$), silicon nitride ($SiN_x$), ($Si_xAl_yN_z$) and combinations and non-stoichiometric combinations thereof.

A barrier material may comprise one or more layers; wherein at least one layer comprises at least one compound chosen from a group comprising $[RE]_x[RE]_y[RE]_z[C]_m[O]_n[N]_p[P]_r[Si]_s[Ge]_t[Al]_u$ wherein x>0 and at least one of y, z, m, n, p, r, s, t, or u are >0. A barrier material may be single crystalline; optionally it may be polycrystalline; optionally it may be amorphous; optionally barrier material may comprise one or more layers, at least one of which is single crystal.

The invention discloses the steps of:
a. preparing a clean glass substrate surface, b. depositing barrier layer(s) upon a glass surface, chosen from compositions of at least one of a rare-earth sesquioxide ($RE_2O_3$), rare-earth dioxide ($REO_2$), rare-earth monoxide (REO), rare-earth nitride (REN), rare-earth oxynitride ($REO_xN_y$), rare-earth phosphide (REP), rare-earth oxyphosphide ($REO_xP_y$), rare-earth carbide ($REC_y$), rare-earth oxycarbide ($REO_xC_y$), aluminium rare-earth oxide ($RE_xAl_yO_w$), and rare-earth aluminosilicate ($RE_xAl_ySi_zO_w$), aluminum oxide ($Al_2O_3$), silicon nitride ($SiN_x$), ($Si_xAl_yN_z$) and combinations thereof, c. forming a thin film semiconductor layer on the barrier layer/glass substrate composite article with the barrier layer disposed between the thin film and the glass substrate.

The described SoG article can be formed using layer transfer and/or direct wafer bonding and/or direct deposition and/or recrystallisation. The SoG article may comprise semiconductor and/or barrier layers chosen from substantially single crystal and/or polycrystalline and/or microcrystalline and/or nanocrystalline and/or amorphous thin film crystal structure. I rare-earth barrier layer may be deposited on a semiconductor prior to attachment to a glass substrate.

For solar cell and TFT display application it is desirable for the glass substrate in the SoG article to function as a transparent optical medium, used for coupling light.

Specifically, for solar cell operation it is desirable the glass substrate function as the environmental barrier for the thin film semiconductor and also as an optically transmissive coating for low loss solar spectrum absorption into the said semiconductor. Therefore, it is desirable for a barrier layer to exhibit optical transparency to solar radiation. That is, a barrier layer is chosen to exhibit a large band gap in excess of about 3 eV. In preference, barrier layer compositions of rare-earth sesquioxide ($RE_2O_3$), rare-earth dioxide ($REO_2$), rare-earth monoxide (REO), rare-earth oxynitride ($REO_xN_y$), rare-earth oxyphosphide ($REO_xP_y$), rare-earth oxycarbide ($REO_xC_y$), aluminum rare-earth oxide ($RE_xAl_yO_w$), and rare-earth aluminosilicate ($RE_xAl_ySi_zO_w$), aluminum oxide ($Al_2O_3$), silicon nitride ($SiN_x$), ($Si_xAl_yN_z$) and combinations thereof.

A rare-earth metal can be chosen from at least one of $\{^{57}La, ^{58}Ce, ^{59}Pr, ^{60}Nd, ^{61}Pm, ^{62}Sm, ^{63}Eu, ^{64}Gd, ^{65}Tb, ^{66}Dy, ^{67}Ho, ^{68}Er, ^{69}Tm, ^{70}Yb$ and $^{71}Lu\}$, also known as the lanthanide series. For purposes of the instant invention, yttrium, $^{39}Y$, is considered a rare-earth metal and considered included when [RE] is used. Furthermore, it is also disclosed rare-earth oxide based compounds containing Ge can also be utilized, such as, rare-earth alumino-germanate, ($RE_xAl_yGe_zO_w$).

Furthermore, optionally, a barrier layer is chosen to function as an insulator and/or dielectric. For thin film solar cell and TFT using SoG, the insulating nature of a substrate is advantageous for electrical isolation of devices on the SoG substrate. Therefore, the function of the barrier layer and/or a substrate may function as insulators and/or dielectrics, alternatively or simultaneously. An added advantage of using rare-earth oxide barrier layer in silicon-on-glass is the selective silicon etch stop provided by the different chemistry of a rare-earth compound versus a glass substrate.

Another example solar cell alternate embodiment is the use of barrier layer in SoG article with properties of: (i) transparent to a substantial portion of the solar spectrum with high energy absorption edge greater than or equal to 3 eV; (ii) electrically conductive; and (iii) provide resistance to transport of alkali ions. The barrier layer with the aforementioned properties may act as an optically transparent and electrically conducting layer and provide barrier to alkali transport across said barrier layer. This buried transparent conductive barrier layer (TCBL) can be used to form a contact layer for vertical p-i-n and/or p-n junction solar cells formed on the SoG article.

The drift of alkali ions through $SiO_2$ in a MIS (where M=Al, I=$SiO_2$ and S=Si) structure is asymmetrical, where the activation energy for drift from the metal-$SiO_2$ interface is larger than that from the Si—$SiO_2$ interface. Traps at the metal-$SiO_2$ interface exhibit a deeper energy compared to the Si—$SiO_2$ interface, thereby making emission more difficult at the former. The asymmetry is not present in poly-Si gate contact MOS devices. The motion of sodium ions in particular, are governed by emission of ions from traps at the interface and subsequent drift through the oxide. The mobility of alkali metals is given by the expression $\mu=\mu_o \exp(-E_A/kT)$. Typical parameters for Sodium: $\mu_o(Na^+)=3.5\times10^{-4}$ cm$^2$/V·s, $E_A(Na^+)\sim0.44$; Potassium: $\mu_o(K^+)=2.5\times10^{-4}$ cm$^2$/V·s, $E_A(K^+)\sim1.04$; and Lithium: $\mu_o(Li^+)=4.5\times10^{-3}$ cm$^2$/V·s, $E_A(Na^+)\sim0.47$. In comparison, Copper exhibits $\mu_o(Cu^{2+})=4.8\times10^{-7}$ cm$^2$/V·s, $E_A(Cu^{2+})\sim0.93$.

FIG. 1A depicts schematically the physical MOS layer structure formed on a SoG substrate comprising a thin film semiconductor 102 in intimate contact with a high sodium ion concentration glass substrate 101, such as $(Na_2O)_x(SiO_2)_y$ glass. A further dielectric oxide 103 and polycrystalline semiconductor gate contact 104 followed by a metal gate electrode 105 form a general gate stack.

FIG. 1B depicts the energy band structure of the MOS SoG device as a function of cross-sectional distance vertically through the layers. The high concentration of sodium ions 106 within the glass substrate 101 are free to migrate 109 across interfacial boundaries into the semiconductor thin film 102, oxide layer 103 and polycrystalline semiconductor layer 104. For the present example in FIG. 1B, the band energy alignments are shown for thin film semiconductor chosen from single crystal Si, the oxide 103=$SiO_2$, layer 104=poly-Silicon and metal contact 105 M=Aluminum. If the MOS SoG structure is illuminated by 3.5-5 eV ultraviolet photons, electrons from the conduction (107) and valence (108) band of Si may be injected into the $SiO_2$ conduction band (CB). These UV generated and injected electrons may be capable of passivating and/or neutralizing the Na$^+$ ions residing at the metal-$SiO_2$ and Si—$SiO_2$ interfaces. Nevertheless, it is disclosed the large concentration of alkali ions sourced from the glass substrate deleteriously degrade the performance, long term stability and reliability of the MOS SoG device. Possible prior art solutions are: (i) the use of multi-alkali effect in alkali silicate glasses, which can be used to significantly reduce ionic conductivity; or (ii) Alumino-borosilicate glasses, which may act as sinks for sodium and other process impurities.

Figures 2A, 2B:
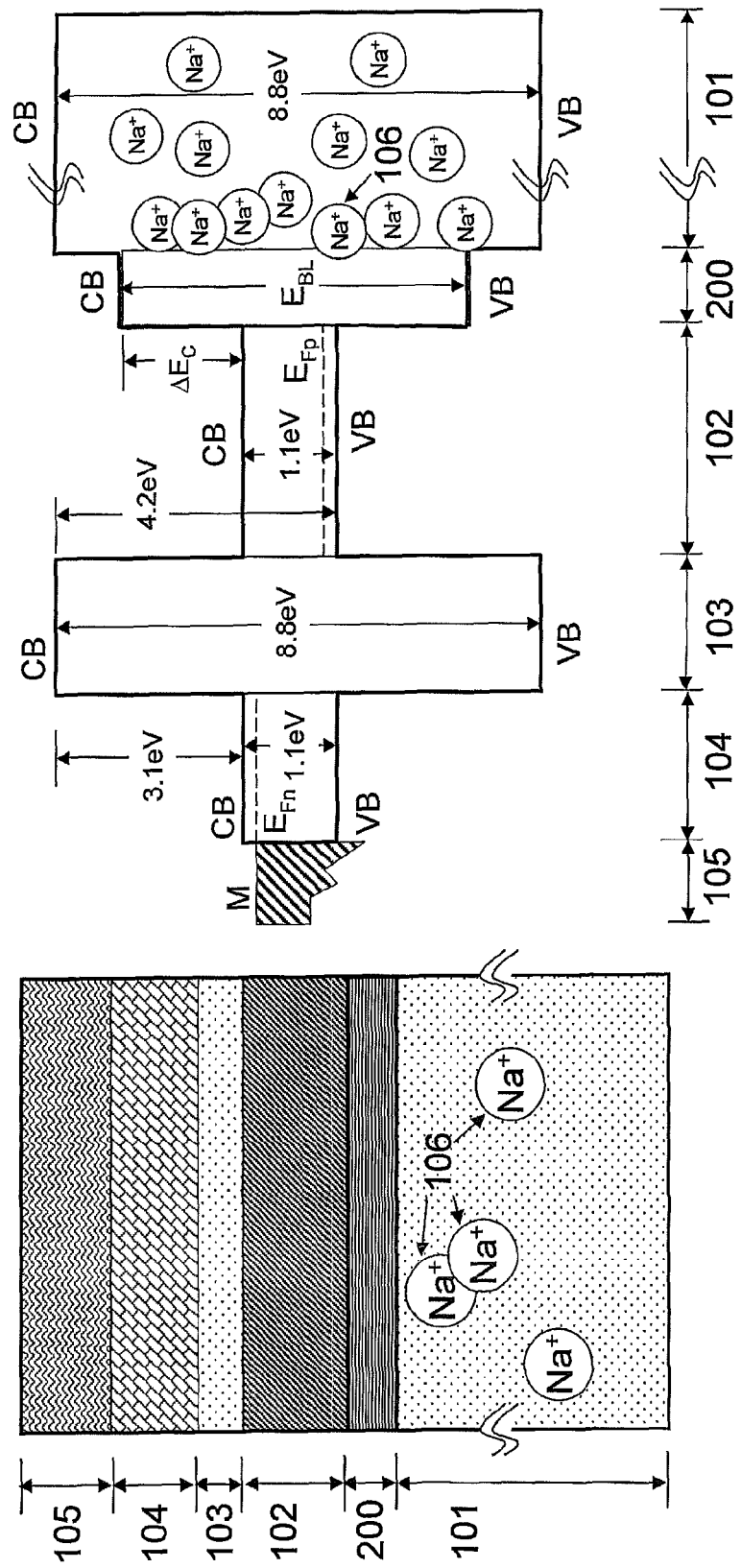
FIG. 2A shows the use of a barrier layer in a modified MOS SoG structure.
FIG. 2B, shows a criteria for an alkali barrier layer which is the advantageous partitioning of the valence ($\Delta E_v$) and conduction ($\Delta E_c$) band.

The present invention discloses a solution to the problem of alkali contamination of the thin film semiconductor active layer via the use of barrier layer as is shown in the modified MOS SoG structure of FIG. 2. The alkali-silicate glass 101 of FIG. 2A depicts sodium ions 106 blocked from migrating beyond the alkali barrier layer 200. The barrier layer 200 is disposed substantially between the thin film semiconductor layer 102 and the glass substrate 101. Silicon dioxide has a band gap energy of $E_g(SiO_2)\sim8.8$ eV and the barrier layer 200 has a band gap of $E_{BL}<E_g(SiO_2)$. FIG. 2B, shows a further criteria for the alkali barrier layer which is the advantageous partitioning of the valence ($\Delta E_v$) and conduction ($\Delta E_c$) band offsets relative to the thin film semiconductor conduction band (CB) and valence band (VB) extrema.

Sodium-Containing Silicate Glass and Barrier Layer Properties of Sodium-Silicate Glass ($Na_2O$)—($SiO_2$)

A simple yet instructive model of a two component sodium-silicate glass $(Na_2O).(SiO_2)=Na_2SiO_3$ is now described to aid but not limit the utility of engineering sodium-ion barrier layer(s) in SoG article. For example, the range of glass formation in the $Na_2O$—$SiO_2$ system is continuous from $SiO_2$ up to the meta-silicate composition $Na_2SiO_3$, which does not readily form a glass phase. Silica is a continuous network of $SiO_4$ tetrahedra. The introduction of $Na_2O$ into $SiO_2$ results in the formation of singly-bonded or non-bridging oxygen atoms, where the oxygen atoms are linked to only one Si atom. That is, not all oxygen atoms are bonded to two silicon atoms as in the $SiO_4$ network. Sodium ions are linked to surrounding oxygen atoms via ionic bonds that are much weaker than Si—O bonds. The extra oxygen atoms supplied by the $Na_2O$ increases the oxygen-to-silicon ratio O:Si>2. Therefore, sodium silicate glass is structurally weaker than pure vitreous silica ($SiO_2$). Increasing the $Na_2O$ content causes a greater number of non-bridging oxygens to be formed, until the material phase segregates into isolated $SiO_4$ tetrahedra linked together by ionic Na—O bonds.

Sodium-Ion Barrier Layers

By way of example and not intended to be limited to any particular theory, is the use of rare-earth compounds, such as rare-earth oxides (REOx), as barrier layer. REOx compositions exhibit approximately, eqi-partition conduction band offset $\Delta E_C \sim 2.4$ eV relative to single crystal Si. Binary rare-earth oxides with the pyrochlore and bixbyite crystal structures are vacancy-ordered derivatives of the $CaF_2$-type fluorite structure and exhibit lattice parameters approximately twice that of Si. Therefore, a close lattice match with Si and other elemental and/or compound semiconductors can be achieved by combinations of various rare-earth compounds such as metal oxides. Defects, such as misfit dislocations, at the Si/rare-earth oxide dielectric interface influence the mobility of charge carriers in the underlying semiconductor layer. Extended defects in bixbyite/Silicon epitaxy such as REOx films grown on Si(111) and Si(001) may also be used advantageously in the present invention for electrical conductivity optimization. The REOx bixbyite structure can be described as a vacancy ordered fluorite with two oxygen vacancies per fluorite unit cell, causing the bixbyite unit cell parameter to be twice that of fluorite in all three dimensions. Atomic and molecular interstitial defects and oxygen vacancies in single crystal rare-earth oxide (REOx) can also be advantageously engineered via non-stoichiometric growth conditions. The atomic structure of singly and doubly positively charged oxygen vacancies ($O_v^+$, $O_v^{2+}$), and singly and doubly negatively charged interstitial oxygen atoms ($O_i^-$, $O_i^{2-}$) and molecules ($O_{2i}^-$, $O_{2i}^{2-}$) can be engineered in defective single crystals of $REO_{x=1.5\pm y}$, $0 \leq y \leq 1$). Rare-earth metal ion vacancies and substitutional species may also occur and an oxygen vacancy paired with substitutional rare-earth atom may also occur. However, atomic oxygen incorporation is generally energetically favored over molecular incorporation, with charged defect species being more stable than neutral species when electrons are available from the rare-earth conduction band. It is disclosed that oxygen vacancies advantageously inhibit alkali ion transport and thus can be used as a component of an effective barrier layer. Rare-earth oxides can be deposited by various methods, (e.g. ALE, atomic layer epitaxy, MBE, ALD, CVD and the like) and at low temperatures, well within a temperature limit of 700° C. for soft glass. It is disclosed in the present invention that oxygen vacancies can be used as part of a rare-earth based compound as an effective barrier to positive ion migration, and more preferably inhibit $Na^+$ ions.

Optional barrier layer materials are, for example, rare-earth nitride (REN), rare-earth oxynitride ($REO_xN_y$), rare-earth phosphide (REP), rare-earth oxyphosphide ($REO_xP_y$), rare-earth carbide ($REC_y$), rare-earth oxycarbide ($REO_xC_y$), aluminium rare-earth oxide ($RE_xAl_yO_w$), and rare-earth aluminosilicate ($RE_xAl_ySi_zO_w$), aluminium oxide ($Al_2O_3$), silicon nitride ($SiN_x$), silicon-aluminium-nitride ($Si_xAl_yN_z$), phosphate glass, $P_5O_5$, borophosphate silicate glass BPSG, and combinations and non-stoichiometric combinations thereof.

Chlorine may also be used to inhibit sodium ion transport in silica. Therefore, a chlorinated surface of silicate glass is also a possible alkali diffusion barrier; optionally a barrier layer high in free chlorine in combination with a rare-earth composition is disclosed.

Thin Film Single Crystal Silicon Layer Transfer onto Glass Substrate for Solar Energy Conversion Devices The present invention discloses the method of single crystal Si layer transfer process onto alternative substrate to form a thin film semiconductor-on-glass article. Furthermore, an alkali barrier layer is disposed between the thin film semiconductor and the glass substrate.

The present invention also discloses method of single crystal Si layer transfer process onto alternative substrate and methods for incorporating electrical and opto-electrical conversion regions within the said thin film article.

Wafer bonding of a thin film single crystal silicon layer onto a glass substrate is now described in detail. The formation of a thin film of silicon suitable for layer-transfer is possible using high dose ion implantation.

Figure 3:
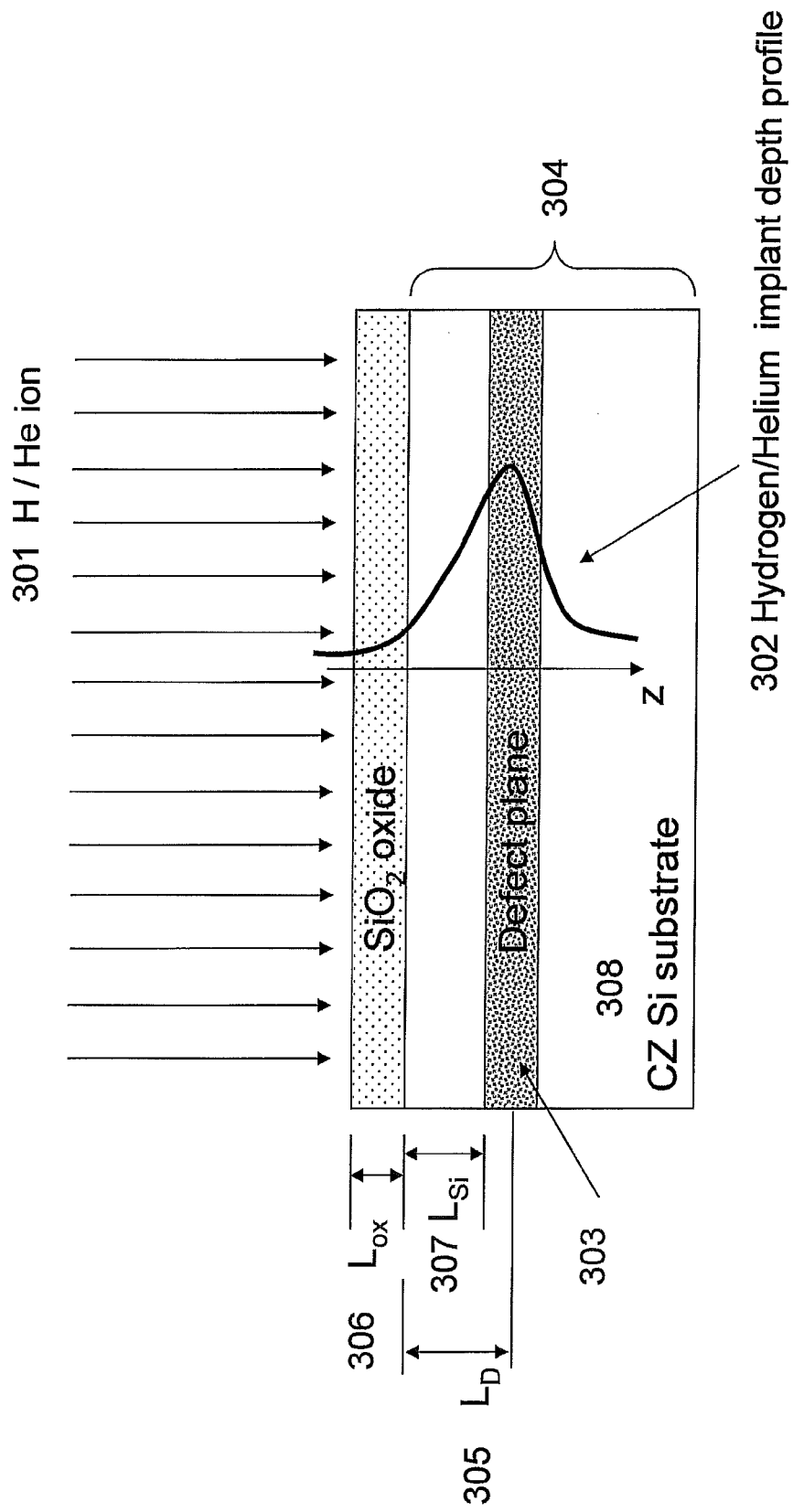
FIG. 3 shows the geometry used for ion implantation of foreign species into preferentially CZ Si substrate.

FIG. 3 describes the geometry used for ion implantation of foreign species 301 into preferentially CZ Si substrate 304 to form a Gaussian profile distribution volume 302 of said ions in the Si crystal. The defect plane 303 substantially plane parallel to the Si crystal surface. The depth of the peak of the defect layer distribution residing a distance $L_D$ from the Si surface. An optional protective oxide layer and/or alkali barrier layer, 306 is also shown.

Figure 5:
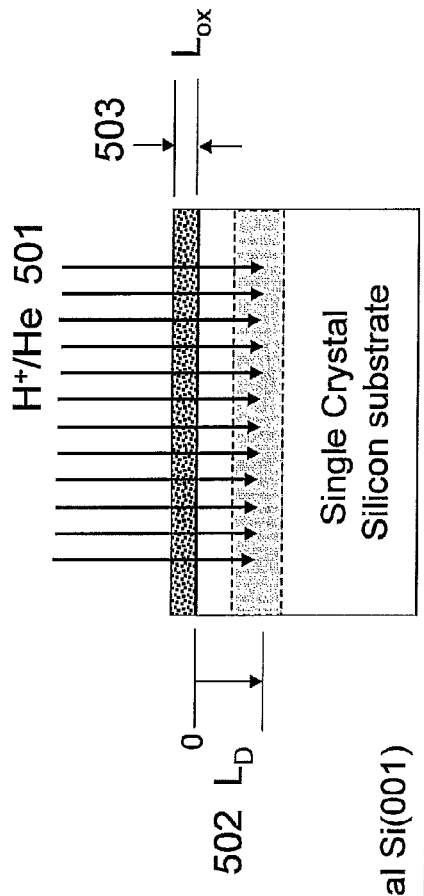
FIG. 5 shows exemplary ion implantation into an original device substrate.
Figure 4:
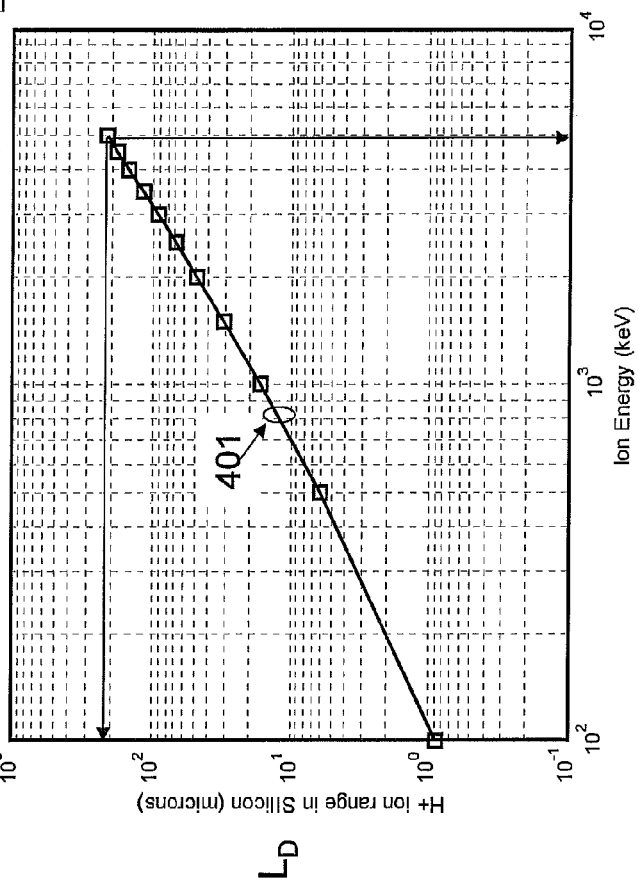
FIG. 4 shows calculated depth profiles for H+ ions using various incident energy implants.
Figure 6:
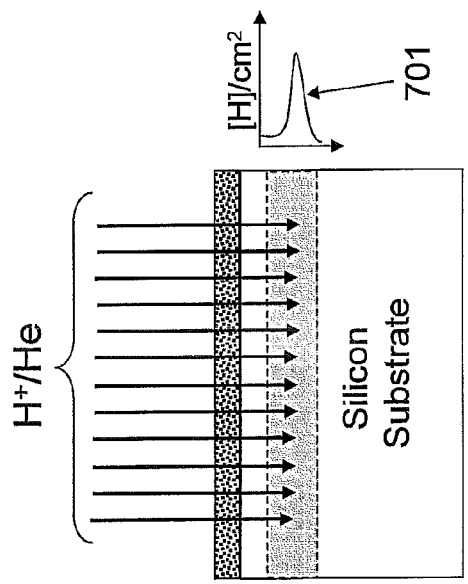
FIG. 6 shows exemplary ion implantation into an original device substrate.

FIG. 4 shows calculated depth profiles for H+ ions 401 using various incident energy implants. In preference the ion species is chosen from hydrogen and/or helium. For the case of $H^+$, the peak depth $L_D$ versus implant energy range 100 keV$\leq$E$\leq$5 MeV is shown. Clearly, the defect layer depth beneath the surface can be placed in the range $1 \leq L_D < 250$ μm, depending on the energy used. The calculated results were performed using SRIM 2003 ion implant code, and $L_{ox}$=200 Å $SiO_2$. FIG. 5 shows exemplary ion implantation into an original device substrate. FIG. 6 shows exemplary ion implantation into an original device substrate.

Figure 7:
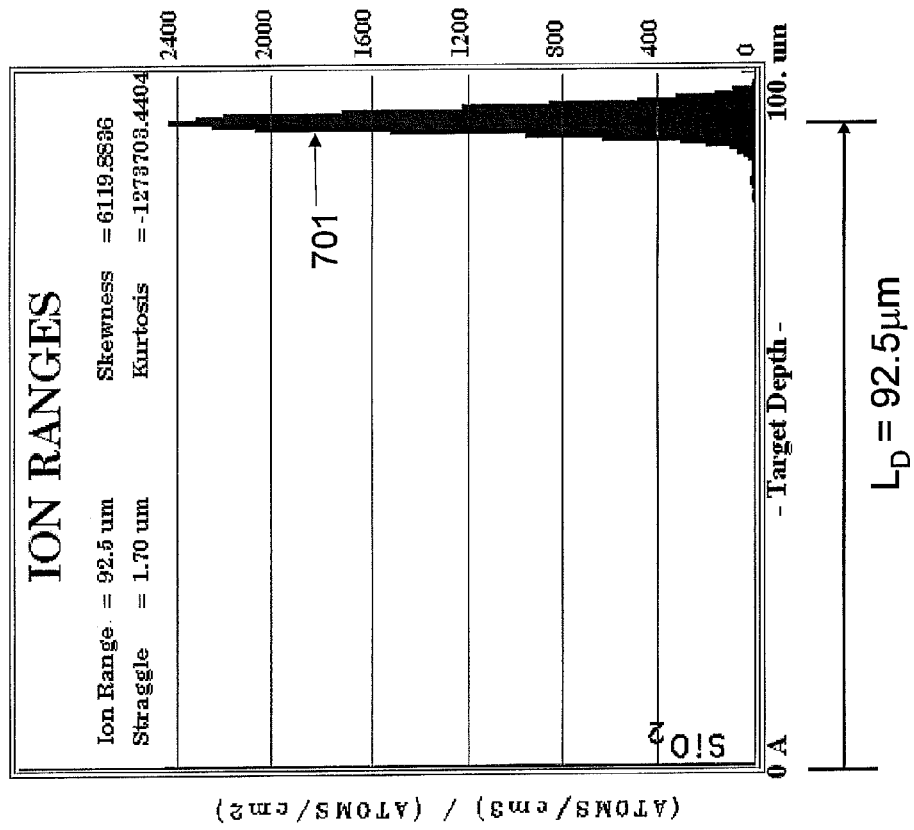
FIG. 7 shows the distribution of $H^+$ ions 701 in the buried layer beneath the Si surface for the case of 3 MeV.

FIG. 7 shows the distribution of $H^+$ ions 701 in the buried layer beneath the Si surface for the case of 3 MeV.

Thin Film Single Crystal Semiconductor-on-Glass Process

In one embodiment a process is used to fabricate a vertical type opto-electronic solar spectrum energy conversion device using thin film single crystal semiconductor layer transfer method. In preference the semiconductor is chosen from silicon or germanium or combinations thereof, an alternative substrate is chosen from silicate glass compositions, and more preferably alkali-silicate glasses. The alkali barrier layer is chosen according to the specifications disclosed in the present invention.

FIG. 8 shows individual parallel process paths for fabrication of thin film single crystal solar cell on glass article. A single crystal CZ Si substrate 801 and alternative substrate 807 are cleaned and prepared for processing. An optional $SiO_2$ protective layer 802 is deposited or thermally grown on the CZ Si substrate 801. A barrier layer may also be deposited upon or in place of layer 802. The CZ substrate is then implanted according to the method described in the present invention to form a buried defect layer 804. A cleaned alternative substrate 807 is then deposited with a uniform barrier layer 808.

Figures 9A, 9B:
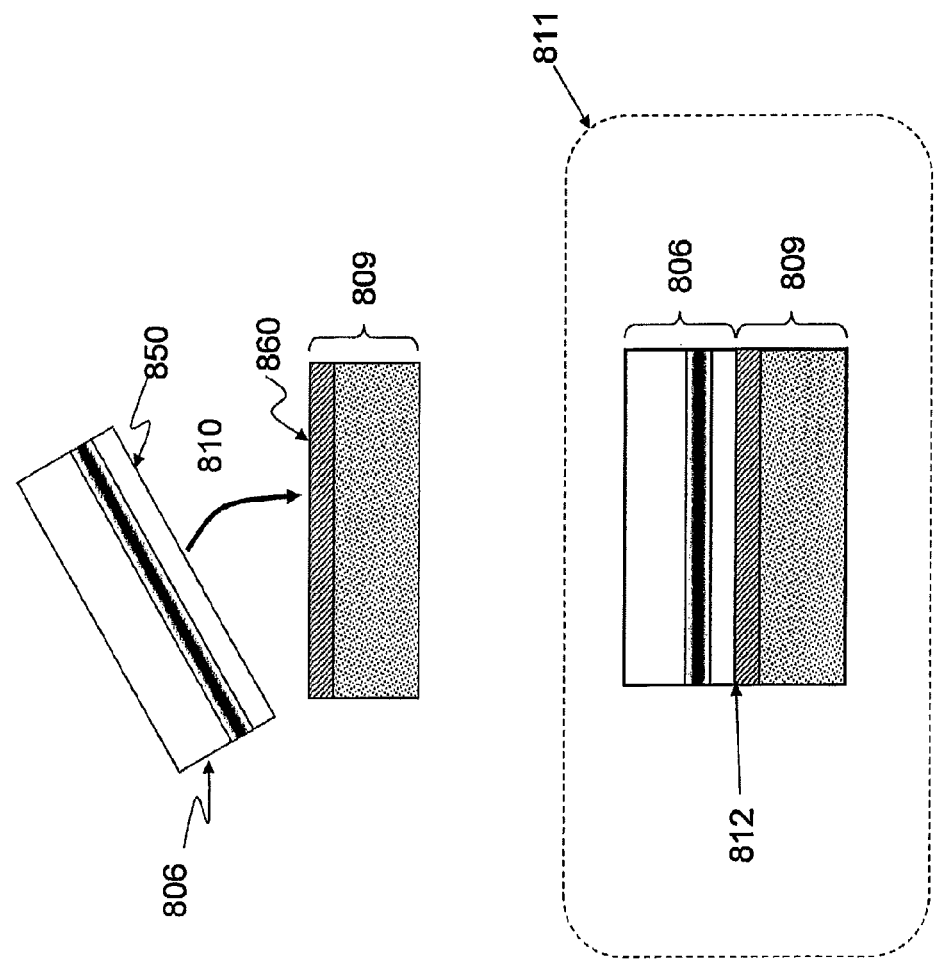
FIGS. 9A and B show how an alternative or replacement substrate with insulating and/or conductive barrier layers and implanted CZ Si substrate are joined together.
Figures 10A, 10B:
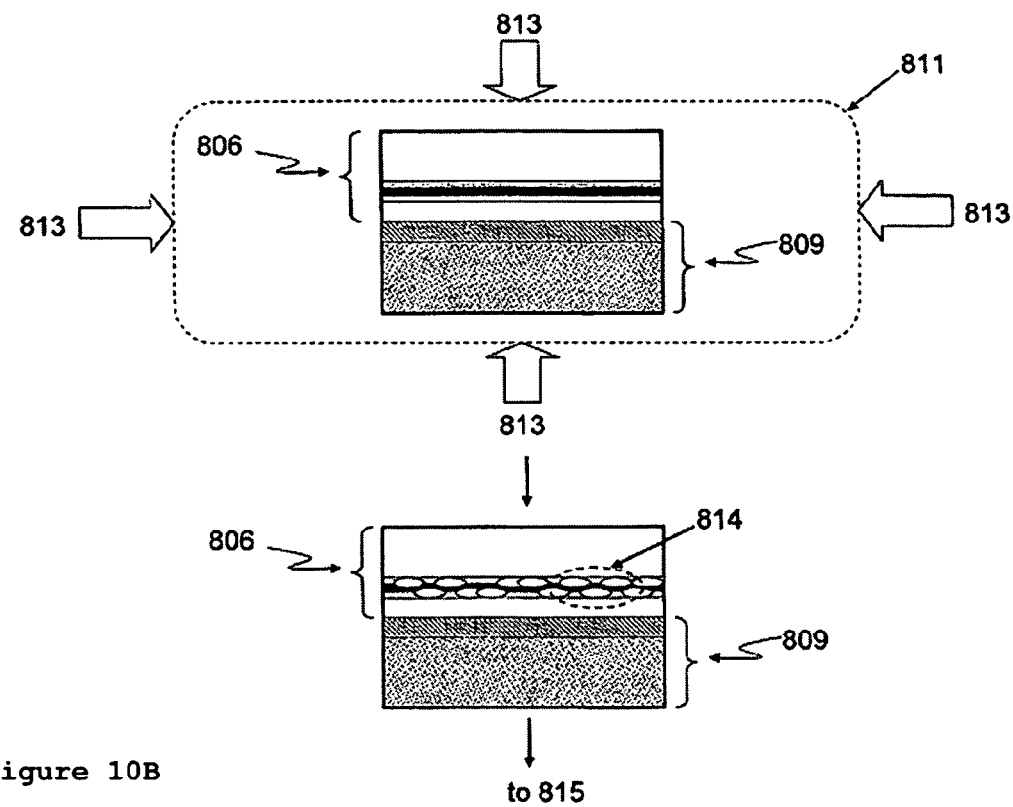
FIGS. 10A and B show how a compound multilayer article is subjected to a thermal annealing sequence.

Alternative substrate 807 is preferably chosen from alkali-silicate glass. FIG. 9 shows how the alternative substrate with insulating and/or conductive barrier layer 809 and implanted CZ Si substrate 806 are joined together 810 with opposing surfaces 850 and 860. The surfaces must be free from particulate contamination and can be vacuum joined, van der Waals or anodic and the like bonded together. FIG. 10 shows how a compound multilayer article 811 is then subjected to thermal annealing sequence 813 to strengthen the bond between surfaces 850 and 860 and to initiate temperature dependent defect fracture 814 confined to a region advantageously aligned with CZ Si crystallographic axes. A thermal anneal sequence 813 generates fracture within said CZ Si crystal confined substantially to the plane defined by the defect plane.

FIG. 11 next shows how, with application of external mechanical stimulus 815 to at least one region of the edge of the compound article 811, the fracture propagates throughout the defect plane causing physical separation of remaining bulk CZ Si substrate 816 and thin film CZ Si coupled to alternative substrate 817. The resulting defect plane may exhibit rough surface 818 on both the exposed thin film CZ Si and the cleaved surface of the bulk substrate. The surface roughness of 818 may have surface features ranging from several nanometers to several micrometers depending on the O:H ratio and implant energy. Typically, higher implant energies result in wider full width at half maximum of the Gaussian defect layer. For example, a 3 MeV $H^+$ implant results in a straddle of ~1 µm.

FIG. 12 shows how the wafer bonded thin film CZ Si and thus formed buried barrier layer on the glass substrate 817 are then processed to form a vertical type MIS, p-n junction and/or p-i-n diode solar cell device 832. The vertical solar cell functions by converting incident solar radiation coupled into the thin film semiconductor layers 833 into photo-generated electronic charge carriers. The incident solar radiation is directed in a vector initially incident upon the glass substrate surface, through the glass substrate and into the thin film absorber region. Example solar cell devices are disclosed in the next section. Further, thin film semiconductor and/or dielectric and/or metallic layers may be directly deposited upon surface 818 of SoG article 817. Thin film single crystal semiconductor layer 819 is suitable for direct epitaxy of further single crystal semiconductors and dielectrics. For example, the initial bulk Si substrate 801 may be chosen as p-type Si (p:Si). The completed SoG article is therefore a single crystal p:Si thin film on glass article. A p-i-n diode structure can be formed from the p:Si SoG by further deposition of not-intentionally-doped intrinsic Si layer 830, followed by a n-doped Si layer 831. The p-i-n Si homojunction diode 833 is suitable for high performance solar cell devices.

Alternately layer stack 833 may comprise a MIS device.

Lastly, the majority of the removed bulk CZ Si substrate portion 816 can be reprocessed via chemical mechanical processing (CMP) 821 to form a substantially flat surface 823 resembling the initial CZ Si substrate. As the removed thin Si film has thickness significantly less than the total thickness of the starting CZ Si substrate 801, the reprocessed substrate 823 can be used for subsequent processing of another thin film removal 801.

Yet another embodiment is the method of fabricating multiple single crystalline layer devices before the wafer bonding and physical separation process.

Figure 13:
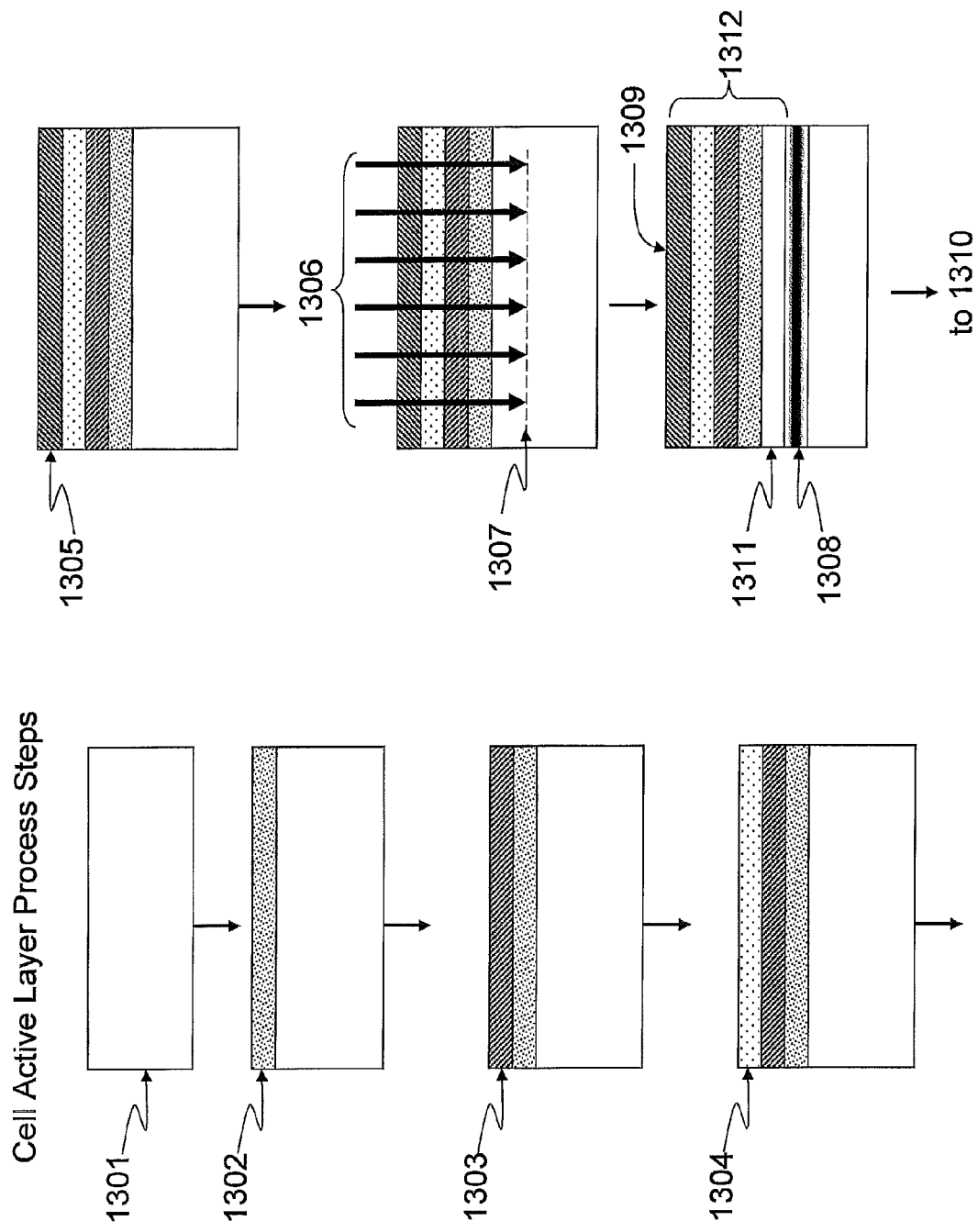
FIG. 13 discloses an example method and general process flow for fabricating multiple single crystalline semiconductor layers.

FIG. 13 discloses an example method and general process flow for fabricating multiple single crystalline semiconductor layers 1312 upon a bulk single crystal semiconductor substrate 1301. The multi-layer semiconductor stack 1312 is separated by ion-implantation technique 1306 as described previously by a defect layer 1308.

Implanted ion species are chosen in preference from $H^+$ and/or $He^+$ ions. FIGS. 5 and 6 show exemplary ion implantation into an original device substrate. Alternatively, methods disclosed in U.S. application Ser. No. 11/788,153 are incorporated herein in their entirety by reference; the instant invention discloses the addition of a rare-earth based barrier layer in combination with previously disclosed semiconductor and/or solar cell structures.

Figure 14:
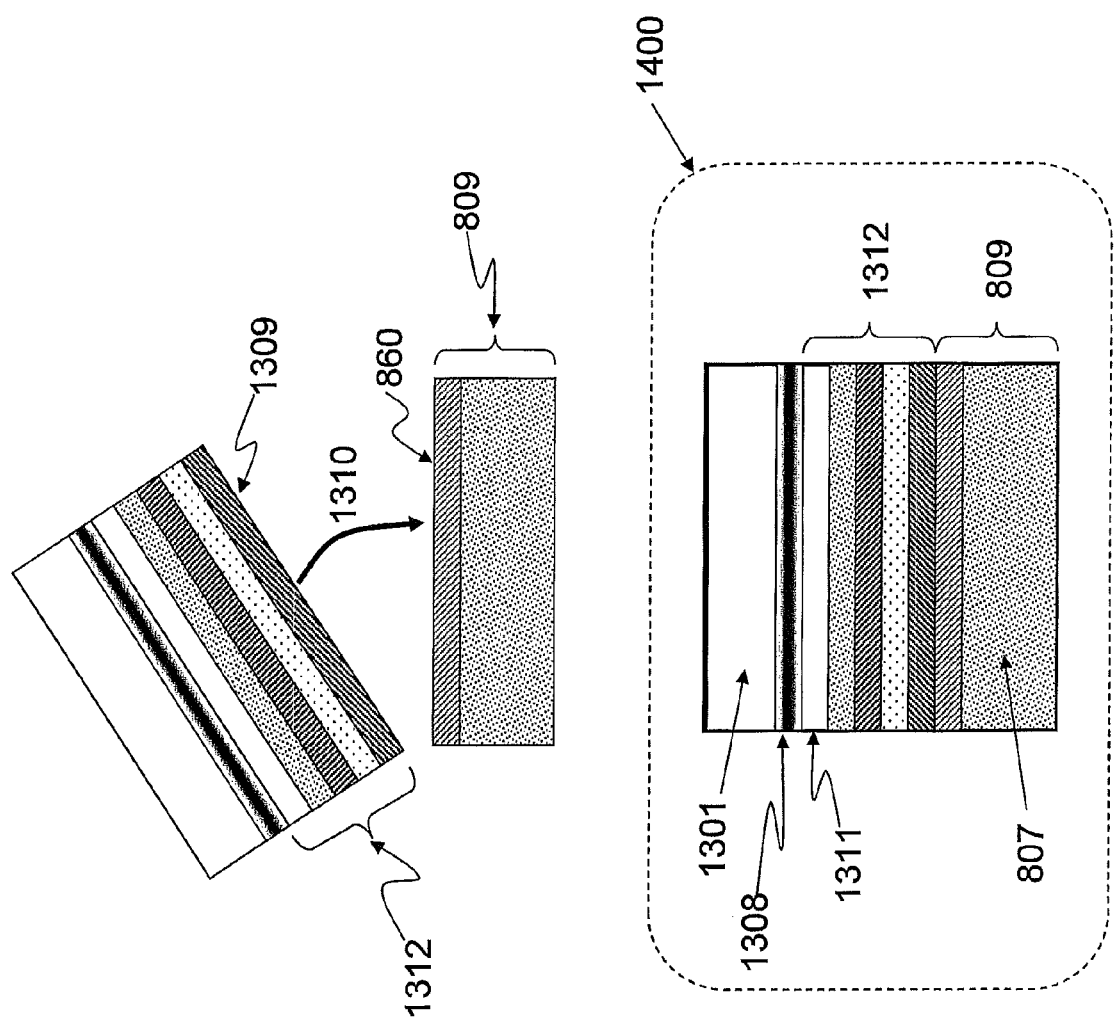
FIG. 14 shows a remaining portion of a silicon thin film separated from the bulk of a substrate via defect layer.

An example layer sequence 1312 is composed of: p-type Si substrate 1301; intrinsic Si (1302); n-type Si 1303; intrinsic Si 1304; p-type Si 1305. Upon wafer bonding onto glass substrate 809, as shown in FIG. 14, a remaining portion of thin film Si 1311 is separated from the bulk of the Si substrate 1301 via defect layer 1308.

Figure 15:
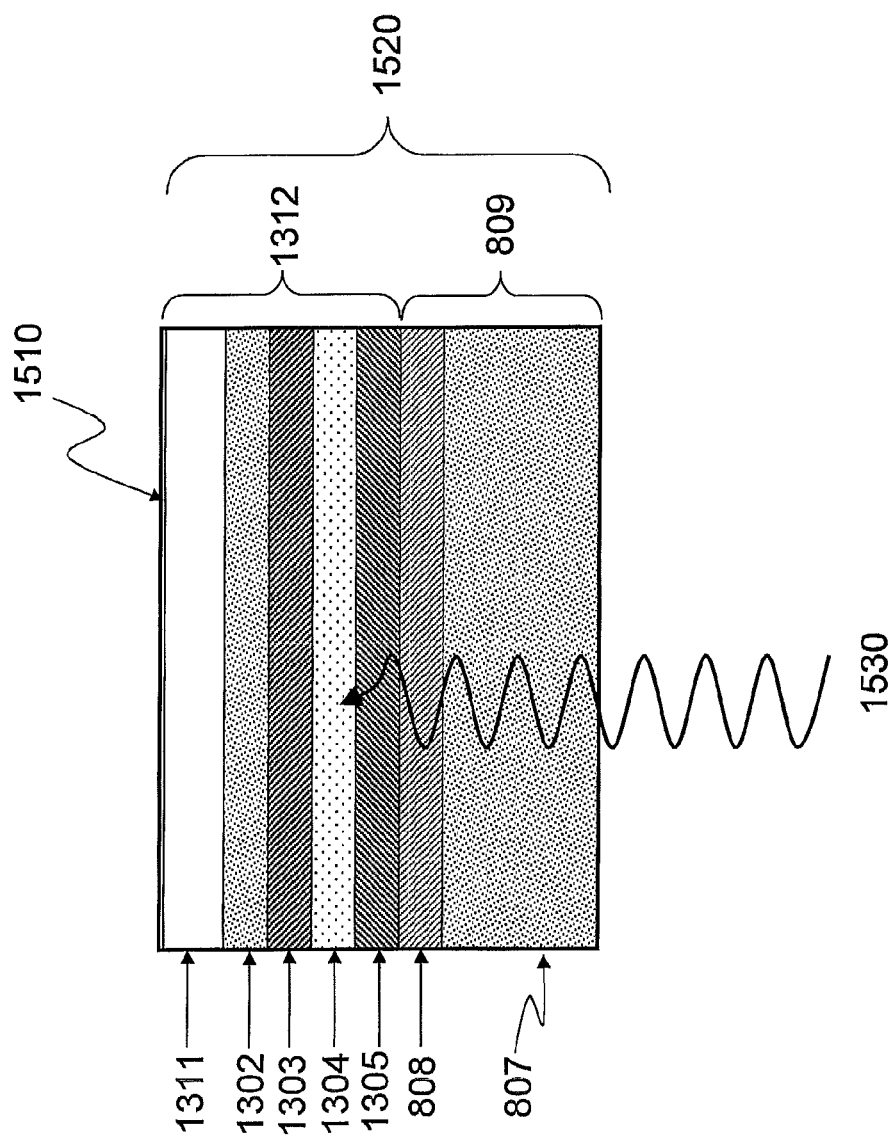
FIG. 15 shows a transferred layer stack forming a p-i-n-i-p doped Si multilayer diode coupled to a glass substrate.

FIG. 15 shows the transferred layer stack 1312 forming a p-i-n-i-p doped Si multilayer diode coupled to the glass substrate 809. The structure multilayer single crystal Si SoG device 1520 is suitable for solar cell operation by coupling solar radiation 1530 through the transparent substrate 807 and barrier layer 808 into the active region(s) comprising 1312. The final surface 1510 defined by the defect plane can be metallized to form an optical reflector and/or electrical contact(s).

SoG Solar Cell Devices

Figure 16A:
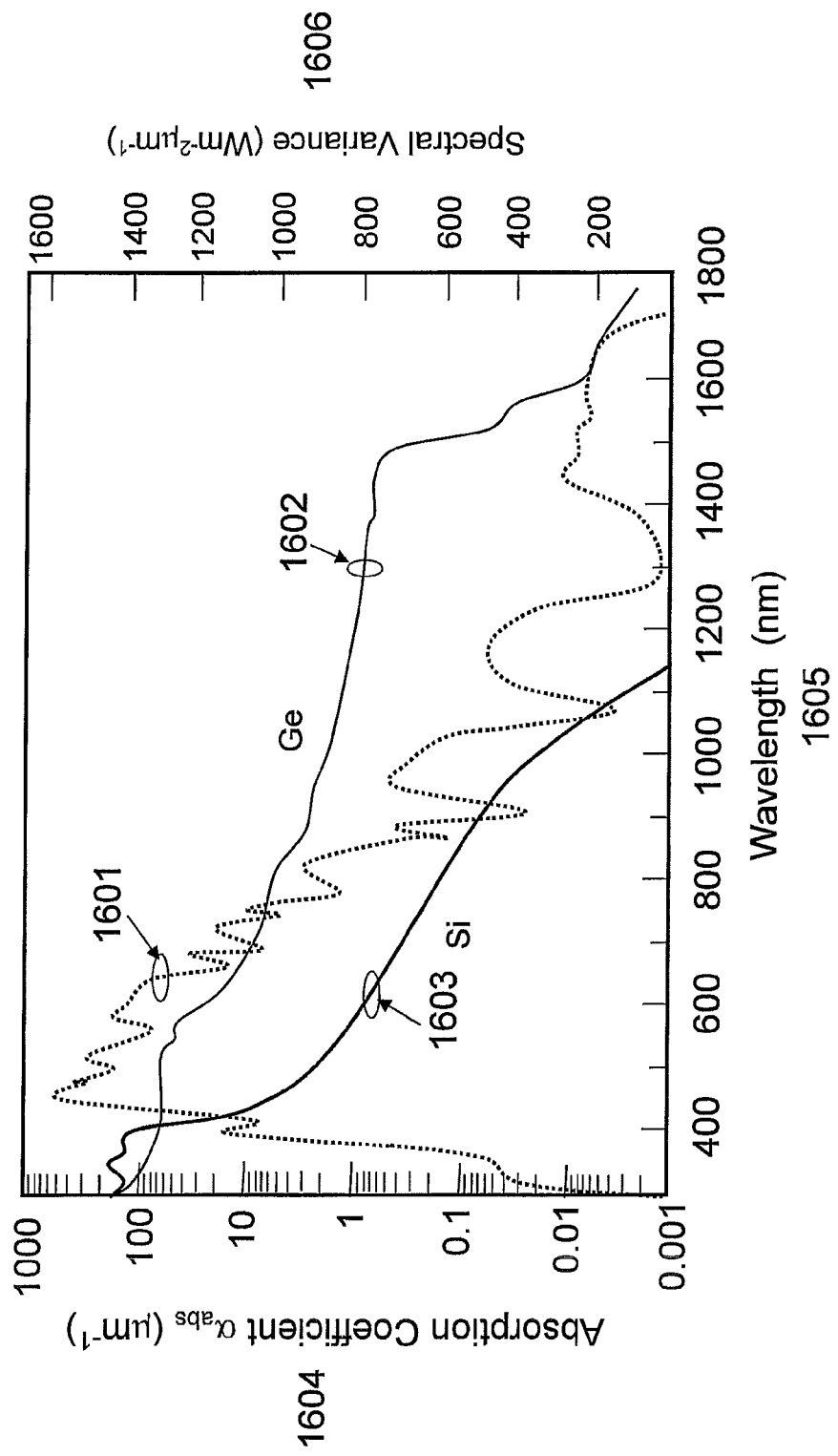
FIG. 16A shows the overlap of Ge absorption with the solar spectrum and 16B shows the energy band structure of bulk single crystal Si as a function of energy.

The broadband solar optical spectrum at ground level ranges wavelengths (λ) from below 300 nm to over 1700 nm, spanning the ultraviolet to far infrared. FIG. 16A shows a general solar power spectrum 1601, punctuated with multiple absorption regions. The peak spectral variance 1606 occurs at $\lambda_p$~496 nm (~2.5 eV) in the 400<λ<600 nm region. Prior art optical photon-to-electron conversion devices employing semiconductors are well known. FIG. 16A shows the absorption coefficient $\alpha_{abs}$ 1604 of single crystal silicon (Si) 1603 and germanium (Ge) 1602 semiconductors. The indirect bandgap semiconductors Si and Ge span major portions of the solar spectrum. Close to the energy band gap, both Si and Ge have long wavelength absorption tails due to the indirect energy-momentum band structure. If an optical photon incident upon the Si crystal has energy equal to or above the fundamental band gap energy it is absorbed. This creates an electron-hole pair with the aid of an appropriate lattice phonon wavevector—which is required in the photocarrier generation process in order to conserve energy and momentum. The inverse process of electron-hole (e-h) recombination is extremely inefficient compared to direct band gap semiconductors. Looking closely at the absorption coefficient of Si in FIG. 16A, it is shown that the absorption depth near the fundament band gap energy ($E_g$(Si)=1.1 eV) is extremely long. This means that photons with energy equal to or slightly greater than band gap energy $E_g$(Si)≧1.1 eV will penetrate a depth $L_e=1/\alpha_{abs}$, deep within the crystal. That is, for 900<π<1120 nm the penetration depth for 1/e absorption ($L_{1/e}$) is 10<$L_{1/e}$<1000 µm, thus requiring thick Si substrates for bulk band edge solar cells. Not well known by researchers in the field, is the fact, that Si possesses one of the highest known absorption coefficient for all commercially mature semiconductors in the blue to UV region, λ~<450 nm.

FIG. 16A also shows the overlap of Ge 1602 absorption with the solar spectrum 1601 as a function of wavelength 1605. Ge exhibits 10-100× higher absorption co-efficient than Si in the 1.1-3 eV range. This means 10-100× thinner film absorbers using Ge are possible compared to Si. The use of Ge extends absorption down to 0.66 eV and therefore can potentially access more of the available solar spectrum and available power. For the case of high volume, large area and low cost solar cell fabrication, large Si substrates ($\phi_{max}$=450 mm diam., CZ growth) are still advantageous and at least ~10-50× cheaper than Ge substrates ($\phi_{max}$=150 mm, CZ growth). Furthermore, electronic grade silane gas ($SiH_{4(g)}$) suitable for CVD deposition of epitaxial Si is significantly lower in cost and easy to produce via gasification of silica. Therefore, in some embodiments, a solution is sought using silicon as the only electronic material, as compared to multiple semiconductor solutions, such as, prior art multi-junction (MJ) solar cells (i.e.; GaAs/InGaP/Ge).

It is an aspect of the present invention to fully utilize the unique optical and electronic properties of single crystal Si to form new types of high efficiency solar cell devices. Furthermore, the utility and cost structure of wafer bonding is severely limited in available single crystal bulk substrate diameters if anything other than Si is used. However, even by using Si substrates for solar cell manufacture, in preference to all other commercially relevant semiconductors, there is a pressing need to increase solar cell efficiency and dramatically reduce cost.

One of the disadvantages of conventional and/or prior art solar cells based on a bulk Silicon semiconductor absorber is the incidence of high energy photons, which degrade the absorption and conversion efficiency of the bulk single junction Si solar cell. Whilst the monochromatic efficiency of standard p-n junction Si solar cells can be high (~21% for 1-sun), the full solar energy bandwidth or polychromatic efficiency is much lower. Clearly, this is a large disadvantage with bulk Si as the solar cells are designed to generate energy from solar radiation. One attempt to overcome this disadvantage is to employ optical filtering to narrow the wavelength band of incident radiation. However, this has the obvious disadvantage that large amounts of useful spectrum are discarded and accordingly more incident power is required at a specific wavelength to increase the output current of the solar cell. For example, solar concentrator technologies can be used. Other single junction (SJ) methods use alternate semiconductors from either III-V compounds or II-VI compounds in preference to Si. For example, gallium arsenide (GaAs), gallium-indium-phosphide (GaInP), copper-indium-gallium-selenide (CIGS) and cadmium-telluride/sulphide (CdTe/CdS) compounds can also be disposed on cost effective substrates, such as glass, using the present invention. Electrical conversion efficiency of these alternate semiconductor SJ cells can be good, but practical cells exhibit lower efficiency and/or higher cost than compared with state-of-the-art single crystal silicon solar cells. Furthermore, alternate semiconductor SJ cells suffer the disadvantage of at least one of high cost, use of non-abundant materials and/or toxic substances. It is noteworthy to state that such devices based on alternative conversion medium using SJ devices are constrained to limiting potential efficiency identical to single crystal Si SJ cell. An advantage of using wider band gap energy materials is the cell voltage may increase and thus develop a large open circuit voltage.

Figure 16B:
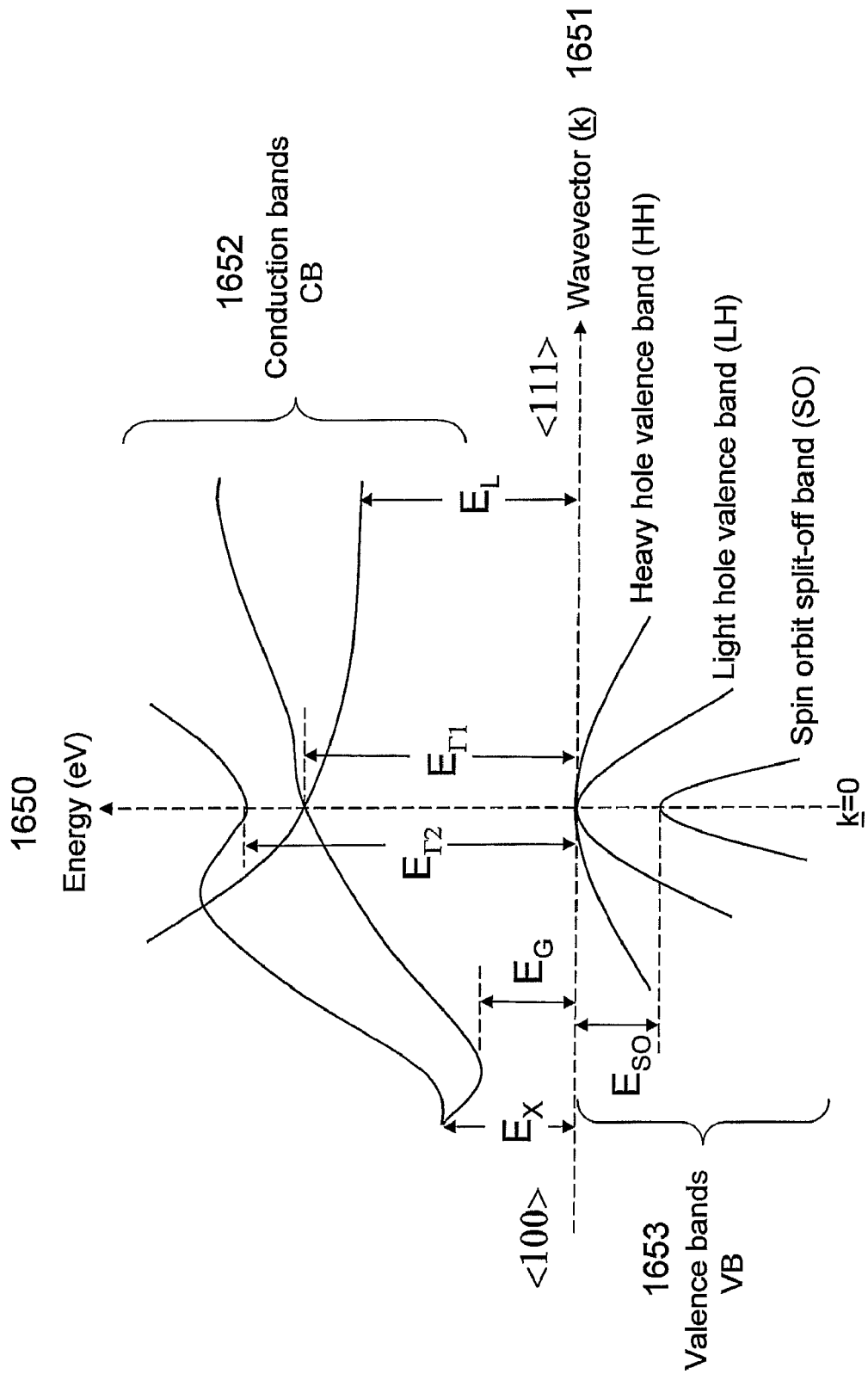

In theory, Si should be a very efficient solar cell material; however high energy photons degrade the conversion efficiency. FIG. 16B shows the energy band structure of bulk single crystal Si as a function of energy 1650 and wave-vector 1651. The periodic array and definite symmetry of Si atoms in the crystal forms an extended band structure consisting of conduction (CB) 1652 and valence (VB) 1653 bands. Electrons and holes are constrained to satisfy the E-k dispersion, as shown. Silicon exhibits a complex band structure due to the diamond-like crystal lattice, with critical point energy gaps $E_G$=1.1 eV, $E_{\Gamma 1}$=3.4 eV, $E_{\Gamma 2}$=4.2 eV, $E_X$=1.2 eV, $E_L$=2.0 eV, $E_L$=44 meV. The unstrained bulk valence band is composed of a heavy- (HH) and light-hole (LH) band, degenerate at zone center k=0. The fundamental and indirect band gap $E_G$, requires phonon participation for creating an electron-hole pair via absorption of a photon with energy ($E_\gamma$) co-incident with $E_G$. Referring to FIG. 16B, Si also possesses direct energy band gaps between $E_{\Gamma 1}$ and $E_{\Gamma 2}$, resulting in very high absorption co-efficients (refer short wavelength portion of FIG. 16A). High energy blue and UV photons are efficiently absorbed (within 0.1 μm of the surface for 400 nm photons, refer FIG. 16A) in the upper conduction and valence bands creating hot electron hole pairs with large excess energy relative to the fundamental edges at $E_G$. These hot carriers couple to the lattice and quickly thermalize or equilibrate by emitting lattice phonons of energy $\omega_{LO}$. The UV photogenerated carriers therefore cannot easily participate in photocurrent generation in bulk and/or thick Si p-n SJ devices relying on large carrier transit distances. It is an object of the present invention to design high energy photon absorption Si solar cell capable of extracting the energetic photogenerated carriers.

In order to increase UV responsivity in Si, it is necessary to avoid dead layer formation on the irradiated Si surface. A method to circumvent dead layer region formation is via creating a charge inversion layer at the interface between a dielectric material and semiconductor, for example the $SiO_2$/Si interface. Alternatively, an inversion layer can be generated by a potential energy Schottky barrier via appropriate work function metal placed in contact with intrinsic Si. The UV response of the inversion layer is superior to vertical and/or planar p-n and/or p-i-n junction type photodiodes. Photovoltaic operation can be optimized via a built-in voltage generated by advantageous placement of a lightly doped junction formed close to the surface of the device. High quality $SiO_2$ has a large band gap $Eg(SiO_2)$~8.8 eV, and does not absorb high energy solar UV light. Depending on the growth and/or deposition technique used to form $SiO_2$, the optical properties can be modified. Using gas source deposition, various amounts of hydrogen may be incorporated in the amorphous oxide layer. The hydrogen may affect the transmission/absorption properties of the film. Conversely, $SiO_2$ and hydrogen are beneficial for surface passivation of the Si surface states which is a desirable property.

Thermally grown $SiO_2$ via oxidation and thus consumption of Si produces the highest quality oxide and $Si/SiO_2$ hetero-interface. The band alignment for the poly-Si gate contact MOS device using the $Si/SiO_2$ system is shown in FIG. 1B. The energy difference between the Si CB and the $SiO_2$ CB is $\Delta E_c$~3.1 eV. Similarly, the energy difference between the Si VB and $SiO_2$ CB is ~4.2 eV. Higher energy photons with energy in excess of 3.1-4.2 eV are therefore capable of injecting electrons from Si into the oxide. This effect can be used advantageously in devices disclosed herein.

Typically, $SiO_2$ is an optimal antireflection (AR) coating as well as a passivation layer. Transparent low loss AR layers are used in the present invention. Typically, wide band gap energy materials optically transparent to the solar spectrum, such as, $SiO_2$, Aluminium-oxide ($Al_2O_3$) magnesium-oxide (MgO), calcium fluoride ($CaF_2$), magnesium fluoride ($MgF_2$), silicon-nitride ($Si_3N_4$), titanium-dioxide $TiO_2$, tantalum-pentoxide (Ta$_2$O$_5$) and the like are used. The present invention further teaches a new class of wide band gap optical materials suitable for optical coating, specifically, the materials of rare-earth metal oxide (REO$_x$), rare-earth metal oxynitride (RE-O$_x$N$_y$) and rare-earth metal oxy-phosphide (REO$_x$P$_y$), and combinations thereof, glasses and/or crystalline material. A rare-earth metal is chosen from the group commonly known as the lanthanide series. Mixtures including Si, Ge, C, combinations of rare-earths and/or silicates can also be used with the aforementioned rare-earth based materials. An optical coating may comprise one or more layers wherein at least one layer comprises at least one compound chosen from a group comprising [RE]$_x$[RE]$_y$[RE]$_z$[C]$_m$[O]$_n$[N]$_p$[P]$_r$[Si]$_s$[Ge]$_t$[Al]$_u$ wherein x>0 and at least one of y, z, m, n, p, r, s, t, or u are >0. A coating layer may be single crystalline; optionally it may be polycrystalline; optionally it may be amorphous; optionally optical coating material may comprise one or more layers, at least one of which is single crystal.

Example I

Metal-Insulator-Semiconductor Solar Cell Using SoG

A metal-insulator-semiconductor (MIS) device fabricated upon a glass substrate is disclosed in FIGS. 17A & 17B. The thin film single crystal semiconductor layer 1703 is fabricated upon a transparent substrate 1701 according to the methods of the present invention. Layer 1703 with thickness 1711 is chosen from single crystal Si, and the substrate 1701 with thickness 1713 is chosen from low cost alkali-silicate glass. An alkali barrier layer 1702 with thickness 1714 separates the thin film semiconductor 1703 from the glass substrate 1701 in order to prevent alkali ion contamination.

The SoG substrate is fabricated into the MIS device via optional selective oxidation of thin film Si layer 1703 into SiO$_2$ regions 1704 and/or 1705. Layer 1705 is a dielectric and/or insulating material and can be chosen from SiO$_2$, SiN$_x$ or single crystal rare-earth oxide compositions as disclosed in U.S. Pat. No. 7,199,015, titled "Rare-earth oxides, nitrides, phosphides and ternary alloys with Silicon". The insulating layer 1705 is preferably grown thin to act as a tunnel barrier, although thick layers can also be used. The metal or conductive contact layer 1706 collects photo-created carriers generated in the active layer 1703 and in a region proximate to the Si/insulator interface. Electrical contacts to the active layer 1707 complete the circuit. Incident optical radiation 1720 enters the glass substrate and is absorbed in the thin film Si layer 1703. Photons that are not absorbed on first pass through 1703 are reflected by the oxide electrode 1706, thereby enabling a second pass 1721 through the active layer 1703. This constitutes a 2-sun solar cell device. The MIS SoG equivalent circuit is shown in FIG. 17B. Electrical contacts 1707 are equivalent. Metallization chosen for contacts may be different for the purpose of low ohmic contact 1707 to 1703 and/or specific work function metal for the oxide contact 1706. An optional AR coating 1730 can be deposited upon the glass substrate 1701 to minimize reflection losses 1722. The AR coating may consist of multiple layers composed of transparent and different refractive index materials.

Another embodiment of a MIS SoG solar cell device is disclosed in FIGS. 18A & 18B. The devices are fabricated in a similar fashion to the description of FIG. 17A, however, multiple lateral devices are shown interconnects via a common active layer contact 1707. The MIS repeating unit is laterally disposed across the SoG substrate on unit dimension 1810. The distance between the electrodes 1707 & 1707 is shown as 1820. The electrode dimensions and spacing are chosen to optimize the cell efficiency and is dependent upon the materials used. It is disclosed the active layer is continuously optically active and does not suffer dead layers due to opaque electrodes impeding the coupling of optical radiation into the active thin film 1703.

The multiple MIS SoG equivalent circuit is shown in FIG. 18B. Contacts 1707 can be grouped and connected together forming an electrode suitable for the extraction of photocurrent. Similarly, electrodes 1706 can also be connected together, thus forming multiple parallel connected MIS SoG devices. That is, grouped contacts 1706 and 1707 form an external two electrical terminal module composed of parallel interconnected MIS devices. Alternately, series connected devices can be fabricated via suitable electrical isolation of the thin film semiconductor.

An advantage of the MIS SoG devices as fabricated using the method of the present invention is the use of single crystal Si active layer thin film disposed upon alternative, or replacement, inexpensive substrates, such as amorphous and/or glass substrate. The MIS device can be optimized for preferentially utilising the high energy photons of the solar spectrum. The MIS structure is the simplest fabrication method for the formation of solar cell energy conversion devices. The present invention discloses a unique method and device type using single crystal semiconductor MIS structure using SoG substrate.

Example II

P-I-N Solar Cell Using SoG

Figure 19B:
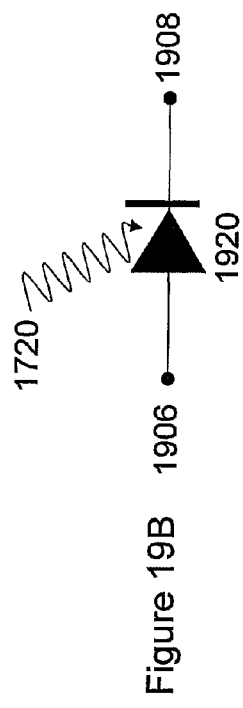
FIG. 19A is an example p-i-n SoG embodiment and FIG. 19B shows an equivalent circuit.
Figure 19A:
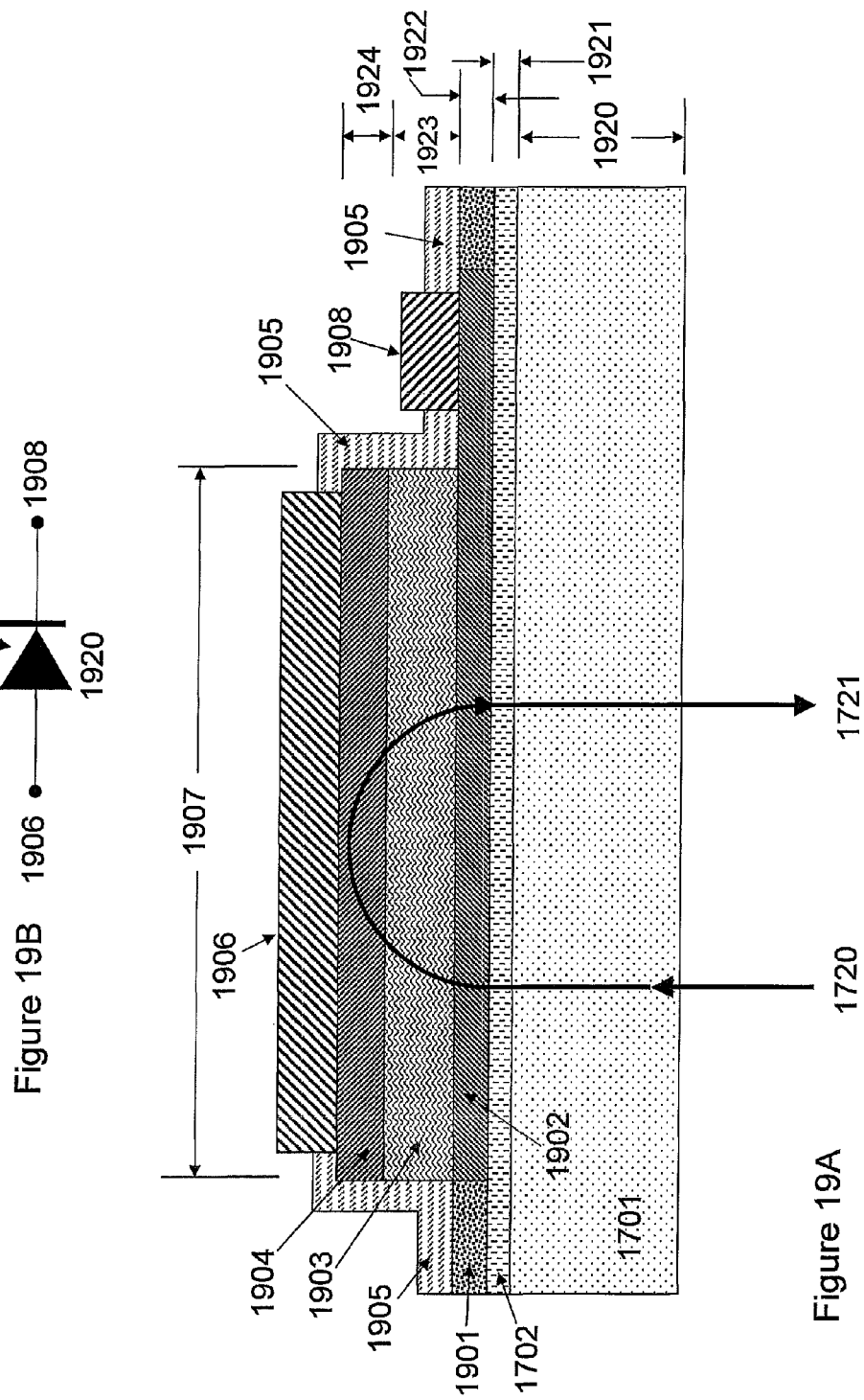

Another embodiment of the present invention is the use of multilayer semiconductor structures disposed upon the glass substrate. Another embodiment is the use of single crystal semiconductor layers to form the active regions. Yet another embodiment is the use of Si layers chosen from not-intentionally doped (i.e., substantially intrinsic, i), n-type (n) and p-type (p) doping. For solar energy conversion devices, layered Si devices of the form of p-n and p-i-n diodes are efficient optoelectronic conversion structures. An example p-i-n SoG embodiment is shown in FIG. 19A. The fabrication of the p-i-n SoG structure is possible using the methods disclosed in the present invention. It is understood that p-n junctions and more complex structures are also possible. The glass substrate 1701 is separated from the single crystal thin film semiconductor 1902 layer via a barrier layer 1702 according to the methods disclosed.

The p-i-n layer structure is composed of p-type Si (p:Si) 1902, intrinsic Si (i:Si) layer 1903, and n-type Si (n:Si) layer 1904. Layers 1903 and/or 1904 can be deposited upon an initial SoG article comprising n:Si on glass. Alternatively, the p-i-n structure can be initially deposited upon the single crystal p:Si substrate prior to wafer bonding and implant induced layer separation. Lateral oxidation of layer 1902 may be used for lateral electrical isolation of devices disposed across the SoG substrate via regions 1901. Passivation and/or environmental sealing of the Si epi-layers is via layer 1905 and may consist of SiO$_2$ and SiN$_x$. Electrical contacts formed by 1906 to the n-type layer 1904 and 1908 to p-type layer 1908 may not be the same composition. For, example, ohmic contacts to the different conductivity type layers may require different metals. The active area useful for photocurrent generation is defined by the i-layer width 1907 of thickness 1923. Optical radiation is coupled in from the glass substrate 1720 into the pin device. The contact 1906 defines a reflective surface that enables regeneration of photons such that another pass through the i-region may occur. This constitutes a 2-sun concentrator p-i-n solar cell fabricated in a SoG structure. The equivalent circuit is shown in FIG. 19B, and is represented by a p-i-n diode 1920.

Multiple lateral p-i-n devices can be fabricated across the SoG substrate as shown in FIG. 20A. Utility of the highly resistive glass substrate and/or barrier layer is for the purpose of electrical isolation via lateral oxidation and/or etching.

Regions 1901 electrically isolate devices formed on layer 1902. The metallization (M) and/or electrical contacts 2010 shows series interconnection of p-i-n device forming the string p-i-n-M-p-i-n-M-p-i-n . . . . Optical radiation incident 1720 upon the glass substrate 1701 is coupled through the transparent barrier layer 1702 into the i:Si 1903 layers and reflected off the contacts 2010, thereby forming the 2-sun concentrator structure. Passivation and/or environmental sealing of the p-i-n devices is via coating 2015. The equivalent circuit is shown in FIG. 20B where p-i-n devices 1920 are series connected. Photocurrent generated within each device flows through interconnects 2010 thereby forming two terminal external module.

Example III

Multi-Junction Wavelength Dependent Absorber Section Solar Cell Using SoG

The absorption co-efficient as function of wavelength for the thin film semiconductor layer can be used for selecting the thickness and wavelength region operation. In particular, Si exhibits a highly non-linear absorption character as a function of optical wavelengths. Referring to FIG. 16A, it can be seen $\alpha_{abs}(\lambda)$ in Si varies by almost five orders of magnitude in the range $350 \leq \lambda \leq 1127$ nm. Short wavelength photons are therefore absorbed in a very short distance compared to long wavelength photons in the vicinity of the indirect band gap $E_G$.

Silicon Tandem Cell Based on Selective Absorption

FIG. 22A discloses a stacked layer structure consisting of two p-i-n diodes comprising different intrinsic absorber thicknesses. In preference, the semiconductor is selected from single crystal Si and the substrate from alkaline-silicate glass. An example embodiment discloses a first p-i-n diode comprising p:Si layer 2204, i:Si layer 2205 and n:Si layer 2206. A second p-i-n diode formed upon the first diode comprising p:Si layer 2207, i:Si layer 2208, and n:Si layer 2209. This sequence forms the p-i-n-p-i-n stacked diode. Alternately, the sequence n-i-p-n-i-p can also be formed. Yet another embodiment uses the layer sequences p-i-n-i-p or n-i-p-i-n. Regardless, the NID i-regions are grown with different thickness, $L_S$ 2301 and $L_L$ 2311, such that the thinner region is positioned closest to the glass substrate. The electrical contact layers 2211 and 2212 are formed on the first and last layers comprising the stacked diodes. Incident short wavelength optical radiation $\lambda_S$ enters the glass substrate 2201 and is preferentially absorbed in the first thin i:Si layer 2205 and/or p-i-n diode. Similarly, long wavelength optical radiation $X_L$ enters the glass substrate 2202 and is preferentially absorbed in the second thick i:Si layer 2208 and/or p-i-n diode.

FIG. 22B shows the generation rate $G(\lambda, z)$ 2225 of electron-hole pairs as a function of vertical distance, z 2220, through the layered structure.

Short wavelengths in Si exhibit very large absorption coefficient (100 $\mu m^{-1}$ @ $\lambda_S$=400 nm) and thus the first i:Si region 2205 can be made thin ($L_L$~0.01 $\mu m$). Similarly, long wavelength photons co-incident with the band edge $E_G$ exhibit relatively low absorption co-efficient and thus can be made thick 0.01 $\mu m^{-1}$ @ $\lambda_S$=1000 nm, $L_{L\sim100}$ $\mu m$).

Figure 23:
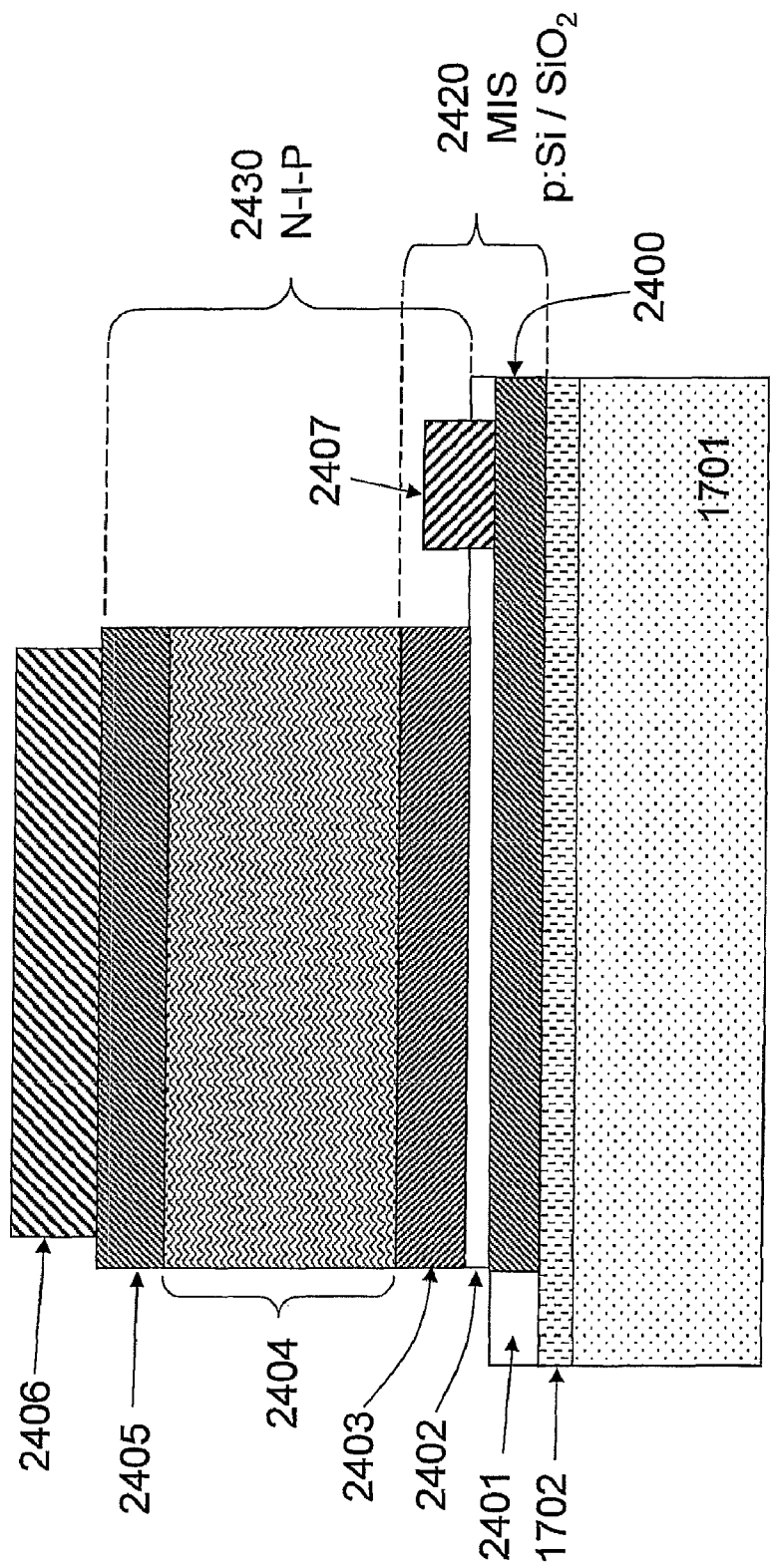
FIG. 23 discloses a MIS/PIN hybrid.

FIGS. 23A & 23B further show wavelength bands 2300 & 2310 used for, as an example, tandem Si: p-i-n-p-i-n solar cells. The theoretical efficiency of the proposed tandem cell is equivalent to a two-junction solar cell, and thus in excess of the SJ limit=25%. It is important to note that the disclosed two-junction device uses only Si semiconductor materials in the layer stack. This technique works particular well for Si compared to Ge due to the large non-linearity in absorption co-efficient of Si as a function of wavelength and advantageous overlap with the solar spectrum.

Silicon MIS/P-I-N Multi-Junction Cell

Figure 24:
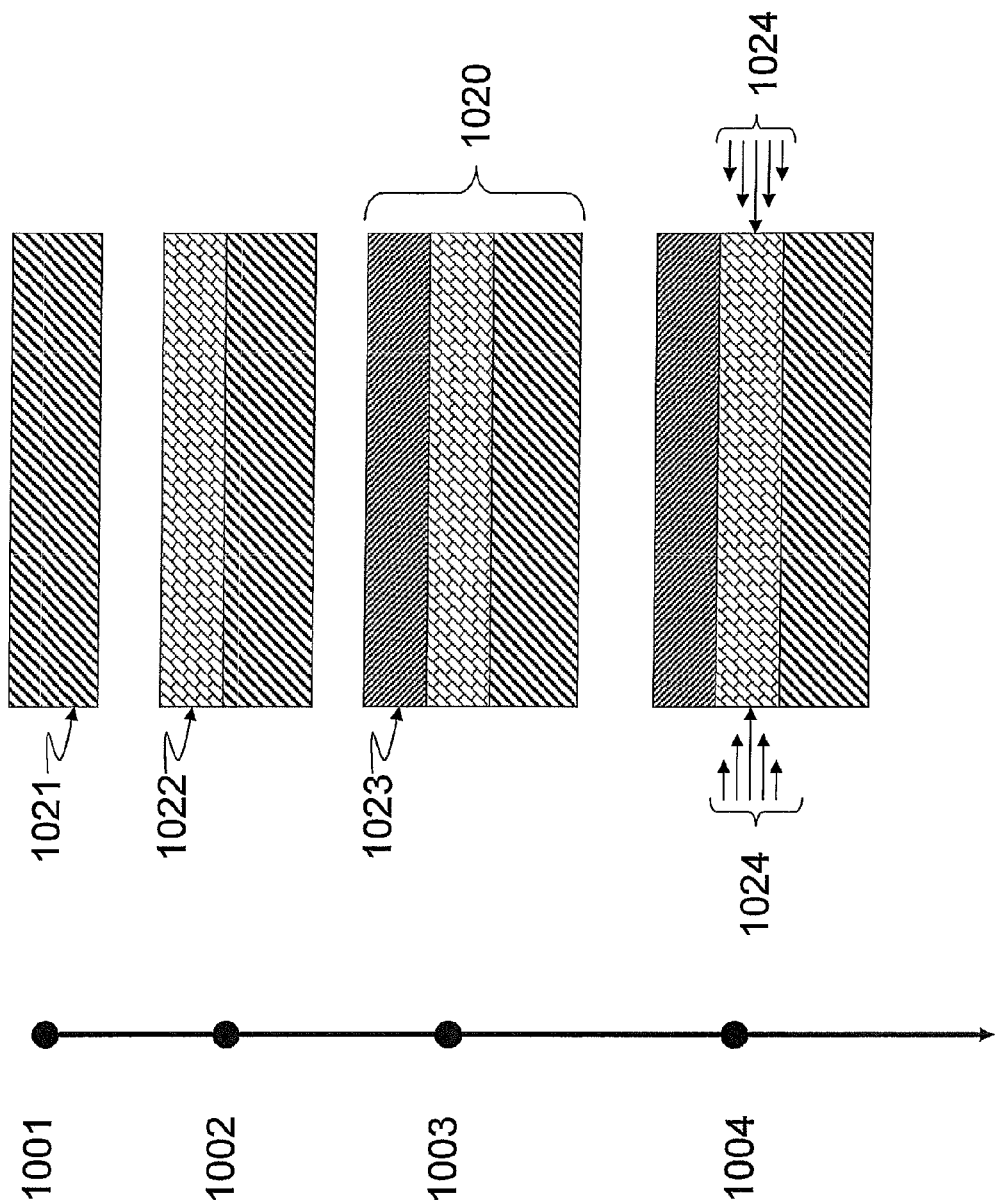
FIG. 24A: Process steps for epitaxial deposition of single crystal article containing thin film semiconductor and sacrificial layer.
FIG. 24B: Selective modification of sacrificial layer via lateral process.
FIG. 24C: Transformation of single crystal sacrificial layer via selective process.

Another embodiment utilises a hybrid device based on incorporating the advantageous features of MIS and PIN solar cell devices. FIG. 24 discloses a MIS/PIN hybrid wherein the MIS section 2420 is used as the short wavelength converter and the PIN device 2430 is used as the longer wavelength converter. In preference, the semiconductors forming the stacked layers are single crystal and/or polycrystalline and/or amorphous structure. The insulator 2402 layer may be chosen from amorphous $SiO_2$ and/or single crystal rare-earth based materials, such as rare-earth oxide and oxynitride ($REO_x$ or $REO_xN_y$). If insulator 2402 is amorphous then thin film semiconductor layer 2400 may be chosen from polycrystalline and/or amorphous structures using the wafer bonding technique disclosed herein. Alternately, multiple wafer bonding steps may be used to form single crystal layers 2400, 2403, 2402 and 2405 prior to lamination with glass substrate 1701. If the insulator 2402 is chosen from substantially single crystal compositions (e.g.; rare-earth oxide and like), then epitaxial Si may be deposited directly upon 1402, thereby forming a single crystal epitaxial growth sequence according to the method disclosed in the present invention.

Referring to FIG. 24, an example embodiment of the MIS/PIN hybrid is via the following layer sequence: alkali silicate glass substrate 1701; alkali barrier layer 1702; a first semiconductor layer p:Si 2400; a insulator layer 2402; a n:Si layer 2403; a NID i:Si layer 2404; and a p:Si layer 2405. Electrodes 2406 and 2407 may be metallization to contact layers 2405 and 2400, respectively. The layer sequence forms a MIS diode with silicon contact layer to the insulator. In fact, the p:Si/$SiO_2$/n:Si stack (i.e.; 2400/2402/2403) forms an inversion channel MOS structure suitable for high energy photon solar energy conversion. The following NIP (n:Si/i:Si/p:Si) structure is formed via the layer sequence 2403/2404/2405. The intrinsic layer 2404 thickness is chosen to advantageous absorb a portion of the solar spectrum that has not been depleted by the MIS device.

Solar optical radiation is incident upon the glass substrate 1701 and is coupled into the MIS/PIN hybrid via an optional transparent barrier layer 1702.

The MIS device is preferentially made with a thin insulator 1402 ($5 \leq L_{OX} \leq 500$ Angstroms) so as to allow tunneling of photo-created carriers in the active layer 2400. Referring to FIG. 2B, the possibility UV generated hot electron injection from the CB and/or VB of Si into the CB of the insulator may also occur. Electrode 2406 can also be engineered to function as a back reflector allowing long wavelength radiation not absorbed by the MIS section to be recycled back through the device.

Therefore, the MIS/PIN hybrid solar cell fabricated on SoG also form a two-junction and 2-sun solar concentrating device.

The present invention discloses a new manufacturing method of forming thin film and single crystal semiconductor layer(s) disposed upon glass substrates. Furthermore, a method using alkali barrier layers is disclosed in order for low cost alkali-silicate glass to be used. New solar cell structures on glass or other inexpensive substrates are enabled by the disclosed methods. As used herein, alternatives to glass substrates may be used wherever glass has been given as an example; alternatives to glass include, but are not limited to, plastics, including polyimide and Kapton, flexible plastics, insulative coated metal, ceramic, recycled silicon wafers, silicon ribbon, poly-silicon wafers or substrates and other low cost substrates known to one knowledgeable in the art.

Multilayer thin film semiconductor devices are disclosed utilizing the unique aspect of single crystal thin film semiconductor disposed upon transparent and/or glass substrate.

Solar energy conversion devices disclosed using the thin film semiconductor SoG article are: (i) single absorber MIS, PIN devices; (ii) dual absorber PINIP, NIPIP, PINPIN, MIS/PIN hybrid.

A unique aspect of disclosed solar cell devices is the recycling of photons that have not been absorbed in a first pass through the device via a reflective back electrode. This constitutes a 2-sun concentrator structure, enabling increased efficiency beyond the single junction limit.

Yet another unique aspect of disclosed solar cell devices is the preferential use of the non-linear absorption of silicon as a function of wavelength in order to construct dual wavelength solar cell. This constitutes a 2-junction device structure, enabling increased efficiency beyond a single junction limit.

In one embodiment a device for converting radiation to electrical energy comprises an active layer for the converting radiation to electrical energy, a barrier layer and, optionally, a replacement substrate, optionally with electrodes connecting to the active layer, wherein the active layer, optionally, comprises one or more different rare-earth ions and the barrier layer comprises at least one rare earth and separates the active layer and the replacement substrate.

In one embodiment a device for converting radiation to electrical energy comprises an active layer for the converting radiation to electrical energy; and a replacement substrate transparent to a majority, at least 50%, of the radiation for converting.

In one embodiment a device for converting radiation to electrical energy comprises, optionally, a replacement substrate; and an active layer for the converting radiation to electrical energy comprising at least one lateral p-n junction.

In one embodiment a device for converting radiation to electrical energy comprises, optionally, a replacement substrate optionally comprising an electrical connection to the active layer; and an active layer for the converting radiation to electrical energy comprising at least one lateral p-n junction, wherein the active layer comprises one or more different rare-earth ions and a barrier layer comprising at least one rare earth compound separating the active layer and the replacement substrate.

In one embodiment a device for converting radiation to electrical energy comprises, optionally, a replacement substrate optionally comprising an electrical contact to the active layer; and an active layer for the converting radiation to electrical energy comprising at least two lateral p-n-p junctions and a barrier layer comprising at least one rare earth separating the active layer and the replacement substrate.

In one embodiment a device for converting radiation to electrical energy comprises, optionally, a replacement substrate; an active layer for the converting radiation to electrical energy comprising at least one lateral p-n junctions; and multiple p+ contacts to the active layer.

In one embodiment a device for converting radiation to electrical energy comprises, optionally, a replacement substrate; an active layer for the converting radiation to electrical energy comprising at least one lateral p-n junction with multiple p+ contacts to the active layer and a barrier layer comprising at least one rare earth separating the active layer and the replacement substrate.

In one embodiment a device for converting radiation to electrical energy comprises, optionally, a replacement substrate; an active layer for the converting radiation to electrical energy comprising at least one vertical p-i-n structure; optionally the active layer comprises one or more rare-earth ions and a barrier layer comprising at least one rare earth separating the active layer and the replacement substrate.

A device for converting radiation to electrical energy comprises, optionally, a replacement substrate; an active layer for the converting radiation to electrical energy comprising at least one lateral p-i-n structure; optionally, the active layer comprises one or more rare-earth ions and a barrier layer comprising at least one rare earth separating the active layer and the replacement substrate.

An integrated device for converting radiation to electrical energy comprises a replacement substrate; one or more active layers for the converting radiation to electrical energy comprising multiple devices interconnected such that there are a plurality of devices for supplying a voltage interconnected; and a plurality of devices for supplying a current interconnected; optionally, the active layer comprises one or more different rare-earth ions and a barrier layer comprising at least one rare earth separating the active layer and the replacement substrate.

In one embodiment a device for converting radiation to electrical energy comprises a first portion of a first conductivity type at a first level of doping; a second portion of first conductivity type at a second level of doping less than the first, wherein a first drift voltage is imposed across the second portion; a third portion of first conductivity type at about the first level of doping; a fourth portion of first conductivity type at about the second level of doping, wherein a second drift voltage is imposed across the fourth portion; a fifth portion of second conductivity type at a third level of doping; such that the second portion is a drift region and the fourth portion is an avalanche region and electrons undergo avalanche multiplication in the avalanche region based upon the first drift voltage imposed across the second portion and the second drift voltage imposed across the fourth portion; a replacement substrate; optionally at least one portion comprises one or more rare-earth ions; alternatively, the first and second drift voltages are set as a function of the energy of said radiation being converted; alternatively, at least said second and fourth portions comprise a semiconductor material comprising an indirect bandgap and a barrier layer comprising at least one rare earth separating the active layer and the replacement substrate.

In one embodiment a device for converting radiation to electrical energy comprises a first portion of a first conductivity type at a first level of doping; a second portion of first conductivity type at a second level of doping less than the first, wherein a drift voltage is imposed across the second portion; a third portion of second conductivity type at a third level of doping; such that the second portion is a drift and avalanche region wherein electrons undergo avalanche multiplication based upon the drift voltage imposed across the second portion; alternatively, at least said second portion comprises a semiconductor material comprising an indirect bandgap; optionally, at least one portion comprises one or more rare-earth ions; optionally said drift voltage is set as a function of the energy of said radiation being converted; in some embodiments, at least about 50% of said electrical energy is converted from radiation of wavelength 400 nm and shorter and a barrier layer comprising at least one rare earth separating the active layer and the replacement substrate.

A method for producing a thin film comprises the steps of providing a first substrate having a first surface and comprising a predetermined level of a first reactant therein; introducing ions of a second reactant into the first surface, such that the ions are distributed about a predetermined fracture depth; bonding a second, or replacement, substrate to the first surface of the first substrate; and heating the first and second substrates to a temperature sufficient for the first and second reactants to combine; optionally, applying mechanical forces to separate the first and second substrates about the fracture depth or fracture zone after said heating; in some embodiments the first and second reactants are chosen from a group comprising hydrogen, oxygen, nitrogen, carbon, fluorine, helium and silicon wherein, optionally, a barrier layer comprising at least one rare earth separates the first and second substrates.

A method for producing a thin film comprises the steps of providing a first substrate having a first surface; introducing ions of a first and second reactant into the first surface, such that the ions are distributed about a predetermined fracture depth; bonding a second, or replacement, substrate to the first surface of the first substrate; and heating the first and second substrates to a temperature sufficient for the first and second reactants to combine; optionally, applying mechanical forces to separate the first and second substrates about the fracture depth after said heating; in some embodiments an ion-exchange process is used for introducing said first and second reactant ions wherein a barrier layer comprising at least one rare earth separates the first and second substrates.

In one embodiment a device for converting radiation to electrical energy comprises, optionally, a replacement substrate; one or more layers of a large band gap material; and one or more layers of a small band gap material for converting radiation to electrical energy, such that a layer of the large band gap material are contacting a layer of the small band gap material; and the large band gap material chosen from a group comprising rare-earth oxide ($RE_xO_z$), rare-earth germanium oxide ($RE_xGe_yO_z$), rare-earth silicon oxide ($RE_xSi_yO_z$), rare-earth-silicon-oxide-phosphide ($RE_xSi_yO_zP_w$), rare-earth-silicon-oxide-nitride ($RE_xSi_yO_zN_w$), rare-earth-silicon-oxide-nitride-phosphide ($RE_xSi_yO_zN_wP_q$) wherein X, Z>0 and Y, W. Q are $\geq 0$; and a barrier layer comprising at least one rare earth separating the active layer and the replacement substrate.

In one embodiment a device for converting radiation to electrical energy comprises, optionally, a replacement substrate; one or more layers of a large band gap material; and one or more layers of a small band gap material for converting radiation to electrical energy, such that the one or more layers of the large band gap material are contacting a layer of the small band gap material; and the large band gap material chosen from rare-earth germanium oxide ($RE_xGe_yO_z$) and a barrier layer comprising at least one rare earth separating the active layer and an optional replacement substrate.

In one embodiment a device for converting radiation to electrical energy comprises a substrate; one or more layers of a large band gap material; and one or more layers of a small band gap material for converting radiation to electrical energy, such that the one or more layers of the large band gap material are contacting a layer of the small band gap material; and the large band gap material chosen from rare-earth silicon oxide ($RE_xSi_yO_z$) and a barrier layer comprising at least one rare earth separating the active layer and the replacement substrate.

In one embodiment a device for converting radiation to electrical energy comprises, optionally, a replacement substrate; one or more layers of a large band gap material; and one or more layers of a small band gap material for converting radiation to electrical energy, such that the one or more layers of the large band gap material are contacting a layer of the small band gap material; and the large band gap material chosen from rare-earth-silicon-oxide-phosphide ($RE_xSi_yO_zP_w$) and a barrier layer comprising at least one rare earth separating the active layer and an optional replacement substrate.

In one embodiment a device for converting radiation to electrical energy comprises, optionally, a replacement substrate; one or more layers of a large band gap material; and one or more layers of a small band gap material for converting radiation to electrical energy, such that the one or more layers of the large band gap material are contacting a layer of the small band gap material; and the large band gap material chosen from rare-earth-silicon-oxide-nitride ($RE_xSi_yO_zN_w$) and a barrier layer comprising at least one rare earth separating the active layer and the replacement substrate.

In one embodiment a device for converting radiation to electrical energy comprises, optionally, a replacement substrate; one or more layers of a large band gap material; and one or more layers of a small band gap material for converting radiation to electrical energy, such that the one or more layers of the large band gap material are contacting a layer of the small band gap material; and the large band gap material chosen from rare-earth-silicon-oxide-nitride-phosphide ($RE_xSi_yO_zN_wP_q$) and a barrier layer comprising at least one rare earth separating the active layer and the replacement substrate.

In one embodiment a device for converting radiation to electrical energy comprises, optionally, a replacement substrate; one or more layers of a large band gap material; and one or more layers of a small band gap material for converting radiation to electrical energy, such that the one or more layers of the large band gap material are contacting a layer of the small band gap material; and the small band gap material chosen from a group comprising rare-earth-silicon ($RE_xSi_y$), rare-earth-germanium ($RE_xGe_y$), rare-earth-phosphide ($RE_xP_y$), rare-earth-nitride ($RE_xN_y$) such that the small band gap is less than about 3 eV and, optionally, a barrier layer comprising at least one rare earth separating the active layer and an optional replacement substrate. In alternative embodiments a small band gap may be less than about 2.5 eV; optionally, a small band gap may be less than about 2.0 eV; optionally, a small band gap may be less than about 1.5 eV; optionally, a small band gap may be less than about 1.0 eV.

In one embodiment a device for converting radiation to electrical energy comprises, optionally, a replacement substrate; one or more layers of a large band gap material; and one or more layers of a small band gap material for converting radiation to electrical energy, such that the one or more layers of the large band gap material are contacting a layer of the small band gap material; and the small band gap material chosen from rare-earth-germanium ($RE_xGe_y$) and a barrier layer comprising at least one rare earth separating the active layer and the replacement substrate.

In one embodiment a device for converting radiation to electrical energy comprises, optionally, a replacement substrate; one or more layers of a large band gap material; and one or more layers of a small band gap material for converting radiation to electrical energy, such that the one or more layers of the large band gap material are contacting a layer of the small band gap material; and the narrow band gap material chosen from rare-earth-phosphide ($RE_xP_y$) and a barrier layer comprising at least one rare earth separating the active layer and the replacement substrate.

In one embodiment a device for converting radiation to electrical energy comprises, optionally, a replacement substrate; one or more layers of a large band gap material; and one or more layers of a small band gap material for converting radiation to electrical energy, such that the one or more layers of the large band gap material are contacting a layer of the small band gap material; and the narrow band gap material chosen from rare-earth-nitride ($RE_xN_y$) and a barrier layer comprising at least one rare earth separating the active layer and the replacement substrate.

As used herein a replacement or alternative substrate is optionally a substrate chosen from a group comprising glass, float glass, quartz, alkali-silicate glass, plastics, including polyimide and Kapton, flexible plastics, insulative coated metal, ceramic, recycled silicon wafers, silicon ribbon, polysilicon wafers or substrates and other low cost substrates known to one knowledgeable in the art. A replacement substrate takes the place of an original substrate after the fabrication of an active layer upon an original substrate; by means of a "layer transfer process" an active layer is transferred from an original substrate to a replacement substrate; additional processing may be performed after the transfer to complete device fabrication.

As used herein an active layer comprises one or more layers of semiconducting, insulative and/or metallic materials sufficient to enable a solar cell or other thin film solid state device as disclosed herein. An "active layer" is fabricated originally on a substrate different than a replacement substrate; an active layer is transferred to a replacement substrate by a method disclosed herein or by reference disclosed herein or by techniques known to one knowledgeable in the art.

In one embodiment a device for converting radiation to electrical energy comprises at least one single crystal Si thin film layer and one layer comprising a rare-earth in an active region and one layer comprising a rare-earth in a barrier layer.

In one embodiment a device for converting radiation to electrical energy comprises a MIS device on SoG.

In one embodiment a device for converting radiation to electrical energy comprises a PIN device on SoG; alternatively a PINPIN dual diode on SoG using different thickness i-regions to efficiently absorb different portions of the solar spectrum is a device for converting radiation to electrical energy; alternatively, a MIS/PIN hybrid device on SoG is a device for converting radiation to electrical energy; alternatively, a SoG device with a barrier layer may be combined with one or more sun concentrators.

In some embodiments a semiconductor device comprises a substrate, one or more layers of a semiconductor device and a barrier layer comprising one or more layers wherein at least one is chosen from a group comprising rare-earth sesquioxide (RE2O3), rare-earth dioxide (REO2), rare-earth monoxide (REO), rare-earth nitride (REN), rare-earth oxynitride (REOxNy), rare-earth phosphide (REP), rare-earth oxyphosphide (REOxPy), rare-earth carbide (RECy), rare-earth oxycarbide (REOxCy), aluminium rare-earth oxide (RExAlyOw), rare-earth aluminosilicate (RExAlySizOw), rare-earth ternaries, such as, SiErN, SiErP, GeLAN, GeLaP, SiGeErn, SiGeErP, aluminium oxide (Al2O3), silicon nitride (SiNx), (SixAlyNz), Hf-oxide and HfON, Zr-oxide and ZrON, MgO and combinations thereof; in some embodiments a barrier layer and/or substrate may undergo a surface treatment such as a surface treatment of $Al_2O_3$ via nitridation, forming AlN interlayer, chlorination, phosphorization, and/or treatment with a boron compound.

Sacrificial Layer Separation Technique

The present invention teaches the use of direct epitaxial method of forming single crystal thin film semiconductor layer upon a single crystal sacrificial layer, deposited also upon a single crystal semiconductor substrate (called the parent substrate). The thin film semiconductor layer and sacrificial layer(s) are chemically dissimilar. The use of a selective layer removal and/or structural modification process enables physical separation of the thin film layer from the parent substrate.

This thin film layer separation technique may be coupled with the use of an alternative substrate so that the thin film can be removed in conjunction with the alternative substrate and thus form the SoG article.

FIG. 24A discloses process steps 1001 through 1009, required for the formation of thin film layer upon sacrificial layer and subsequent separation. First, the parent substrate 1021 is cleaned and prepared for epitaxy. In one embodiment the substrate 1021 is chosen from single crystal silicon with (100)-, (111)- or (110)-oriented surface. Next, a substantially single crystal sacrificial epitaxial layer 1022 is deposited with predetermined thickness; thickness may range from 10 nm to 10 microns depending upon composition and process parameters. The thin film semiconductor layer 1023 is directly deposited upon the sacrificial layer 1022. The thin film semiconductor layer is also substantially single crystal and uniform in thickness. In one embodiment, the sacrificial layer is chosen from a rare-earth based compound of the form $RE_xO_yN_zP_w$; $0 \leq y, z, w \leq 5$, $0 < x \leq 5$. A thin film semiconductor layer is chosen from silicon, germanium or silicon-germanium alloy; Alternatively, a thin film semiconductor layer is chosen from Group IV, Group III-V, or Group II-VI materials or combinations thereof. Alternatively, a semiconductor substrate, primary or secondary is chosen from Group IV, Group III-V, or Group II-VI materials or combinations thereof.

Figure 24B:
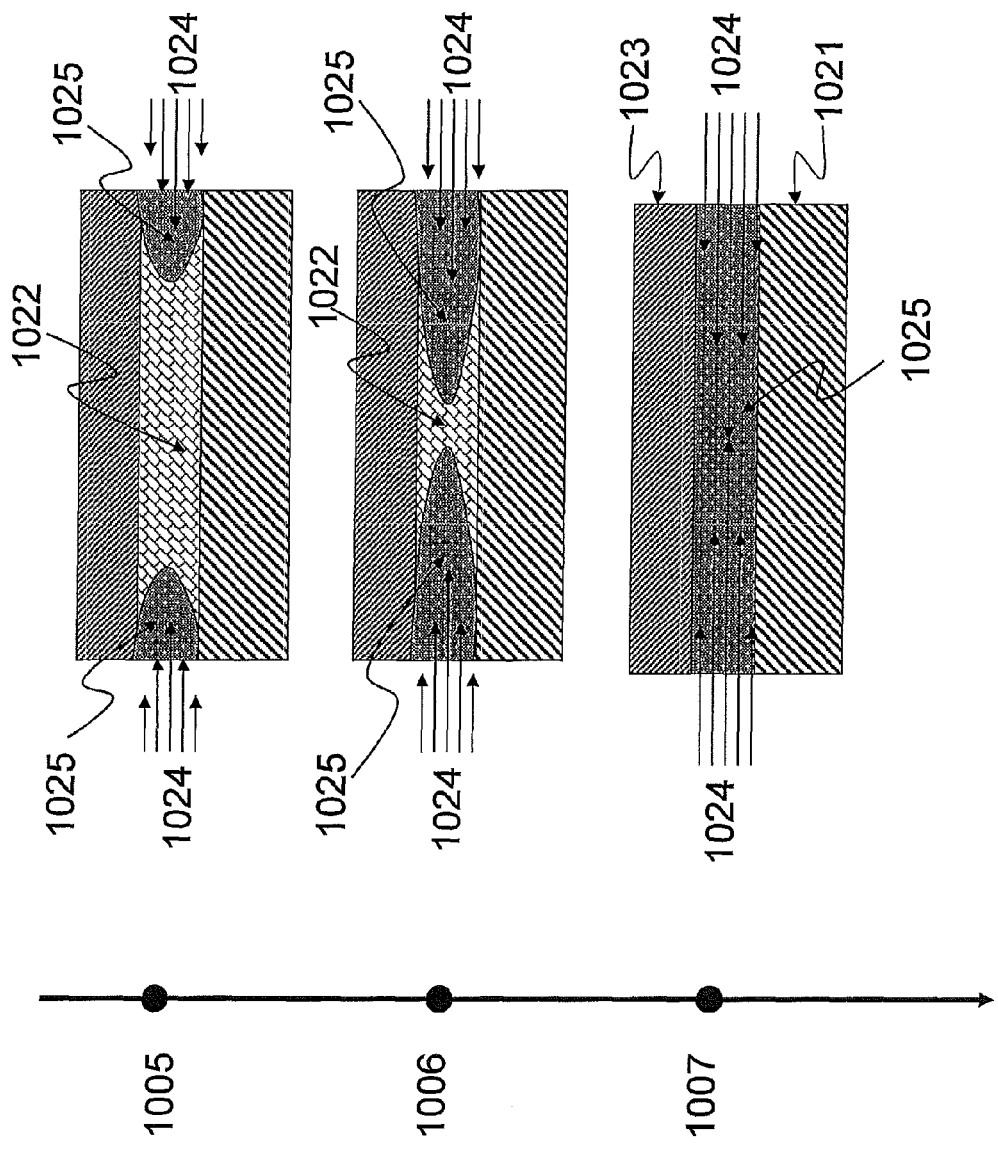

The completed composite single crystal article 1020 is then subjected to selective layer process 1024. FIG. 24B, Step 1005 schematically shows the structural and/or chemical modification of selective process 1024 on the sacrificial layer 1022. The region 1025 depicts the selective modification of layer 1022 into new form 1025. The lateral transport and/or diffusion and/or reaction of process 1024 results in region 1025 extending into the interior of the composite article confined in a region occupied by the initial layer 1022.

Figure 24C:
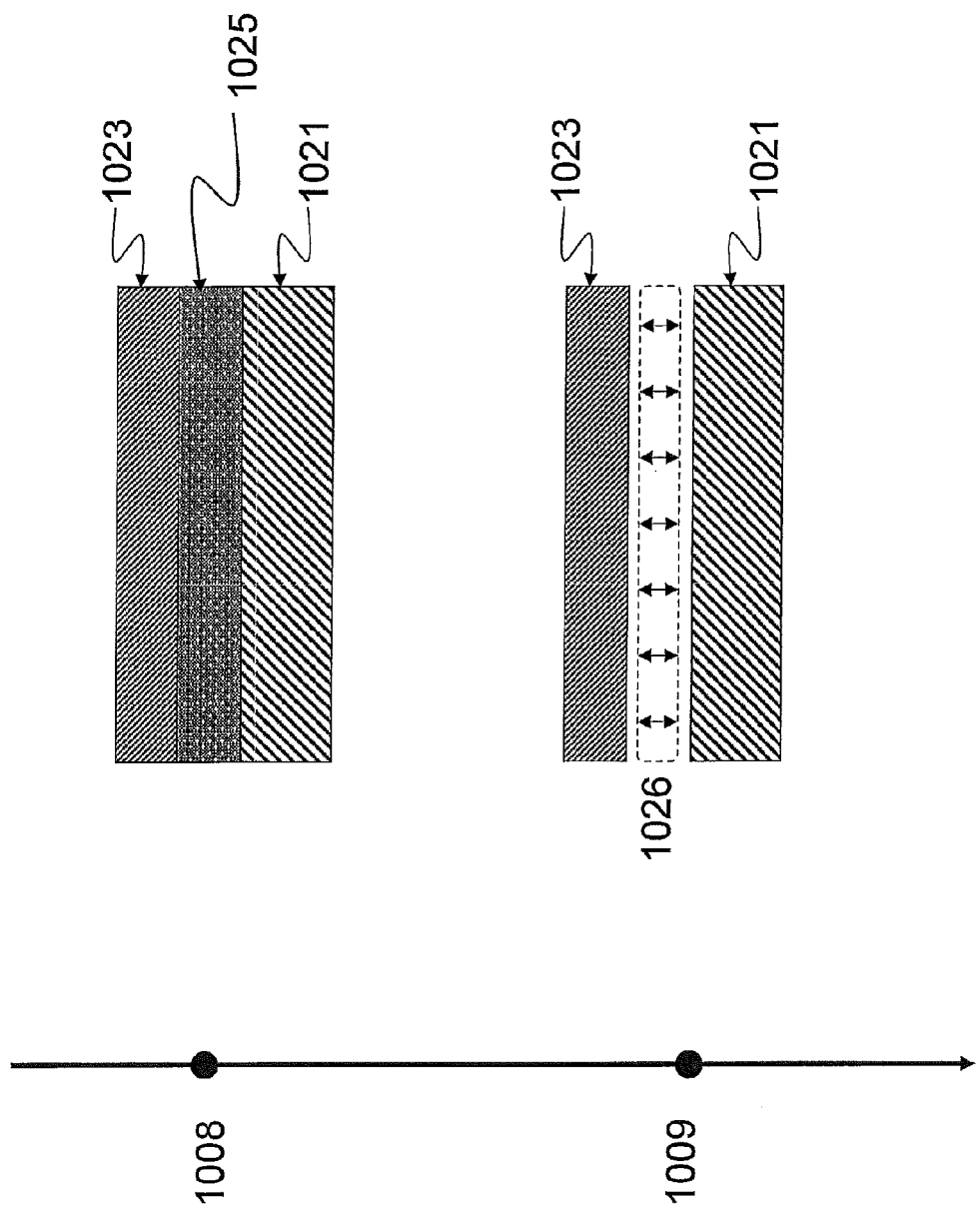

The lateral selective modification of the sacrificial layer 1022 is continued until the entirety of layer 1022 is modified, thereby forming new uniform layer 1025. The parent substrate and thin film semiconductor layer are substantially unaffected by process 1024. FIG. 24C depicts the removal of layer 1022 and 1025 such that the thin film layer 1023 is physically separated 1026 from the parent substrate 1021.

The result of process 1024 on layer 1022 may consume the constituent atoms comprising layer 1022 and be removed during processing. Alternately, layer 1022 may undergo a structural phase change due to process 1024, for example transform from single crystal structure to amorphous or porous or nanocrystalline or microcrystalline or powder form. Another selective removal process may be required to remove resultant layer or form 1025.

The utility of the aforementioned method is via parallel processing of thin film article with an alternative substrate prior to thin film layer separation.

FIGS. 25A, 25B, 25C and 3 disclose schematic processing steps required for the formation of thin film semiconductor on alternative substrate.

First, the single crystal thin film 2023 and sacrificial layer 2022 are deposited via direct epitaxy on parent substrate 2021. An optional interfacial bonding layer (IBL) 2024 with surface 2025 suitable for bonding to alternative substrate may be also deposited. The IBL does not need to be single crystal and can be deposited ex-situ prior to wafer bonding to alternative substrate 2027. The alternative substrate 2027 is cleaned and prepared 2005 with bonding surface 2026 optionally coated with layer 2028. Optionally, the alternative substrate coated with layer 2028 may result in predetermined warpage of substrate 2027. Step 2007 shows convex surface bowing due to predetermined film stress 2028 or concave warpage in 2008. If alternative substrate is geometrically modified by layer 2028, then surface 2032 or 2033 is used for intimate contact with final exposed surface of 2023 or 2024.

For clarity, the following process steps are described without alternative substrate geometry modification.

Figure 25A:
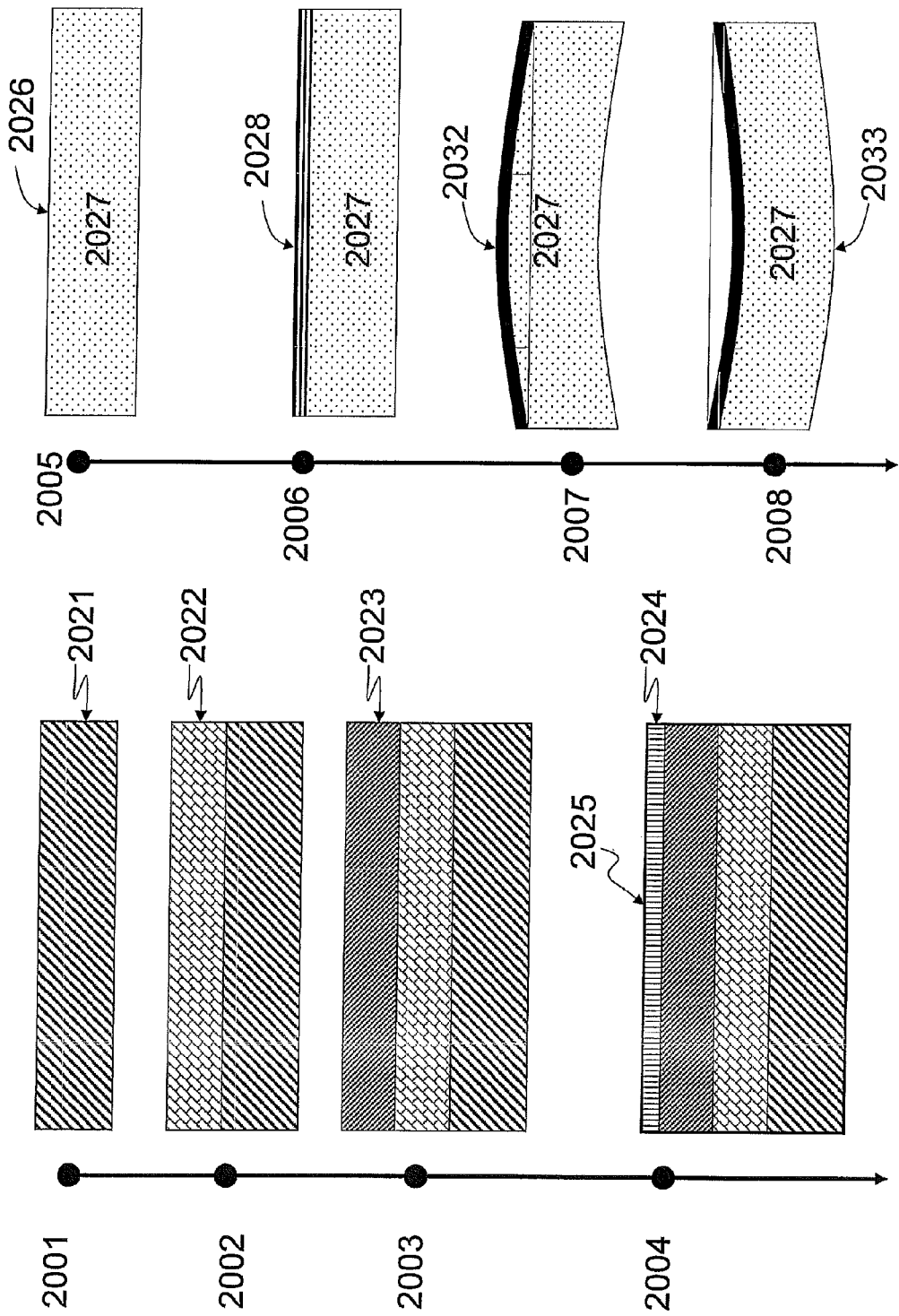
FIG. 25A: Process of forming single crystal article comprising thin film semiconductor and sacrificial layer. Parallel process of preparing alternative substrate for wafer bonding to exposed thin film semiconductor or interfacial bonding layer surface.
Figure 25B:
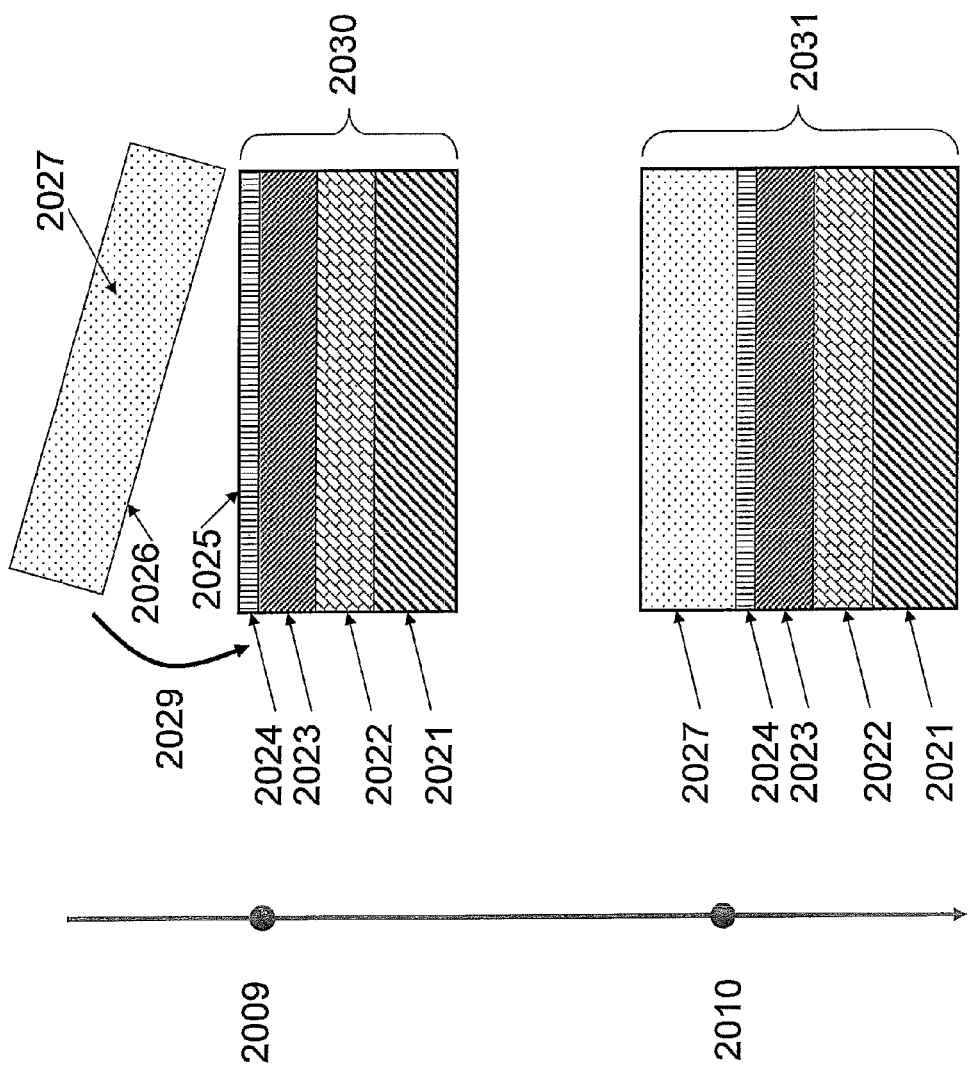
FIG. 25B: Process steps of wafer bonding alternative substrate to single crystal article.

FIG. 25B schematically describes the physical joining 2029 and subsequent bonding of surfaces 2026 and 2025 forming composite article 2031 comprising parent substrate 2021, sacrificial layer 2022, thin film semiconductor layer 2023, IBL 2024 and alternative substrate 2027. The wafer bonding process is performed such that the surfaces 2025 and 2026 when in contact are free from contamination, particulate and voids, forming a well defined and homogeneous interface.

Figure 25C:
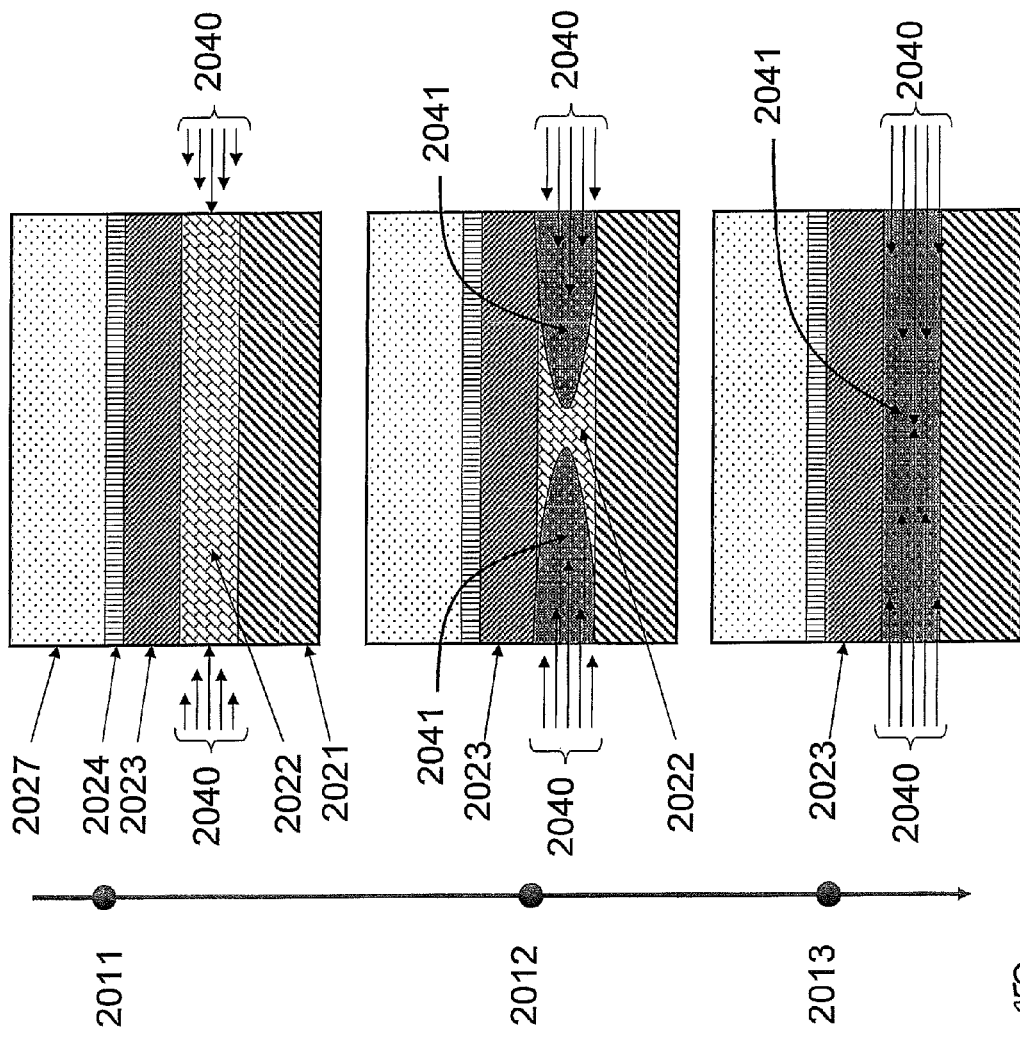
FIG. 25C: Process steps showing selective lateral modification of sacrificial layer contained in composite article.

FIG. 25C schematically described the selective and lateral modification of the sacrificial layer 2022 by process 2040. The initial process 2011 is continued until the sacrificial layer is consumed and/or modified in entirety. The lateral process completing at the center of the composite article, thereby forming uniform region 2041 in step 2013. Other than the sacrificial layer 2022, all other layers and substrate are substantially unaffected by process 2040.

Figure 26:
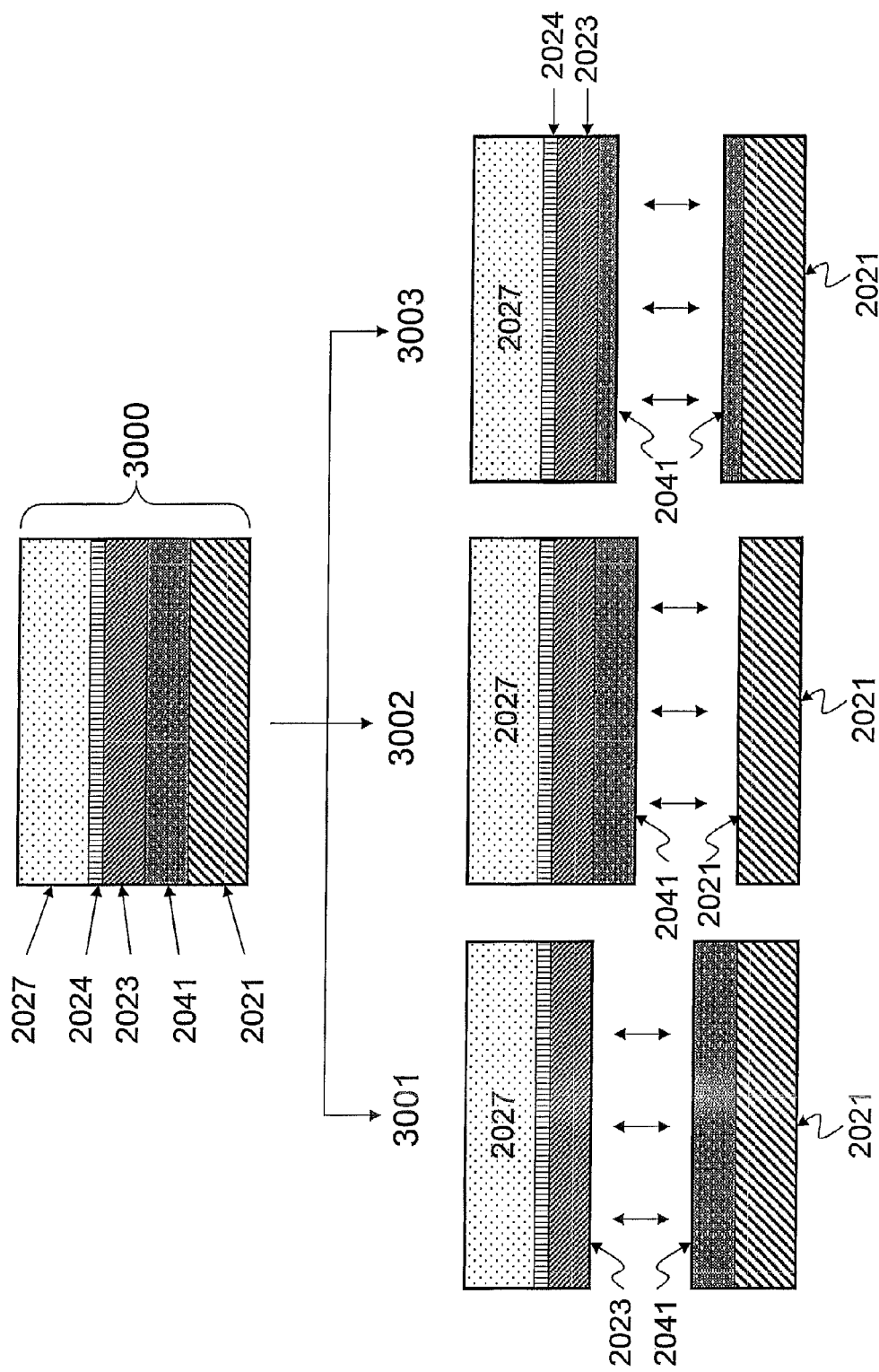
FIG. 26: Process paths for thin film semiconductor layer separation by action of sacrificial layer in composite article.

FIG. 26 schematically describes the possible layer separation paths. The selective layer modification of 2022 into 2041 results in composite article 3000. Process 2040 or by the action of subsequent mechanical or chemical or reactive process provides a physical separation of the thin film semiconductor layer 2023 from the parent substrate 2021. The thin film semiconductor layer is bonded to alternative substrate. In one embodiment, thin film semiconductor layer 2023 is chosen from single crystal silicon, germanium or silicon-germanium alloy; in alternative embodiments a substrate may be chosen from a group comprising sapphire, silicon carbide, III-V compounds, and II-VI compounds. The parent substrate 2021 is chosen from single crystal silicon substrate. The alternative substrate is chosen from amorphous material such as glass, Pyrex™, metal foil, metal substrate and/or flexible substrate. Process paths 3001, 3002 and 3003 all result in thin film semiconductor on alternate substrate 2027. Process path 3001 shows residual sacrificial layer 2041 can be substantially, completely separated from thin film semiconductor layer 2023 upon physical separation. Alternately, a portion of layer 2041 remains in contact with the surface of layer 2023, as shown in process path 3002.

Figure 27:
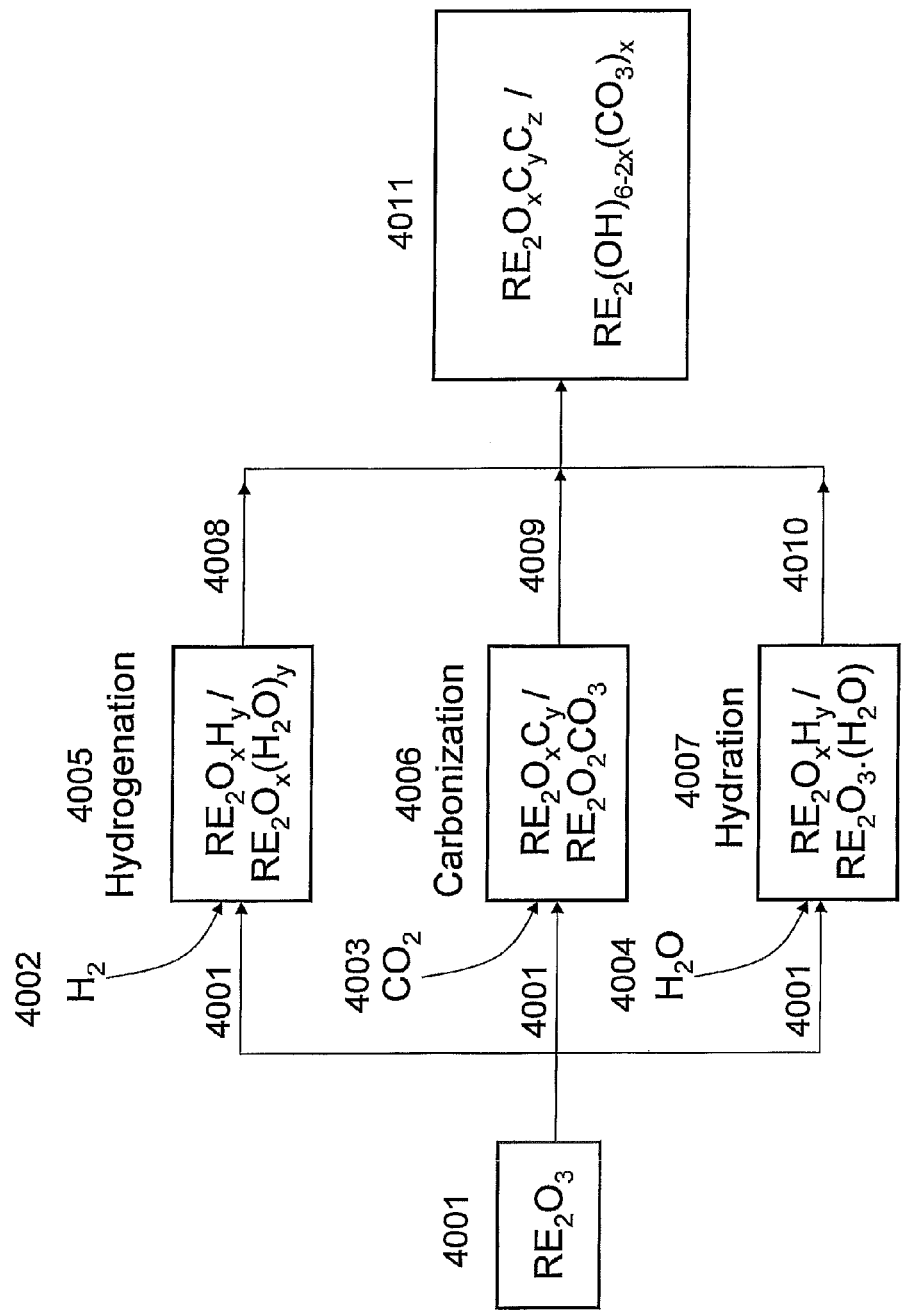
FIG. 27: Chemical processes for modifying crystal structure of single crystal rare-earth oxide by means of hydrogenation, carbonization and hydration.

FIG. 27 discloses an embodiment for sacrificial layer composition and the possible selective process reactions for modification of the composition and crystallographic structure. The sacrificial layer is composed of rare-earth oxide ($RE_2O_3$ or $REO_2$ or generally $RE_yO_x$, where $0<x, y\leq5$) and can be deposited in single crystal form on silicon or other substrates.

By way of example, and not limited to, rare-earth oxide crystals readily undergo chemical reaction with hydrogen, water and carbon-dioxide. Other reactions are also possible and are incorporated herein.

For example, single crystal rare-earth oxide can be hydrated 4007 by immersion of $REO_x$ 4001 in water $H_2O_{(l)}$ and/or reacted with steam $H_2O_{(g)}$ 4004. Typically, single crystal $REO_x$, $x\approx1.5$, reacts with water to form hydrated clusters $RE_2O_x(H_2O)_y$ thereby destroying the single crystal structure.

Other reactions such as hydrogenation 4005 and carbonization 4006 are possible with reactant products shown. Hydrogenation 4005 by reacting $REO_x$ 4001 with $H_{2(g)}$ 4002 forms rare-earth hydroxyl compounds. Carbonization occurs by reacting $REO_x$ with gaseous carbon, forming rare-earth carbide or oxy-carbide compounds.

The processes of hydration 4007, hydrogenation 4005 and carbonization 4006 of single crystal rare-earth oxide 4001 results in morphological change in structure. For example, single crystal REOx can be transformed into amorphous or polycrystalline granules with increase in volume. This process is advantageous for cleaving of composite article 3000 into at least one of process paths 3001, 3002, and 3003.

Figure 28:
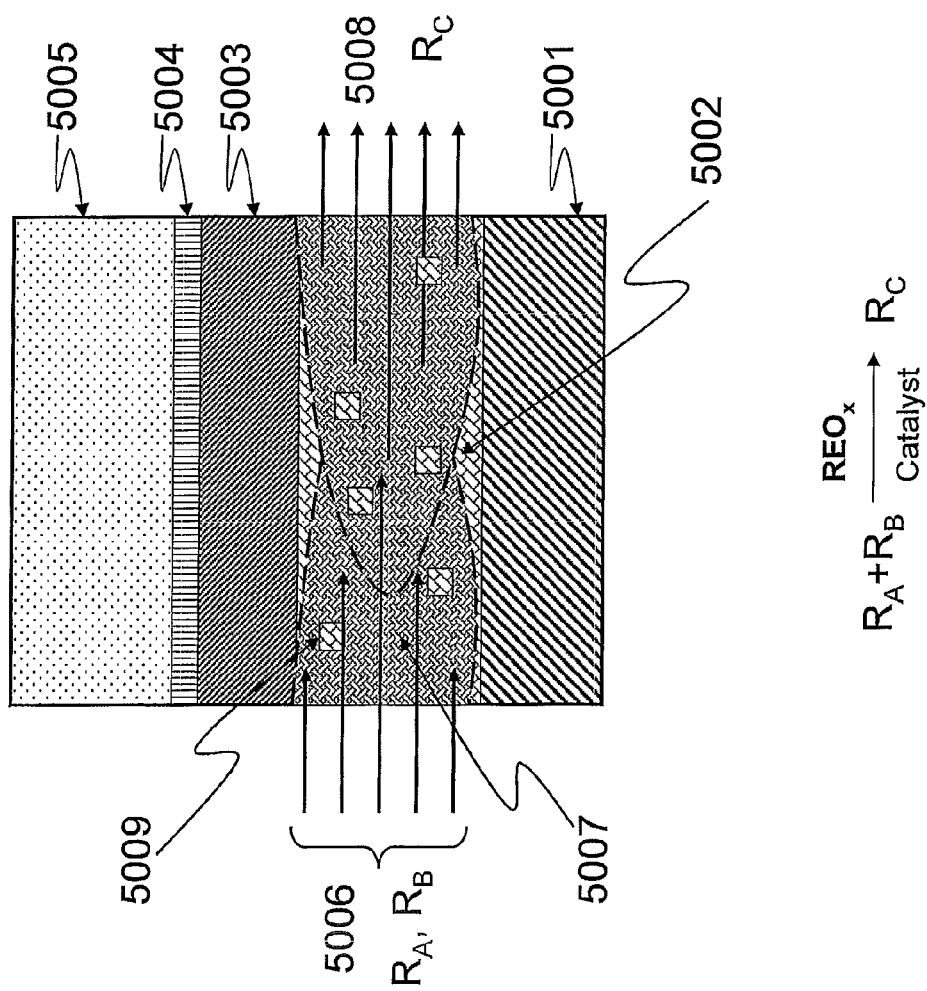
FIG. 28: Catalytic layer separation using rare-earth based layer comprising alternative substrate and thin film semiconductor layer.

An alternative method for layer separation using rare-earth oxide sacrificial layer is via use of inherent catalyst function, as shown in FIG. 28. Rare-earth oxide compound layer 5002 is deposited as sacrificial layer as single crystal structure as described in the present invention. The $REO_x$ can behave as a catalyst when reacted with incident gaseous compounds $R_A$ and $R_B$ 5006 transforming input gaseous species into a new compound $R_C$ 5008 through catalytic action of $REO_x$ 5002 and consuming reactants $R_A$ & $R_B$ 5006.

Figure 29:
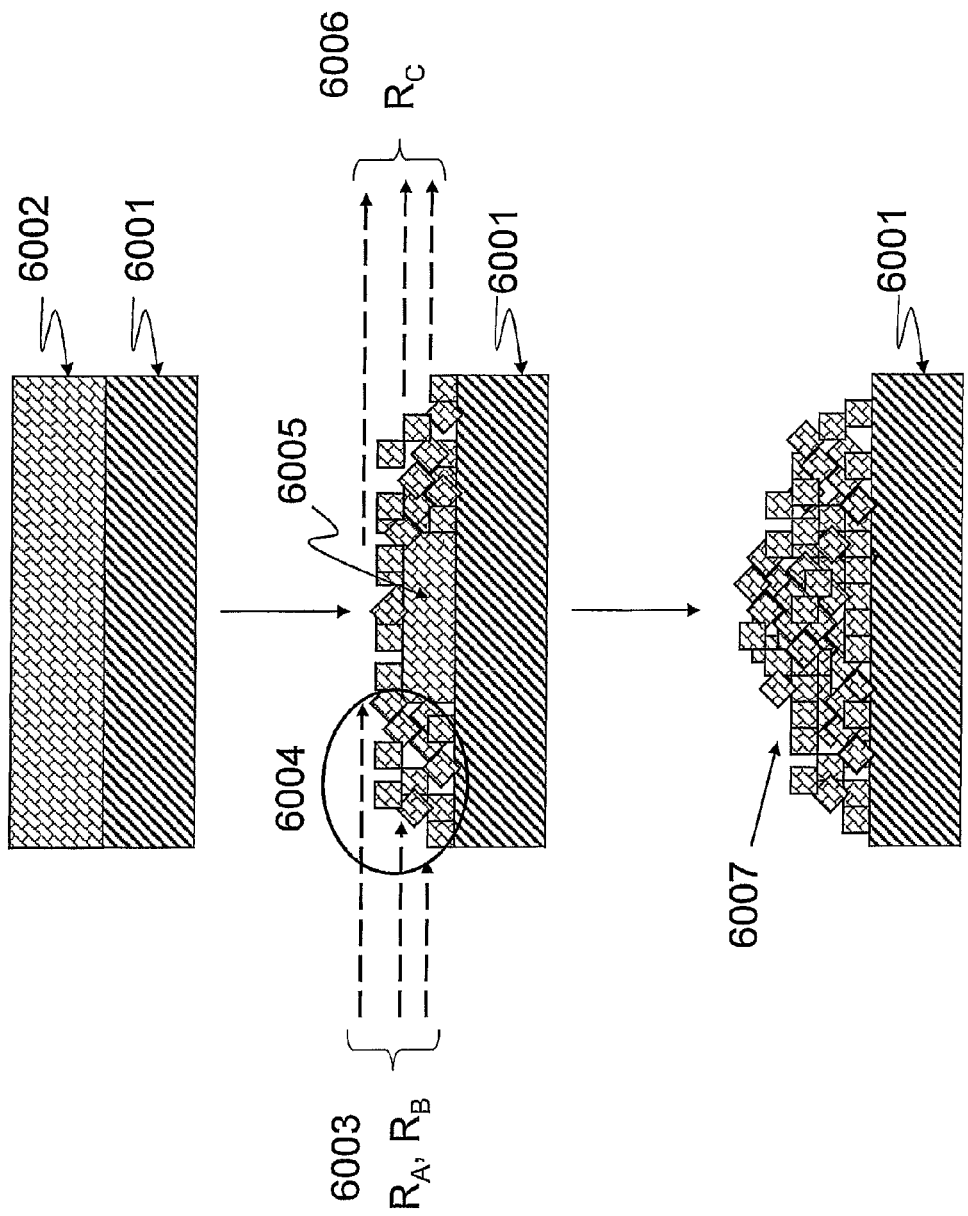
FIG. 29: Crystal structure modification of catalytic process using rare-earth based compound.

The single crystal sacrificial layer 5002 is not chemically consumed in the catalytic reaction but the process does modify the crystal structure from homogeneous single crystal layer into non-uniform fragments of REOx regions 5009. For example, FIG. 29 shows the catalytic process of reactants $R_A$ & $R_B$ 6003 transforming into byproduct $R_C$ 6006 via catalyst REOx 6002. The long range order of the REOx crystal structure is destroyed during the process forming disordered polycrystalline $REO_x$ in the form of granules, micro-crystalline, nanocrystalline or powder. That is, the REOx epitaxial layer 6002 is structurally destroyed or modified 6007 by action of the catalytic process 6003/6004/6005.

Rare-earth oxides crystallize as fluorite or bixbyite crystallographic structures, depending upon the specific RE species chosen. Both fluorite ($REO_2$) and bixbyite ($RE_2O_3$) rare-earth oxide crystals exhibit defects, such as oxygen or metal vacancies or interstitials. Oxygen vacancies allow the relatively free transport of oxygen and/or other atomic or diatomic species or molecular species through the bulk of the $REO_x$ crystal. For example, O, N, H, C, P, $O_2$, $N_2O$, $H_2O$, $CO_2$, $H_z$, $P_2$, $PH_3$, etc. may penetrate the single crystal $REO_x$ structure. Furthermore, $RE_yO_x$ single crystals may possess defects such as oxygen vacancies preferentially aligned along crystallographic axes, allowing long range transport through the bulk of the crystal. This property is advantageous for the present invention for use as layer separation mechanism.

Figure 30:
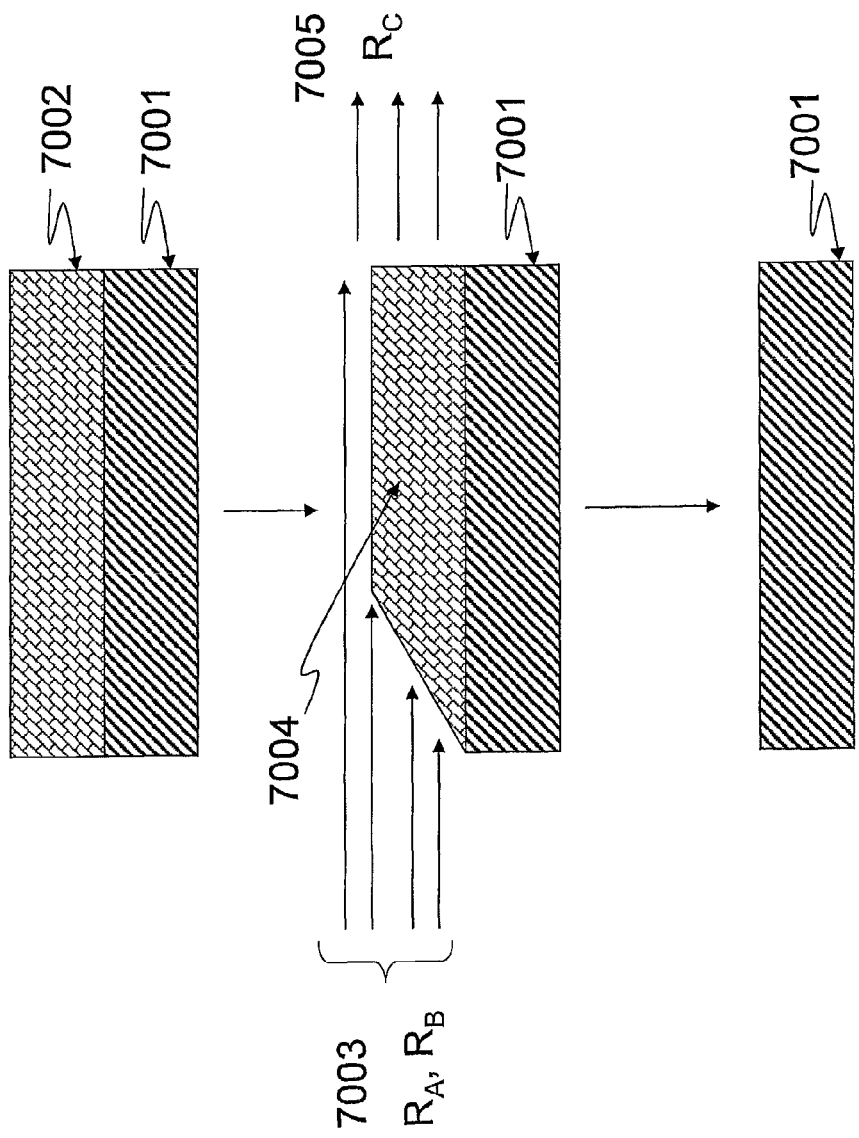
FIG. 30: Single crystal rare-earth based sacrificial layer under selective etching or removal via incident species, ultimately leaving the exposed substrate.
Figure 3L:
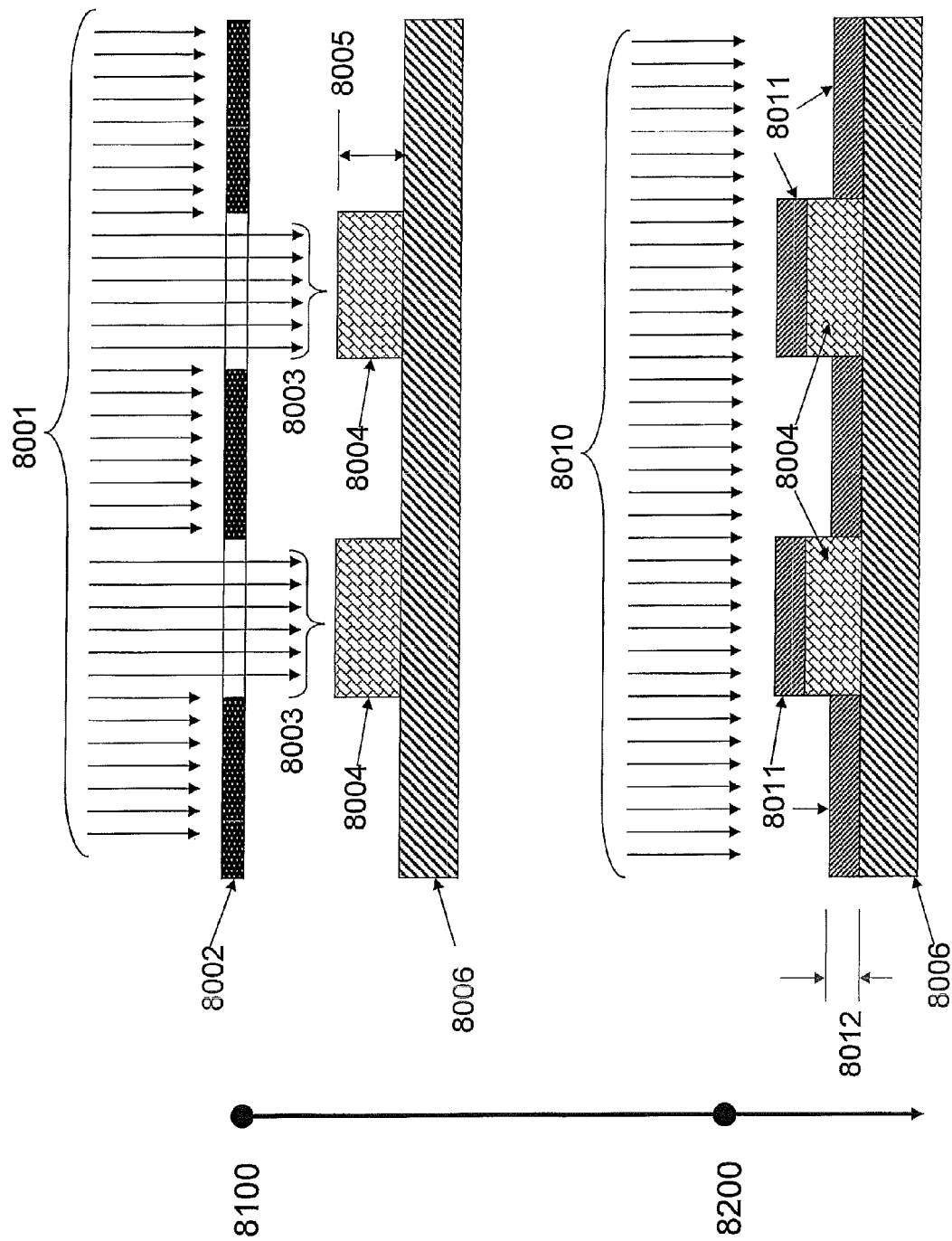

Another example of sacrificial layer separation using rare-earth based material is via selective etching and/or removal of the sacrificial layer 7002 via process gases or liquids or reagents or reactive species 7003, as shown in FIG. 30. As the sacrificial layer is consumed 7004 by formation of reactants 7005 the layer 7002 is ultimately removed from the surface of the substrate 7001. This process is shown as step 1009 in FIG. 24C and results in the layer separation of thin film semiconductor onto alternative substrate.

The advantage of the present invention is that optimized growth of the initial single crystal article can be accomplished independent of the alternative substrate. The single crystal article, for example 2031, comprising thin film semiconductor on single crystal rare-earth oxide layer deposited upon parent substrate can be fabricated prior to wafer bonding alternate substrate. The selective removal and/or modification of the single crystal sacrificial layer can be performed at conditions suitable for processing alternative substrate composite article. That is, a low thermal budget process such as steam hydration can be used to perform thin film layer separation.

In one embodiment, single crystal silicon substrates are utilised as the primary or parent substrate. The substantially single crystal sacrificial layer is formed using the general compound of rare-earth-oxygen-nitrogen-phosphorus-carbon of general chemical formula $RE_xO_yN_zP_wC_v$. Alternatively, thin film semiconductor layers may be chosen from Si, Ge, or SiGe alloys, GaAs, GaN, InN, InP, SiC or alternative Group IV, Group III-V or Group II-VI semiconductors; alternatively, a semiconductor substrate, primary or secondary is chosen from Group IV, Group III-V, or Group II-VI materials or combinations thereof.

Selective Area Devices

Thin film semiconductor devices can be patterned laterally upon alternative substrate using selective area epitaxy of crystalline sacrificial layer and removal of the same. FIGS. 31, 32, 33 and 34 describe the selective area thin film device manufacture on alternative substrate. FIG. 31 shows the selective area epitaxy of sacrificial layer 8004 disposed upon single crystal parent substrate 8006. For example, the selective areas 8004 in step 8100 may be deposited and patterned by use of a shadow mask 8002 position between the source material flux 8001 and the parent substrate surface 8006. Step 8200 shows the thin film crystalline semiconductor 8011 blanket deposited 8010 upon the patterned parent substrate comprising selective areas of crystalline sacrificial regions 8004. The thin film semiconductor layer (not necessarily the same composition as the parent substrate) is deposited with thickness substantially comprising uniform crystalline structure and thickness in regions where direct epitaxy on sacrificial layer occurs.

For the case of homo-epitaxy of semiconductor upon parent substrate, the crystal quality will also be high. The thin film semiconductor layer thickness 8012 is substantially the same for direct epitaxy on parent substrate and sacrificial layer surfaces. Generally, the sacrificial layer thickness 8005 is thicker than the thin film semiconductor layer thickness 8012.

Figure 32:
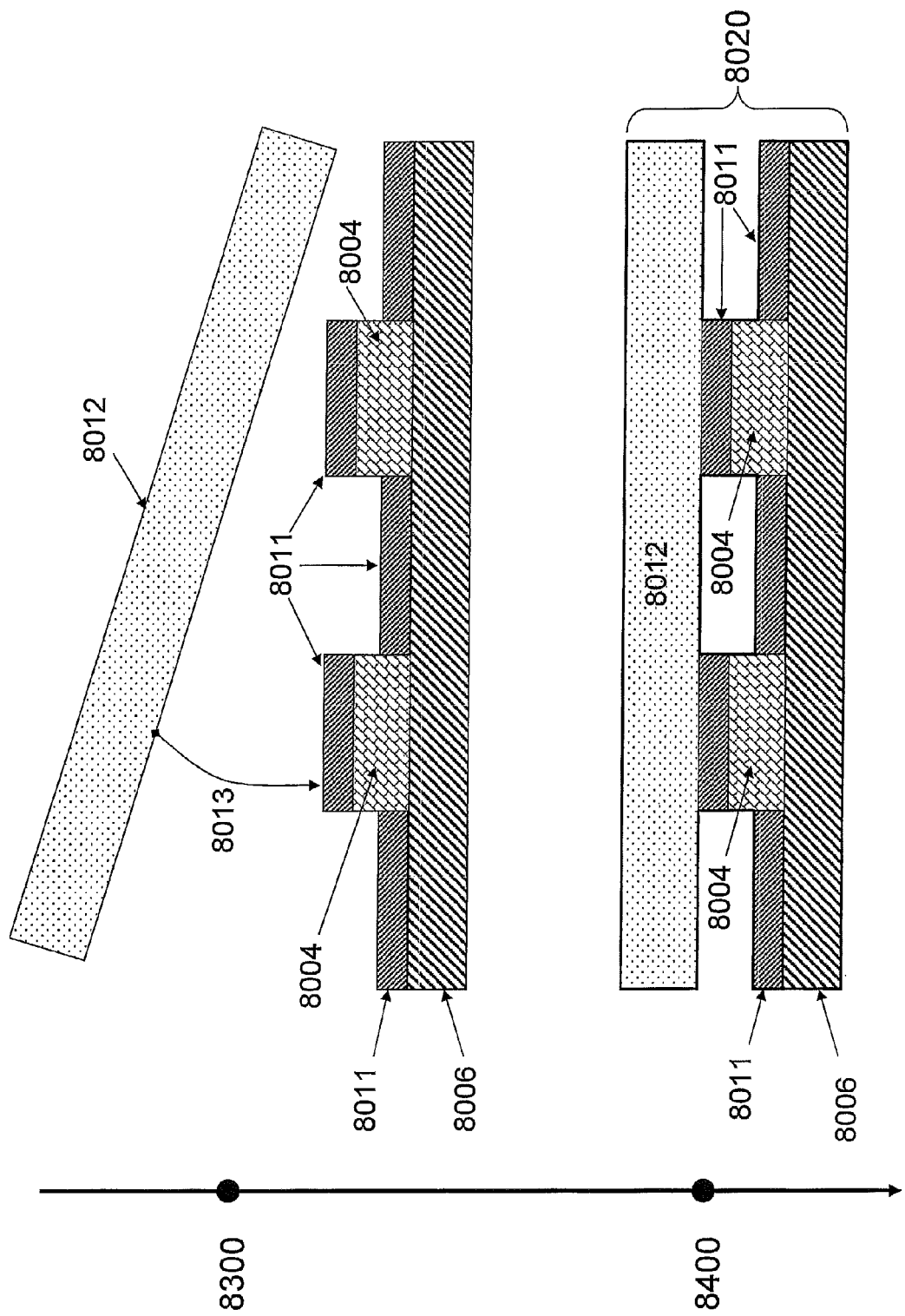
FIG. 32: Process steps for wafer bonding selective area single crystal thin film regions on parent substrate with alternative substrate.

FIG. 32 step 8300 shows the wafer bonding 8013 of alternative substrate surface 8012 with regions formed by thin film semiconductor layer surface 8011 deposited upon sacrificial layer 8004. The joined article 8200 in step 8400 comprises alternative substrate and selective area patterned thin film regions with intentional voids between alternative substrate and thin film semiconductor regions deposited directly upon parent substrate.

Figure 33:
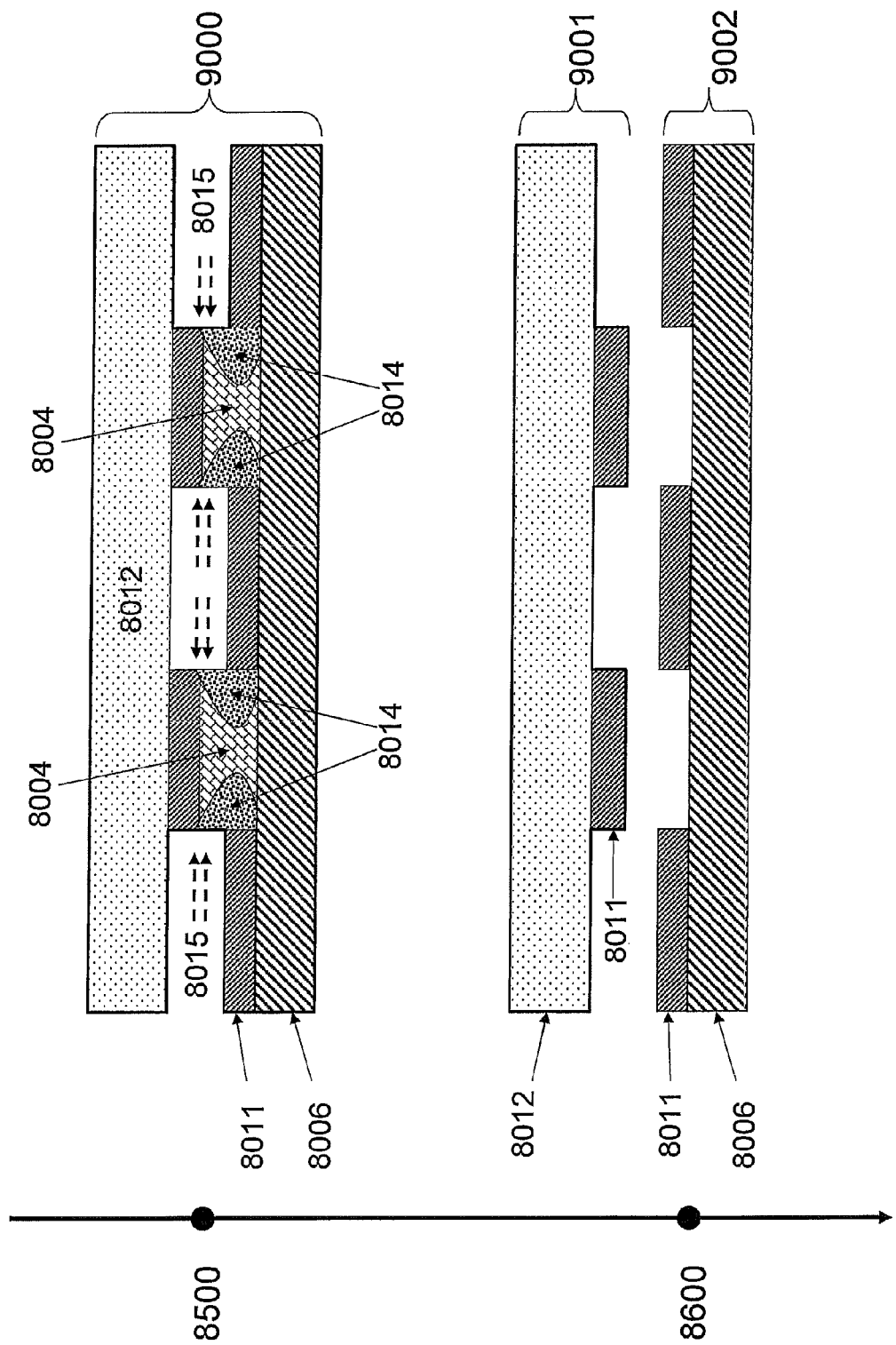
FIG. 33: Process steps showing selective area thin film semiconductor on alternative substrate layer separation via action of release through removal of sacrificial layer.

FIG. 33 step 8500 schematically depicts the selective area modification and or removal 8014 of the sacrificial layer 8004 via material selective process 8015. Step 8600 results in physical layer separation by virtue of sacrificial layer removal into desired selective area thin film semiconductor on alternative substrate article 9001 and remaining patterned parent substrate 9002.

The separated parent substrate containing patterned thin film semiconductor regions 9002 can be recycled directly for use in step 8200, bypassing the need for step 8100.

Figure 34:
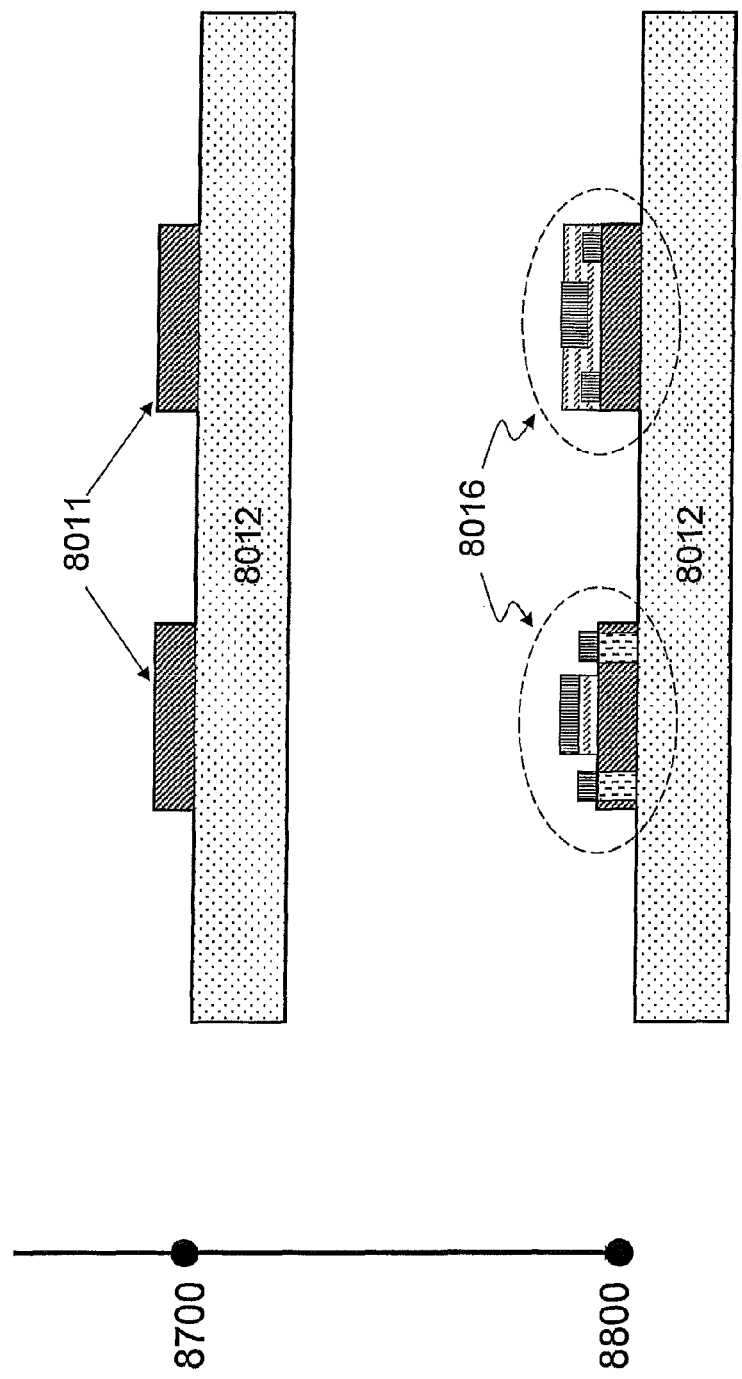
FIG. 34: Schematic description of selective area thin film semiconductor on alternative substrate and fabricated electronic and or optoelectronic devices formed from thin film semiconductor regions.

FIG. 34 step 8700 shows the released completed thin film semiconductor on alternative substrate article comprising patterned thin film semiconductor region 8011. Regions 8011 may be single crystal or polycrystal or combinations thereof.

Step 8800 schematically shows subsequent processing to produce thin film electron or optoelectronic devices 8016 disposed upon alternative substrate.

Crystalline-Amorphous Thin Film Solar Cell

A multi-junction solar cell can be fabricated using amorphous-crystalline (a-c) semiconductors via the present invention. Amorphous semiconductors are generally regarded as low mobility materials and not optimal for high performance electronic or optical devices. However, the effective band gap of an amorphous semiconductor is typically larger relative to the single crystal semiconductor form. Hetero-junction formation between the same chemical composition materials but dissimilar structural forms, such as amorphous and single crystalline semiconductor, offer improved optical response for solar cell device. For example, amorphous Si (a-Si) exhibits an effective band gap of $1.5 \leq E_g(\text{a-Si}) \leq 2.0$ eV, compared to crystalline Si (c-Si) with $E_g(\text{c-Si})=1.1$ eV.

Figure 35:
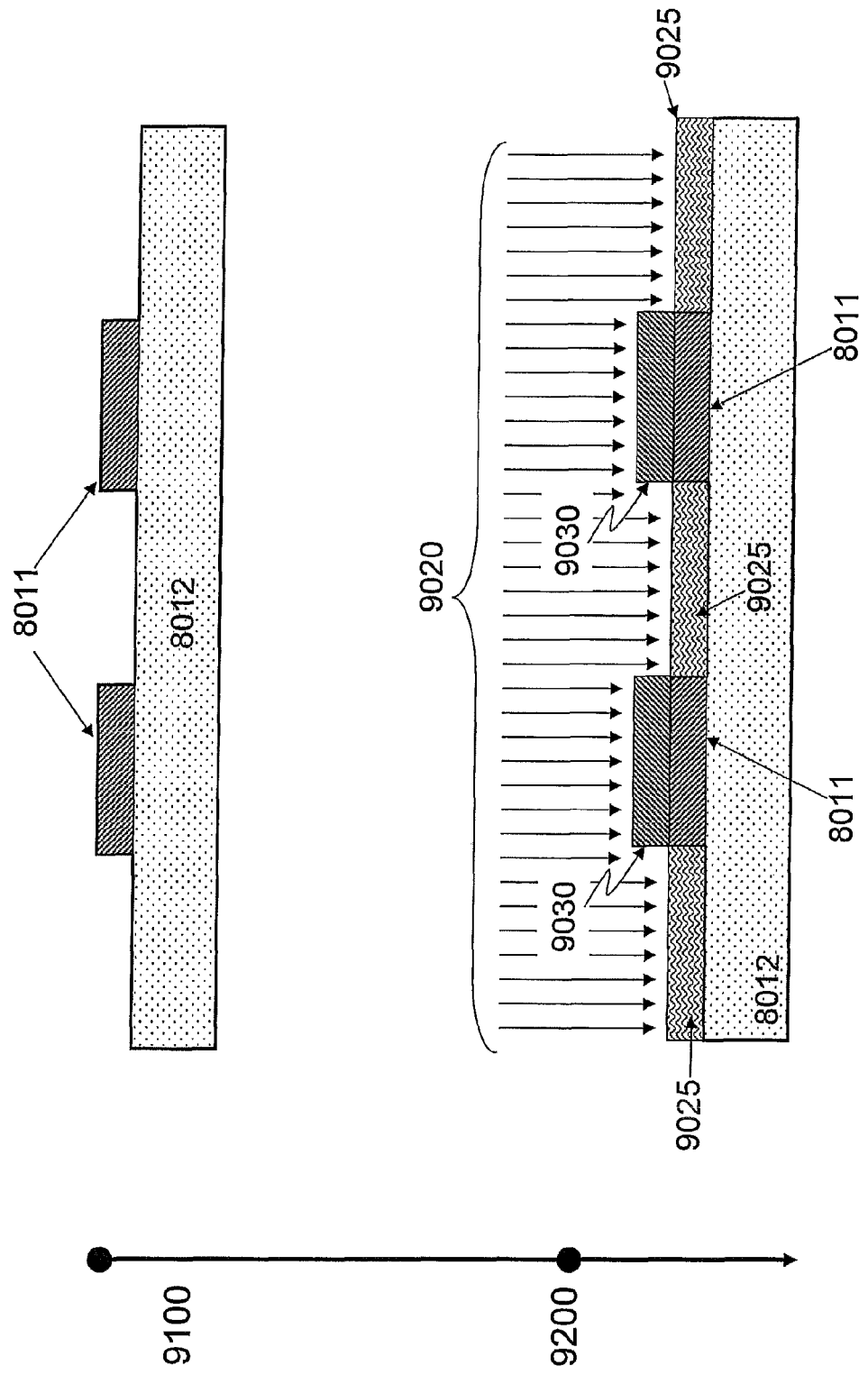
FIG. 35: Process steps for further deposition of thin film semiconductor(s) upon patterned thin film single crystal semiconductor on alternative substrate.

FIG. 35 shows processing steps for further deposition of thin film semiconductors upon the selective area patterned single crystal regions formed on amorphous substrate 8012. For example, the alternative substrate is transparent to solar radiation and comprised of glass. The thin film semiconductor 8011 is chosen from Si or Ge and formed using the sacrificial layer separation technique described herein.

Further epitaxy or deposition upon the article in step 9100 results in new thin film layers disposed upon amorphous substrate 8012 or single crystal semiconductor regions 8011, as shown in step 9200. For example, the thin film semiconductor 8011 is chosen from single crystal Si and further epitaxy of the same species during subsequent deposition 9020 forms single crystal regions 9030 seeded by region 8011 and amorphous regions 9025 deposited upon amorphous substrate 8012. The deposited layers can be chosen to exhibit different conductivity type, such as n-type or p-type. For example, thin film layer 8011 can be deposited as n-type Si and subsequent processing in step 9200 can deposit p-type c-Si 9030 and p-type a-Si 9025. The regions can be metallized to form electrical contacts to the p-type Si region 9030 via contact 9031 and p-type a-Si region 9025 via electrode 9026.

The deposition process used for layers 9025 and 9030 can be via different process, for example, PECVD, CVD and the like, forming hydrogenated amorphous Si (H:a-Si). The hydrogen content can be used as an effective means for passivating junctions between 9025/8011 and surfaces of 9030. The resulting structure of FIG. 13 comprises a p/n diode c-Si junction and p-type a-Si/n-type c-Si junction. The band gap energy variation as a function of direction parallel (x) and perpendicular (y) to the plane of the alternative substrate. The wide band gap a-Si region 9025 forms a structural heterojunction with the c-Si region 8011. The p-type 9030 and n-type 8011 c-Si homojunction forms a p/n diode.

Figure 36:
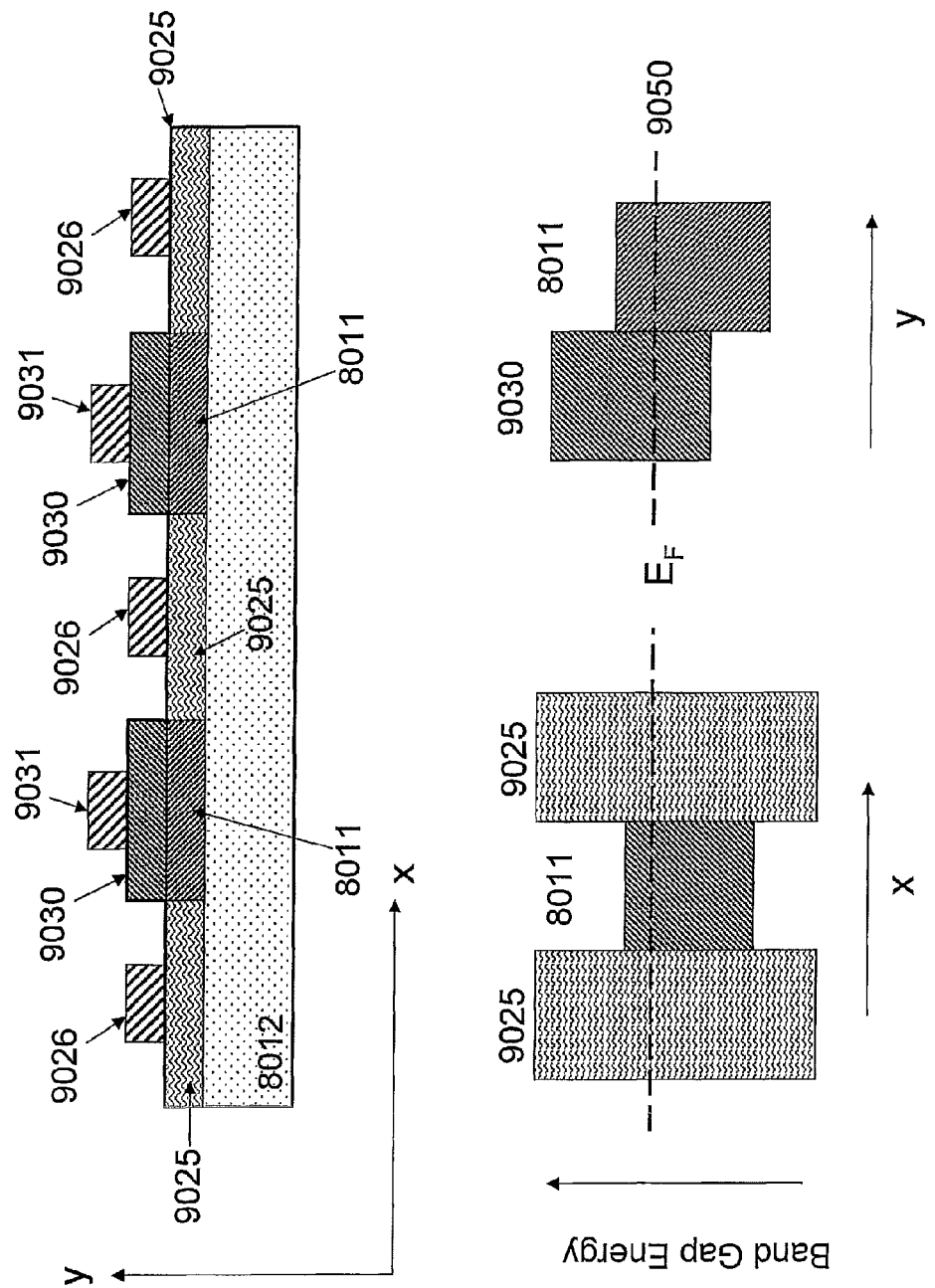
FIG. 36: Two junction solar cell formed from crystalline and amorphous semiconductor devices disposed upon alternative substrate.

Operation of structure in FIG. 36 as solar cell energy conversion device is achieved by orienting structure such that solar radiation is incident in a direction substantially from the alternative substrate surface into the active thin film semiconductor layers. The metallization/electrodes can behave as reflectors enabling multi-pass reflection in thin film layers. The a-Si region is responsive to higher energy photons (shorter wavelength ~600 nm) and the c-Si is responsive to lower energy photons (in the vicinity of the indirect band gap absorption edge >1 eV, i.e. ~1200 nm). The vertical and horizontal diodes formed by the present invention constitutes a two junction solar cell with solar cell efficiency exceeding that from single junction c-Si p/n solar cell.

Cost effective deposition methods using individual elemental sources of the constituents are preferred; alternatively, deposition techniques such as atomic layer deposition, ALD, chemical vapor deposition, CVD, physical vapor deposition, PVD, metal-organic chemical vapor deposition, MOCVD and molecular beam epitaxy, MBE are possible also. An evacuated chamber and heated substrate may be used to control the deposition conditions. Preferably, elemental sources are heated or controlled to form the required number of species impinging the growing surface forming the deposited material on the substrate. The deposition parameters of chamber vacuum/pressure, ratio and absolute number of impinging species from elemental or multi-component sources and substrate temperature are controlled such that the stoichiometry or composition of the deposited materials is optimized. Deposition chamber pressures of $10^{-10}$ torr to $10^{-3}$ torr facilitate achieving some embodiments. Substrate temperatures may range from 25.degree. C. to 700.degree. C. or higher may be used. Post growth annealing of the multilayer structures may also be advantageous and are included as an embodiment of the present invention. Individual layer thicknesses may vary from 1 nanometer (nm) to 10 microns depending on the type of device structure desired. The purity of rare-earth metal elemental sources is typically limited to commercial sources with 3N, 99.9%, or 4N purity. Typically these pure rare-earth metal sources are used in the deposition method. The purity is typically in excess of the above quoted level when referenced to elements outside of the lanthanide series. Therefore, the device performance of the rare-earth oxide semiconductor may be compromised, enhanced or unaffected by the presence of multiple rare-earth metal species.

In one embodiment a solar cell device for converting radiation to electrical energy comprises an active layer for the converting comprising at least a large band gap material and a small band gap material and an optically transparent conducting oxide over at least a portion of the surface of the active layer first receiving the radiation. In some embodiments a solar cell device is converting radiation sources alternative to the sun. In some embodiments a device for converting radiation to electrical energy is not located on the earth.

Foregoing described embodiments of the invention are provided as illustrations and descriptions. They are not intended to limit the invention to precise form described. In particular, it is contemplated that functional implementation of invention described herein may be implemented equivalently. Alternative construction techniques and processes are apparent to one knowledgeable with integrated circuit, solar cell, flexible circuit and MEMS technology. Other variations and embodiments are possible in light of above teachings, and it is thus intended that the scope of invention not be limited by this Detailed Description, but rather by Claims following.

REFERENCES

[1] "Method of fabricating SOI wafer by hydrogen ion delamination method and SOI wafer fabricated by the method", U.S. Pat. No. 6,372,609 B1, April 2002.
[2] "Process for producing semiconductor article", U.S. Pat. No. 6,100,166, August 2000.
[3] "Semiconductor-on-insulator silicon wafer and method of formation", U.S. Pat. No. 7,018,484 B1, March 2006.
[4] "Method of fabricating silicon-on-insulator semiconductor substrate using rare-earth oxide or rare-earth nitride", U.S. Pat. No. 7,037,806 B1, May 2006.
[5] "Ion beams in silicon processing and characterization", Chason et. al, J. Appl. Phys., Vol. 81, No. 10, May 1997.
[6] "Oxygen in Silicon", Semiconductors and Semimetals, Vol. 42, Academic Press, ISBN 0-12-752142-9.
[7] Float-zone method: Keck and Golay, Phys. Rev. Vol. 89, p. 1297, 1953.
[8] Crystal pulling method: Teal and Little, Phys. Rev, Vol. 80, p. 647, 1950.
[9] "Radiation effects", Ligeon et. al., Vol. 27, Gordon and Breach Science Publ., p. 129, 1976.
[10] "Process for the production of thin semiconductor material films", U.S. Pat. No. 5,374,564, December 1994.

I claim:

1. A device for converting radiation to electrical energy comprising;
active layer for converting incident radiation to electrical energy comprising a Group IV semiconductor;
transparent substrate; and
transparent barrier layer consisting of one or more rare earth compounds; wherein the barrier layer separates the active layer and the substrate and substantially prevents unwanted ions from the substrate migrating to the active layer wherein the active layer comprises one or more layers of a large band gap material; and one or more layers of a small band gap material; wherein the large band gap material is chosen from a group consisting of rare-earth oxide ($RE_xO_z$), rare-earth germanium oxide ($RE_xGe_yO_z$), rare-earth silicon oxide ($RE_xSi_yO_z$), rare-earth-silicon-oxide-phosphide ($RE_xSi_yO_zP_w$), rare-earth-silicon-oxide-nitride ($RE_xSi_yO_zN_w$), rare-earth-silicon-oxide-nitride-phosphide ($RE_xSi_yO_zN_wP_q$) wherein X, Z>0 and Y, W, Q are $\geq 0$, such that the band gap is greater than about 3 eV and wherein said small band gap material is chosen from a group consisting of rare-earth-silicon ($RE_xSi_y$), rare-earth-germanium ($RE_xGe_y$), rare-earth-phosphide ($RE_xP_y$), and rare-earth-nitride ($RE_xN_y$) and mixtures thereof and wherein X, Y>0 and said small band gap is less than about 3 eV.

2. A device for converting radiation as in claim 1 wherein said active layer comprises at least one lateral p-n junction.

3. A device for converting radiation as in claim 1 wherein said barrier layer comprises at least two layers wherein at least one of the at least two layers has a band gap greater than about 3 eV.

4. A device as in claim 1 wherein the transparent barrier layer comprises a first and second layer wherein the first layer is in contact with the transparent substrate and the second layer is in contact with the active layer and wherein at least one of the first layer and second layer consists of one or more compounds chosen from a group consisting of calcium oxide (CaO), sodium oxide ($Na_2O$), potassium oxide ($K_2O$), aluminum oxide ($Al_2O_3$), boron oxide ($B_2O_3$), zirconium oxide ($ZrO_2$), zircon ($ZrSiO_4$), lead oxide (PbO), alkaline earth metal oxides ($AEO_x$), phosphate glass, phosphorous silicate glass, rare-earth sesquioxide ($RE_2O_3$), rare-earth dioxide ($REO_2$), rare-earth monoxide (REO), rare-earth nitride (REN), rare-earth oxynitride ($REO_xN_y$), rare-earth phosphide (REP), rare-earth oxyphosphide ($REO_xP_y$), rare-earth carbide ($REC_y$), rare-earth oxycarbide ($REO_xC_y$), aluminum rare-earth oxide ($RE_xAl_yO_w$), rare-earth aluminosilicate ($RE_xAl_ySi_zO_w$), silicon nitride ($SiN_x$), ($Si_xAl_yN_z$), N:$Al_2O_3$, aluminum oxynitride ($AlO_xN_y$), aluminum nitride ($AlN_x$), silicon-aluminum-oxynitride ($Si_zAl_yO_xN_y$), silicon-carbon-nitride ($Si_zC_xN_y$), aluminum-carbon-oxynitride ($Al_zC_yO_xN_y$), silicon, $SiO_x$, rare-earth material, germanium and mixtures of silicon-germanium and combinations and non-stoichiometric combinations thereof.

5. A device as in claim 1 wherein the transparent barrier layer comprises a first and second layer wherein the first layer is in contact with the transparent substrate and the second layer is in contact with the active layer and wherein the first layer consists of one or more a compounds described by $[RE]_x[RE]_y[RE]_z[C]_m[O]_n[N]_p[P]_r[Si]_s[Ge]_t[Al]_u$ wherein x>0 and at least one of y, z, m, n, p, r, s, t, or u are >0 and RE is a rare earth.

6. A device for converting radiation as in claim 1 wherein the transparent substrate is chosen from a group consisting of sapphire, aluminum oxide ($Al_2O_3$), diamond ($C_4$), calcium fluoride ($CaF_2$), zircon ($Zr_xSi_{1-x}O_4$), zinc oxide (ZnO), aluminum nitride (AlN), glass, sodium-silicate glass $(Na_2O)_x^-(SiO_2)_{1-x}$, alkali-metal oxides ($AMO_x$), alkaline-earth metal oxides, a ceramic and crystallized bauxite.

7. A device for converting radiation as in claim 1 wherein the transparent barrier layer comprises a transparent conducting oxide layer.

8. A device for converting radiation as in claim 1 wherein the transparent substrate is flexible.

9. A device for converting radiation to electrical energy comprising;
- an active layer for the converting radiation to electrical energy comprising a first semiconductor layer of first conductivity type of thickness between about 30 nm and 150 nm and
- a second semiconductor layer of second conductivity type of thickness between about 30 nm and 150 nm;
- a transparent barrier layer consisting of one or more a rare earth compounds; and
- a substrate transparent to a majority of the radiation for converting, wherein the barrier layer separates the active layer and the substrate such that migration of deleterious species across the barrier layer is functionally impeded and wherein the first and second semiconductor layers comprise one or more layers of a large band gap material; and one or more layers of a small band gap material; wherein the large band gap material is chosen from a group consisting of rare earth ($RE_xO_z$), rare-earth germanium oxide ($RE_xGe_yO_z$), rare-earth silicon oxide ($RE_xSi_yO_z$), rare-earth-silicon-oxide-phosphide ($RE_xSi_yO_zP_w$), rare-earth-silicon-oxide-nitride ($RE_xSi_yO_zN_w$), rare-earth-silicon-oxide-nitride-phosphide ($RE_xSi_yO_zN_wP_q$) wherein X, Z>0 and Y, W, Q are $\geq$0, such that the band gap is greater than about 3 eV and wherein said small band gap material is chosen from a group consisting of rare-earth-silicon ($RE_xSi_y$), rare-earth-germanium ($RE_xGe_y$), rare-earth-phosphide ($RE_xP_y$), and rare-earth-nitride ($RE_xGe_y$) and mixtures thereof and wherein X, Y>0 and said small band gap is less than about 3 eV.

10. A device as in claim 9 wherein said substrate is chosen from a group consisting of sapphire, aluminum oxide ($Al_2O_3$), diamond ($C_4$), calcium fluoride ($CaF_2$), zircon ($Zr_xSi_{1-x}O_4$), zinc oxide (ZnO), aluminum nitride (AlN), glass, sodium-silicate glass $(Na_2O)_x^-(SiO_2)_{1-x}$, alkali-metal oxides ($AMO_x$), alkaline-earth metal oxides, a ceramic and crystallized bauxite.

11. A device as in claim 9 wherein said barrier layer comprises one or more layers wherein at least one of the one or more layers is chosen from a group consisting of calcium oxide (CaO), sodium oxide ($Na_2O$), potassium oxide ($K_2O$), aluminum oxide ($Al_2O_3$), boron oxide ($B_2O_3$), zirconium oxide ($ZrO_2$), zircon ($ZrSiO_4$), lead oxide (PbO), alkaline earth metal oxides (AEOx), phosphate glass, phosphorous silicate glass, rare-earth sesquioxide ($RE_2O_3$), rare-earth dioxide ($REO_2$), rare-earth monoxide (REO), rare-earth nitride (REN), rare-earth oxynitride ($REO_xN_y$), rare-earth phosphide (REP), rare-earth oxyphosphide ($REO_xP_y$), rare-earth carbide ($REC_y$), rare-earth oxycarbide ($REO_xC_y$), aluminum rare-earth oxide ($RE_xAl_yO_w$), rare-earth aluminosilicate ($RE_xAl_ySi_zO_w$), silicon nitride ($SiN_x$), ($Si_xAl_yN_z$), $N:Al_2O_3$, aluminum oxynitride ($AlO_xN_y$), aluminum nitride ($AlN_x$), silicon-aluminum-oxynitride ($Si_zAl_yO_xN_y$), silicon-carbon-nitride ($Si_zC_xN_y$), aluminum-carbon-oxynitride ($Al_zC_yO_xN_y$), silicon, $SiO_x$, rare-earth material, germanium and mixtures of silicon-germanium and combinations and non-stoichiometric combinations thereof.

\* \* \* \* \*